(12) United States Patent
Sasaki et al.

(10) Patent No.: US 9,632,527 B2
(45) Date of Patent: Apr. 25, 2017

(54) SHIFT REGISTER

(71) Applicant: Sharp Kabushiki Kaisha, Osaka-shi, Osaka (JP)

(72) Inventors: Yasushi Sasaki, Osaka (JP); Yuhichiroh Murakami, Osaka (JP); Shuji Nishi, Osaka (JP); Takahiro Yamaguchi, Osaka (JP); Makoto Yokoyama, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 100 days.

(21) Appl. No.: 14/775,884

(22) PCT Filed: Feb. 17, 2014

(86) PCT No.: PCT/JP2014/053621
§ 371 (c)(1),
(2) Date: Sep. 14, 2015

(87) PCT Pub. No.: WO2014/148171
PCT Pub. Date: Sep. 25, 2014

(65) Prior Publication Data
US 2016/0018844 A1   Jan. 21, 2016

(30) Foreign Application Priority Data

Mar. 21, 2013 (JP) .................................. 2013-059181

(51) Int. Cl.
*G11C 19/00* (2006.01)
*G06F 1/10* (2006.01)
(Continued)

(52) U.S. Cl.
CPC .................. *G06F 1/10* (2013.01); *G06F 1/26* (2013.01); *G11C 19/28* (2013.01); *G09G 3/3677* (2013.01); *G09G 2310/0286* (2013.01)

(58) Field of Classification Search
None
See application file for complete search history.

(56) References Cited

U.S. PATENT DOCUMENTS

| 2002/0097829 | A1 | 7/2002 | Kawahata |
| 2010/0141642 | A1* | 6/2010 | Furuta ................. G11C 19/184 345/213 |

(Continued)

FOREIGN PATENT DOCUMENTS

| JP | 2002-133890 A | 5/2002 |
| WO | 2009/034750 A1 | 3/2009 |

(Continued)

OTHER PUBLICATIONS

Official Communication issued in International Patent Application No. PCT/JP2014/053621, mailed on May 27, 2014.

*Primary Examiner* — Tuan T Lam
(74) *Attorney, Agent, or Firm* — Keating & Bennett, LLP

(57) ABSTRACT

A shift register is configured by connecting unit circuits 1 in multiple stages. An output transistor Tr1 switches between whether or not to output a clock signal CKA in accordance with a gate potential. A drain terminal of an initialization transistor Tra is connected to a gate terminal of the Tr1, and a source terminal thereof is connected to an output terminal OUT or a clock terminal CKA. The source terminal of the Tra is connected to a node which has a low-level potential at the time of initialization and has a potential at the same level as the clock signal when the clock signal having a high-level potential is outputted. Thus, at the time of outputting the clock signal having the high-level potential, application of a high voltage between the source and the drain of the Tra is prevented, and degradation and breakdown of the initialization transistor are prevented.

14 Claims, 54 Drawing Sheets

(51) Int. Cl.
 *G11C 19/28* (2006.01)
 *G06F 1/26* (2006.01)
 *G09G 3/36* (2006.01)

(56) References Cited

U.S. PATENT DOCUMENTS

| | | | |
|---|---|---|---|
| 2012/0032615 A1 | 2/2012 | Kikuchi et al. | |
| 2013/0009856 A1 | 1/2013 | Takahashi et al. | |
| 2013/0147524 A1* | 6/2013 | Hachida | G09G 3/3677 327/108 |
| 2013/0156148 A1* | 6/2013 | Sasaki | G11C 19/184 377/64 |
| 2013/0223584 A1* | 8/2013 | Umezaki | G11C 19/28 377/64 |
| 2014/0168181 A1* | 6/2014 | Furuta | G11C 19/28 345/205 |
| 2015/0262703 A1* | 9/2015 | Murakami | G09G 3/20 345/214 |
| 2015/0279480 A1* | 10/2015 | Murakami | G09G 3/20 345/100 |
| 2016/0027527 A1* | 1/2016 | Murakami | G09G 3/3677 377/64 |

FOREIGN PATENT DOCUMENTS

| | | |
|---|---|---|
| WO | 2010/137197 A1 | 12/2010 |
| WO | 2011/129126 A1 | 10/2011 |
| WO | 2012/029767 A1 | 3/2012 |
| WO | 2014/054516 A1 | 4/2014 |
| WO | 2014/054517 A1 | 4/2014 |

\* cited by examiner

SHIFT REGISTER

TECHNICAL FIELD

The present invention relates to a shift register, and particularly relates to a shift register preferably used for a drive circuit of a display device and the like.

BACKGROUND ART

An active matrix-type display device selects two-dimensionally arranged pixel circuits in a unit of row, and writes voltages in accordance with display data into the selected pixel circuits, to display an image. For selecting the pixel circuits in a unit of row, there is used a shift register for sequentially shifting an output signal based on a clock signal, as a scanning line drive circuit. Further, in a display device for performing a dot sequential drive, a similar shift register is provided inside a data line drive circuit.

In a liquid crystal display device and the like, a drive circuit of pixel circuits may be integrally formed with the pixel circuits by using a manufacturing process for forming TFTs (Thin Film Transistors) in the pixel circuits. In this case, it is preferable to form a drive circuit including a shift register with transistors of the same conductive type as the TFTs.

As for the shift register, a variety of circuits have hitherto been proposed. FIG. 63 is a block diagram showing a configuration of a shift register described in Patent Document 1. The shift register shown in FIG. 63 is configured by connecting unit circuits 91 shown in FIG. 64 in multiple stages, and is operated in accordance with a timing chart shown in FIG. 65. In this shift register, a bootstrap method is adopted. Hereinafter, a threshold voltage of the transistor is referred to as Vth, and a high-level potential is referred to as VDD.

As an input signal IN, the unit circuit 91 is provided with an output signal OUT of the unit circuit 91 in the previous stage (or a start pulse ST). When the input signal IN shifts to a high level, a transistor Q2 is turned on, and a potential of a node N1 rises to (VDD−Vth). Next, when a clock signal CK changes from a low level to the high level, the potential of the node N1 rises to (VDD−Vth+α) by being pushed up by a capacitance between a gate and a channel of a transistor Q1 and a capacitor C1 (wherein α is substantially equal to the amplitude of the clock signal CK). Since "VDD−Vth+α>VDD+Vth" normally holds, when the clock signal CK passes through the transistor Q1, the high-level potential of the clock signal CK does not drop in an amount corresponding to a threshold voltage of the transistor Q1. Hence it is possible to output as the output signal OUT the high-level potential VDD without a threshold drop. Further, in the high-level period of the output signal OUT, a voltage between the gate and a source of the transistor Q1 becomes: (VDD−Vth+α)−VDD=α−Vth. By providing a potential sufficiently higher than the high-level potential of the clock signal CK to the gate terminal of the transistor Q1, it is possible to reduce rounding of the output signal OUT.

PRIOR ART DOCUMENT

Patent Document

[Patent Document 1] WO 2009/34750

SUMMARY OF THE INVENTION

Problems to be Solved by the Invention

Here, initialization of the conventional shift register into a non-active state is considered. For performing initialization, transistors Q3, Q4 shown in FIG. 66 may be added to the unit circuit 91. By providing a high-level initialization signal INIT to each of gate terminals of the transistors Q3, Q4, it is possible to initialize the shift register into the non-active state.

However, as described above, the potential of the node N1 becomes (VDD−Vth+α) at the maximum by being pushed up. Meanwhile, since a source voltage of the transistor Q3 is zero, a voltage between a source and a drain of the transistor Q3 becomes (VDD−Vth+α) at the maximum. When such a high voltage is applied between the source and the drain of the transistor, degradation or breakdown of the transistor may occur. As a method for solving this problem, there can be considered a method of using a dual gate transistor as the transistor Q3, or a method of increasing an L-length of the transistor Q3. However, these methods have a problem of increasing a layout area of the shift register.

Accordingly, an object of the present invention is to provide a shift register which prevents degradation and breakdown of an initialization transistor by a method different from the conventional methods.

Means for Solving the Problems

According to a first aspect of the present invention, there is provided a shift register including a plurality of unit circuits connected in multiple stages, wherein the unit circuit includes: an output transistor having a first conduction terminal connected to a clock terminal for inputting a clock signal, and a second conduction terminal connected to an output terminal for outputting the clock signal; an output control unit that applies an on-potential and an off-potential in a switching manner to a control terminal of the output transistor; and an initialization transistor having a first conduction terminal connected to the control terminal of the output transistor, and a control terminal provided with an initialization signal, and a second conduction terminal of the initialization transistor is connected to a node which has the off-potential at the time of initialization and has the on-potential at the same level as the clock signal when the clock signal having the on-potential is outputted from the output terminal.

According to a second aspect of the present invention, there is provided a shift register including a plurality of unit circuits connected in multiple stages, wherein the unit circuit includes: an output transistor having a first conduction terminal connected to a clock terminal for inputting a clock signal, and a second conduction terminal connected to an output terminal for outputting the clock signal; a breakdown voltage transistor having a first conduction terminal connected to a first node, a second conduction terminal connected to a control terminal of the output transistor, and a control terminal fixedly applied with an on-potential; an output control unit that applies the on-potential and an off-potential in a switching manner to the first node; and an initialization transistor having a first conduction terminal connected to the first node or the control terminal of the output transistor, and a control terminal provided with an initialization signal, and a second conduction terminal of the initialization transistor is connected to a node which has the off-potential at the time of initialization and has the on-potential at the same level as the clock signal when the clock signal having the on-potential is outputted from the output terminal.

According to a third aspect of the present invention, in the first or second aspect of the present invention, the second conduction terminal of the initialization transistor is connected to the output terminal.

According to a fourth aspect of the present invention, in the third aspect of the present invention, the unit circuit further includes an output initialization transistor having a first conduction terminal connected to the output terminal, a second conduction terminal fixedly applied with the off-potential, and a control terminal provided with the initialization signal.

According to a fifth aspect of the present invention, in the first or second aspect of the present invention, the second conduction terminal of the initialization transistor is connected to the clock terminal.

According to a sixth aspect of the present invention, in the first aspect of the present invention, the output control unit includes a set transistor having a first conduction terminal provided with an input signal with respect to the unit circuit, and a second conduction terminal connected to the control terminal of the output transistor, a set control unit that applies the on-potential and the off-potential in a switching manner to a control terminal of the set transistor, and a second initialization transistor having a first conduction terminal connected to the control terminal of the set transistor, and a control terminal provided with the initialization signal, and a second conduction terminal of the second initialization transistor is connected to a node which has the off-potential at the time of initialization and has the on-potential at the same level as the control terminal of the output transistor in at least part of a period during which the on-potential is applied to the control terminal of the output transistor.

According to a seventh aspect of the present invention, in the second aspect of the present invention, the output control unit includes a set transistor having a first conduction terminal provided with an input signal with respect to the unit circuit, and a second conduction terminal connected to the first node, a set control unit that applies the on-potential and the off-potential in a switching manner to a control terminal of the set transistor, and a second initialization transistor having a first conduction terminal connected to the control terminal of the set transistor, and a control terminal provided with the initialization signal, and a second conduction terminal of the second initialization transistor is connected to a node which has the off-potential at the time of initialization and has the on-potential at the same level as the first node in at least part of a period during which the on-potential is applied to the first node.

According to an eighth aspect of the present invention, in the sixth or seventh aspect of the present invention, the second conduction terminal of the second initialization transistor is connected to a second input terminal for inputting a second input signal with respect to the unit circuit.

According to a ninth aspect of the present invention, there is provided a display device including: a plurality of scanning lines arranged in parallel to each other; a plurality of data lines arranged in parallel to each other so as to be orthogonal to the scanning lines; a plurality of pixel circuits each arranged corresponding to an intersection of the scanning line and the data line; and the shift register according to the first or second aspect as a scanning line drive circuit for driving the scanning lines.

Effects of the Invention

According to the first or second aspect of the present invention, by connecting the second conduction terminal of the initialization transistor to a node which has the off-potential at the time of initialization and has the on-potential at the same level as the clock signal when the clock signal having the on-potential is outputted, it is possible to control the output transistor into the off-state at the time of initialization, so as to initialize the state of the shift register and the output signal. Further, even at the time of outputting the clock signal having the on-potential, a high voltage beyond a drive voltage of the transistor is not applied between the conduction terminals of the initialization transistor. Hence it is possible to initialize the shift register without applying a high voltage between the conduction terminals of the initialization transistor at the time of operation.

According to the second aspect of the present invention, by the action of the breakdown voltage transistor, the potential of the first node remains unchanged from the on-potential applied by the output control unit, at the time of outputting the clock signal having the on-potential. Hence it is possible to prevent application of a high voltage between the terminals of the transistor connected to the first node.

According to the third aspect of the present invention, by controlling the potential of the output terminal to the off-potential at the time of initialization, it is possible to control the output transistor into the off-state, so as to initialize the state of the shift register and the output signal. Further, since the second conduction terminal of the initialization transistor always has the same potential as that of the clock signal to be outputted, even at the time of outputting the clock signal having the on-potential, a high voltage is not applied between the conduction terminals of the initialization transistor. Hence it is possible to perform initialization without applying a high voltage between the conduction terminals of the initialization transistor at the time of operation.

According to the fourth aspect of the present invention, by providing the output initialization transistor, it is possible to control the potential of the output terminal to the off-potential at the time of initialization.

According to the fifth aspect of the present invention, by controlling the potential of the clock terminal to the off-potential at the time of initialization, it is possible to control the output transistor into the off-state, so as to initialize the state of the shift register and the output signal. Further, since the second conduction terminal of the initialization transistor always has the same potential as that of the clock signal to be inputted, even at the time of outputting the clock signal having the on-potential, a high voltage is not applied between the conduction terminals of the initialization transistor. Hence it is possible to perform initialization without applying a high voltage between the conduction terminals of the initialization transistor at the time of operation.

According to the sixth aspect of the present invention, at the time of initialization, the set transistor is controlled into the off-state to electrically disconnect the input signal and the control terminal of the output transistor, whereby it is possible to reliably control the output transistor into the off-state. Further, by controlling the potential of the second conduction terminal of the second initialization transistor to the on-potential at the same level as the control terminal of the output transistor in at least part of a period during which the on-potential is applied to the control terminal of the output transistor, it is possible to shorten the time during which a high voltage is applied between the conduction terminals of the second initialization transistor.

According to the seventh aspect of the present invention, at the time of initialization, the set transistor is controlled into the off-state to electrically disconnect the input signal and the first node, whereby it is possible to reliably control the output transistor into the off-state. Further, by controlling the potential of the second conduction terminal of the second initialization transistor to the on-potential at the same level as the first node in at least part of a period during which the on-potential is applied to the first node, it is possible to shorten the time during which a high voltage is applied between the conduction terminals of the second initialization transistor.

According to the eighth aspect of the present invention, by using a preferred second input signal, it is possible to shorten the time during which a high voltage is applied between the conduction terminals of the second initialization transistor.

According to the ninth aspect of the present invention, by using the shift register according to the first or second aspect as the scanning line drive circuit, it is possible to initialize the scanning line drive circuit without applying a high voltage between the conduction terminals of the initialization transistor at the time of operation.

MODES FOR CARRYING OUT THE INVENTION

Hereinafter, a shift register according to each of embodiments of the present invention will be described with reference to the drawings. In the following description, when a conduction terminal of a transistor can be either a source terminal or a drain terminal, one conduction terminal is fixedly called a source terminal and the other conduction terminal is fixedly called a drain terminal. Further, a signal that is inputted or outputted via a certain terminal is called by the same name as that of the terminal (e.g., a signal that is inputted via a clock terminal CKA is called a clock signal CKA). Moreover, a potential which turns on the transistor when provided to the gate terminal is referred to as an on-potential, and a potential which turns off the transistor when provided to the gate terminal is referred to as an off-potential. For example, as for an N-channel transistor, a high-level potential is the on-potential and a low-level potential is the off-potential. Further, a threshold voltage of the transistor is referred to as Vth, the high-level potential is referred to as VDD, and the low-level potential is referred to as VSS.

It is to be noted that each transistor shown below may be configured of two or more transistors connected in series. Further, each transistor shown below may be configured of a TFT. In particular, an IGZO-TFT, in which a channel layer is formed by using InGaZnOx (also called "IGZO") being an oxide semiconductor mainly composed of indium (In), gallium (Ga), zinc (Zn), and oxygen (O), may be used as the TFT.

Figure 1:
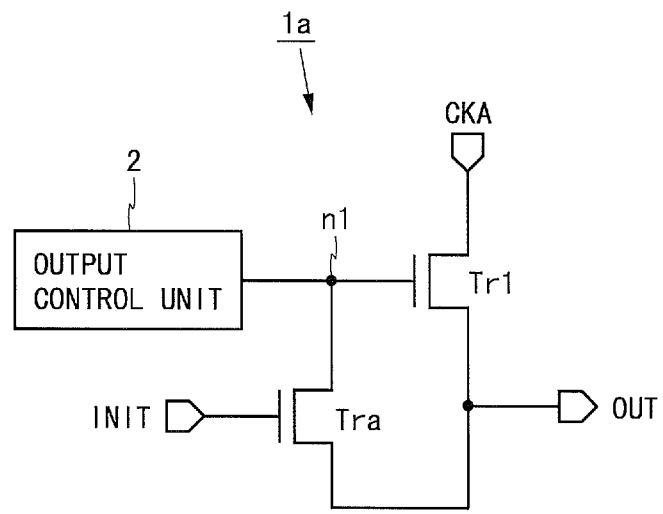
FIG. 1 is a diagram showing a basic configuration of a unit circuit of a shift register according to an embodiment of the present invention.
Figure 2:
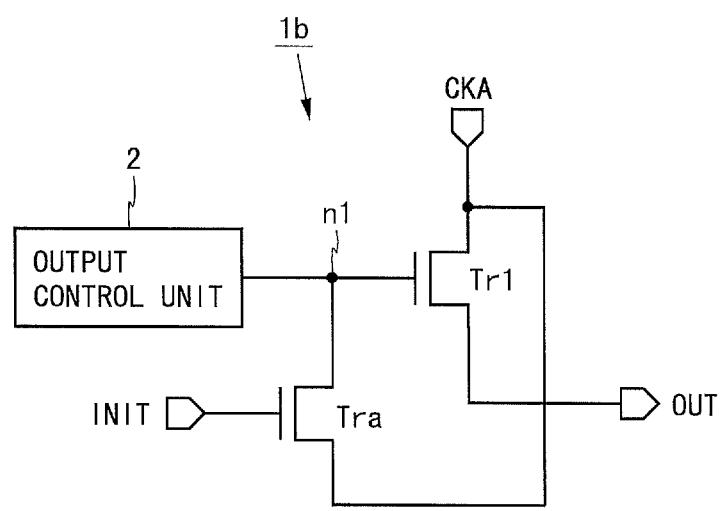
FIG. 2 is a diagram showing another basic configuration of the unit circuit of the shift register according to the embodiment of the present invention.

FIGS. 1 and 2 are diagrams each showing a basic configuration of a unit circuit included in the shift register according to the embodiment of the present invention. A unit circuit 1a shown in FIG. 1 includes transistors Tr1, Tra and an output control unit 2. A drain terminal of the transistor Tr1 is connected to a clock terminal CKA, a source terminal of the transistor Tr1 is connected to an output terminal OUT, and a gate terminal of the transistor Tr1 is provided with an output of the output control unit 2. A drain terminal of the transistor Tra is connected to the gate terminal of the transistor Tr1, a source terminal of the transistor Tra is connected to the output terminal OUT, and a gate terminal of the transistor Tra is connected to an initialization terminal INIT. The transistors Tr1, Tra respectively function as an output transistor and an initialization transistor. The output control unit 2 applies the high-level potential VDD and the low-level potential VSS in a switching manner to the gate terminal of the transistor Tr1. A unit circuit 1b shown in FIG. 2 is formed by changing, in the unit circuit 1a, the connection destination of the source terminal of the transistor Tra to the clock terminal CKA.

Hereinafter, a description will be given of a shift register configured by connecting the unit circuits having basic configurations shown in FIGS. 1 and 2 in multiple stages. In each of the embodiments below, there are shown a unit circuit in which a second conduction terminal of the transistor Tra is connected to the output terminal OUT and a unit circuit in which the second conduction terminal of the transistor Tra is connected to the clock terminal CKA. The two kinds of unit circuits operate in similar manners, and a shift register provided with either of the unit circuits exerts the same effect. Accordingly, hereinafter, the former unit circuit will be mainly described, and a description of the latter unit circuit will be omitted. In addition, the transistors Tr1, Tr2 are assumed to be N-channel types in the unit circuits 1a, 1b. The transistors Tr1, Tr2 may be P-channel types.

First Embodiment

Figure 3:
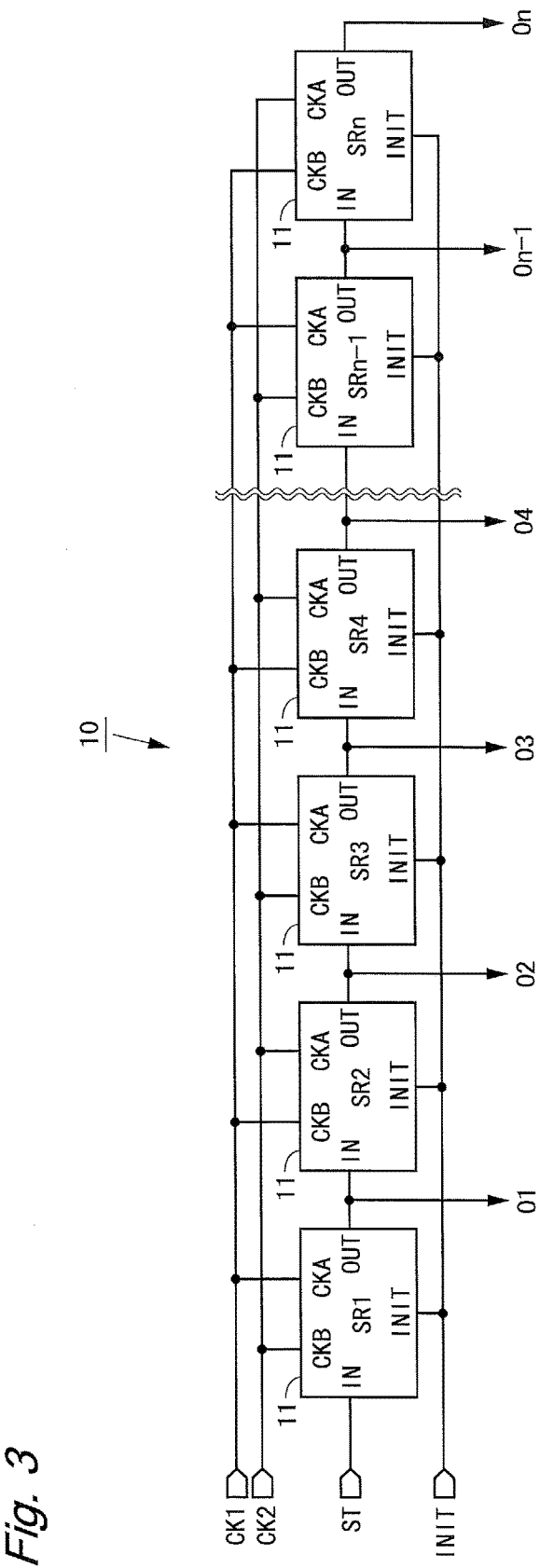
FIG. 3 is a block diagram showing a configuration of a shift register according to a first embodiment.

FIG. 3 is a block diagram showing a configuration of a shift register according to a first embodiment of the present invention. A shift register 10 shown in FIG. 3 is configured by connecting n (n is an integer not smaller than 2) unit circuits 11 in multiple stages. The unit circuit 11 has clock terminals CKA, CKB, the input terminal IN, the initialization terminal INIT, and the output terminal OUT. From the outside, the shift register 10 is supplied with a start pulse ST, two-phase clock signals CK1, CK2, and the initialization signal INIT. The initialization signal INIT is provided to the initialization terminals INIT of the n unit circuits 11. The start pulse ST is provided to the input terminal IN of the unit circuit 11 in the first stage. The clock signal CK1 is provided to the clock terminal CKA of the unit circuit 11 in the odd-numbered stage, and provided to the clock terminal CKB of the unit circuit 11 in the even-numbered stage. The clock signal CK2 is provided to the clock terminal CKA of the unit circuit 11 in the even-numbered stage, and provided to the clock terminal CKB of the unit circuit 11 in the odd-numbered stage. The output signal OUT of the unit circuit 11 is outputted to the outside as each of output signals O1 to On, and provided to the input terminal IN of the unit circuit 11 in the next stage.

Figure 4:
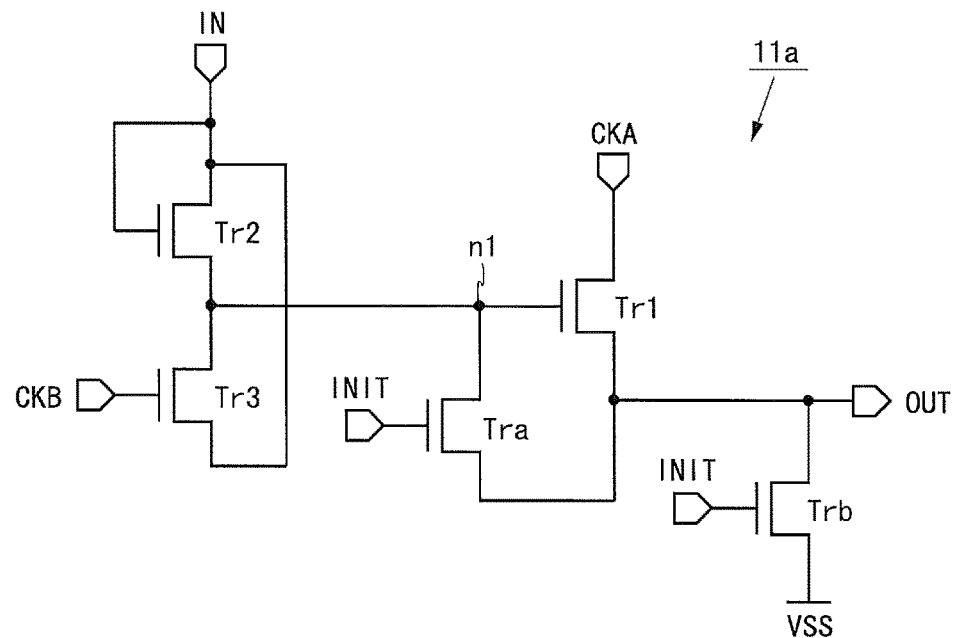
FIG. 4 is a circuit diagram of a unit circuit of the shift register according to the first embodiment.
Figure 5:
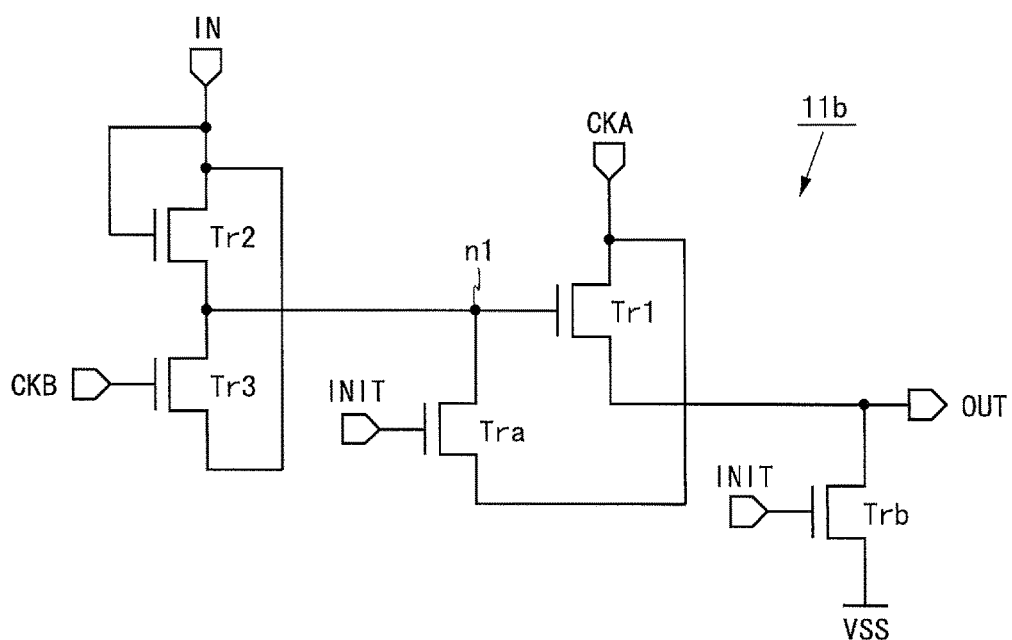
FIG. 5 is a circuit diagram of another unit circuit of the shift register according to the first embodiment.

For the unit circuit 11, a unit circuit 11a shown in FIG. 4 or a unit circuit 11b shown in FIG. 5 is used. The unit circuit 11a includes five N-channel transistors Tr1 to Tr3, Tra, Trb. A drain terminal of the transistor Tr1 is connected to the clock terminal CKA, and a source terminal of the transistor Tr1 is connected to the output terminal OUT. A gate terminal and a drain terminal of the transistor Tr2 are connected to the input terminal IN, and a source terminal of the transistor Tr2 is connected to a gate terminal of the transistor Tr1 and a drain terminal of the transistor Tr3. A source terminal of the transistor Tr3 is connected to the input terminal IN, and a gate terminal of the transistor Tr3 is connected to the clock terminal CKB. A drain terminal of the transistor Tra is connected to the gate terminal of the transistor Tr1, and a source terminal of the transistor Tra is connected to the output terminal OUT. A drain terminal of the transistor Trb is connected to the output terminal OUT, and a source terminal of the transistor Trb is applied with the low-level potential VSS. Gate terminals of the transistors Tra, Trb are connected to the initialization terminal INIT. The transistors Tr1, Tra, Trb respectively function as an output transistor, an initialization transistor, and an output initialization transistor, and the transistors Tr2, Tr3 function as an output control unit. The unit circuit 11b is formed by changing, in the unit circuit 11a, the connection destination of the source terminal of the transistor Tra to the clock terminal CKA. Hereinafter, a node to which the gate terminal of the transistor Tr1 is connected will be referred to as n1.

Figure 6:
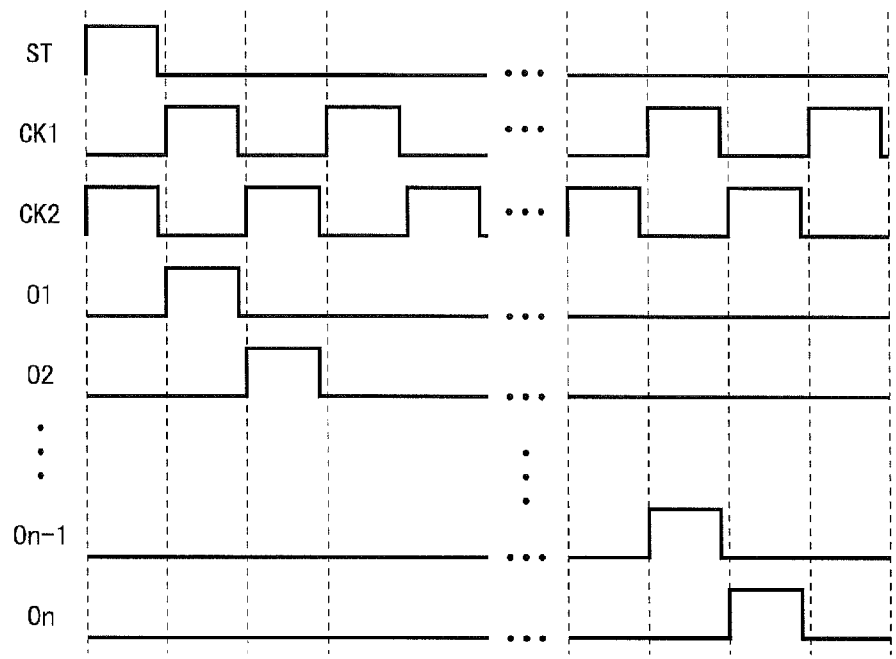
FIG. 6 is a timing chart of the shift register according to the first embodiment.

FIG. 6 is a timing chart of the shift register 10. As shown in FIG. 6, the clock signal CK1 shifts to the high level or the low level in a predetermined cycle. However, the high-level period of the clock signal CK1 is shorter than the low-level period of the clock signal CK1. The clock signal CK2 is a signal obtained by delaying the clock signal CK1 by a half cycle. At the start of shifting, the start pulse ST shifts to the high level in the high-level period of the clock signal CK2.

Figure 7:
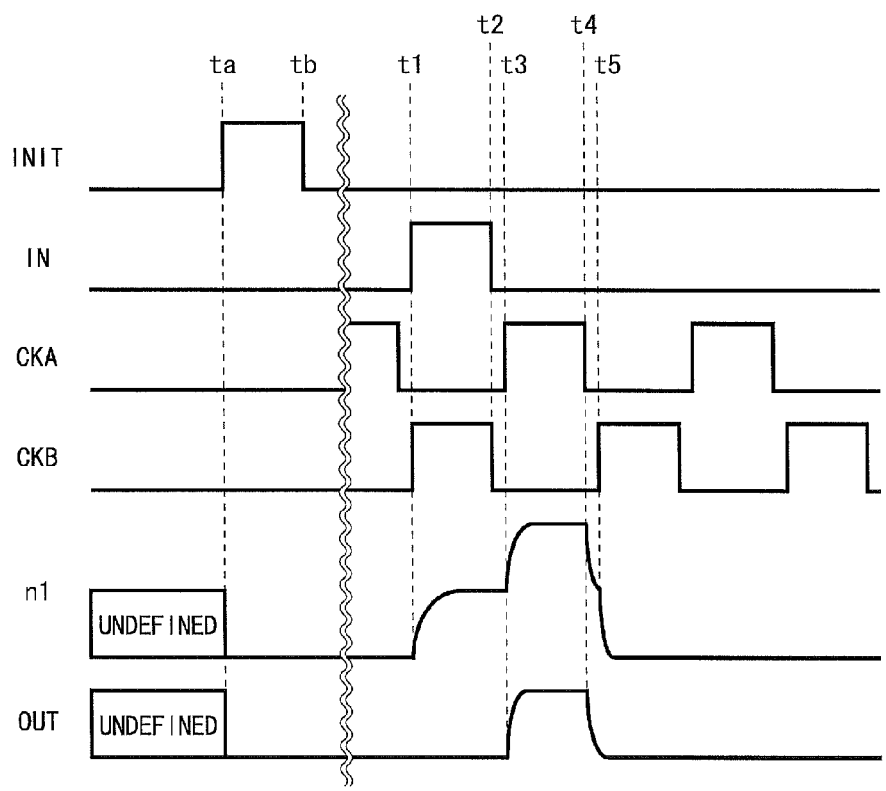
FIG. 7 is a signal waveform diagram of the shift register according to the first embodiment.

FIG. 7 is a signal waveform diagram of the shift register 10. It is to be noted that a signal waveform diagram of the shift register 10 provided with the unit circuit 11a is the same as a signal waveform diagram of the shift register 10 provided with the unit circuit 11b. The same applies to each of the embodiments shown below.

An operation of the unit circuit 11 will be described with reference to FIG. 7. Before the time ta, a potential of the node n1 and the output signal OUT are undefined. At the time ta, the initialization signal INIT changes from the low level to the high level. With this change, the transistors Tra, Trb are turned on. By the transistor Trb being turned on, the output signal OUT is initialized to the low level. In the unit circuit 11a, when the transistor Tra is turned on, the node n1 is electrically connected to the output terminal OUT via the transistor Tra. At this time, with the output signal OUT being at the low level, the potential of the node n1 is initialized to the low level. In the unit circuit 11b, when the transistor Tra is turned on, the node n1 is electrically connected to the clock terminal CKA via the transistor Tra. By controlling the clock signals CK1, CK2 to the low level at the time of initialization, the potential of the node n1 is initialized to the low level. At the time tb, the initialization signal INIT changes to the low level. With this change, the transistors Tra, Trb are turned off.

Before the time t1, the potential of the node n1 and the output signal OUT are at the low level. At the time t1, the input signal IN and the clock signal CKB change from the low level to the high level. With this change, the transistors Tr2, Tr3 are turned on. At this time, a current passing through the transistor Tr2 and a current passing through the transistor Tr3 flow from the input terminal IN toward the node n1, and the potential of the node n1 shifts to the high level (charge of the node n1). The potential of the node n1 rises to (VDD−Vth). When the potential of the node n1 exceeds a predetermined level, the transistor Tr1 is turned on. Since the clock signal CKA is at the low level at this time, the output signal OUT is held at the low level even after the transistor Tr1 is turned on. At the time t2, the input signal IN and the clock signal CKB change to the low level. With this change, the transistors Tr2, Tr3 are turned off, and the node n1 enters a floating state. Even after the transistors Tr2, Tr3 are turned off, the potential of the node n1 is held at the high level, and the transistor Tr1 is held in the on-state.

At the time t3, the clock signal CKA changes from the low level to the high level. With this change, from the time t3 on, the high-level potential of the clock signal CKA is outputted as the output signal OUT. Further, when the potential of the output signal OUT rises, the potential of the node n1 is pushed up by a capacitance between the gate and the channel of the transistor Tr1, and rises by α (wherein α is substantially equal to the amplitude of the clock signal CKA) (push-up of the node n1). Here, α is obtained by multiplying the amplitude of the clock signal CKA by "(a capacitance value of the capacitance between the gate and the channel of transistor Tr1)/(a total of capacitance values of all capacitances accompanying the node n1)". Since the potential of the node n1 becomes (VDD+Vth) or higher at this time, when the clock signal CKA passes through the transistor Tr1, the high-level potential of the clock signal CKA does not drop by an amount corresponding to a threshold voltage of the transistor Tr1. Hence it is possible to output, as the output signal OUT, a high-level potential VDD without a threshold drop. At the time t4, the clock signal CKA changes to the low level. With this change, the output signal OUT changes to the low level. Further, since the push-up of the node n1 is completed, the potential of the node n1 drops to (VDD−Vth).

At the time t5, the clock signal CKB changes to the high level. With this change, the transistor Tr3 is turned on. At this time, with the input signal IN being at the low level, a current passing through the transistor Tr3 flows from the node n1 toward the input terminal IN, and the potential of the node n1 drops to the low level (discharge of the node n1). As thus described, the output signal OUT of the unit circuit 11 shifts to the high level in the high-level period of the clock signal CKA after the input signal IN has shifted to the high level. At this time, the potential of the output signal OUT shifts to the high-level potential VDD without a threshold drop.

As shown in FIG. 6, an output signal O1 of the unit circuit 11 in the first stage shifts to the high level in the high-level period of the clock signal CK1 after the start pulse ST has shifted to the high level. An output signal O2 of the unit circuit 11 in the second stage shifts to the high level in the high-level period of the clock signal CK2 after the output signal O1 has shifted to the high level. Similarly, an output signal Oi of the unit circuit 11 shifts to the high level in the high-level period of the clock signal CK1 or CK2 after an output signal Oi−1 of the unit circuit 11 in the previous stage has shifted to the high level. Therefore, the output signals O1 to On of the shift register 10 shift to the high level in ascending order (in the order of O1, O2, . . . , On) while each being delayed by a half cycle of the clock signal CK1.

In the unit circuit 11a, at the time of operation, the potential of the node n1 becomes (VDD−Vth+α) at the maximum by being pushed up. In the push-up period of the node n1, the potential of the output signal OUT is VDD, and hence a voltage (α−Vth) is applied between the source and the drain of the transistor Tra. Since α becomes as small as the amplitude of the clock signal CKA at the maximum, this voltage is lower than a driving voltage of the transistor. Thus, according to the shift register 10 provided with the unit circuit 11a, it is possible to perform initialization without applying a high voltage between the source and the drain of the transistor Tra at the time of operation.

Also in the unit circuit 11b, at the time of operation, the potential of the node n1 becomes (VDD−Vth+α) at the maximum by being pushed up. In the push-up period of the node n1, the potential of the clock signal CKA is VDD, and hence a voltage (α−Vth) is applied between the source and the drain of the transistor Tra. Thus, according to the shift register 10 provided with the unit circuit 11b, similarly to the shift register 10 provided with the unit circuit 11a, it is possible to perform initialization without applying a high voltage between the source and the drain of the transistor Tra at the time of operation.

It is to be noted that in the unit circuit 11, in the push-up period of the node n1, a high voltage (VDD−Vth+α−VSS) is applied between the gate and the drain of the transistor Tra. However, when a high voltage is applied between the gate and drain of the transistor, less degradation and breakdown of the transistor occur than when a higher voltage is applied between the source and the drain of the transistor. Thus, according to the shift register 10 of the present embodiment, although a high voltage is applied between the gate and the drain of the transistor Tra, it is possible to take effective measures for breakdown voltage.

As thus described, the unit circuit 11a includes: the output transistor Tr1 having a first conduction terminal connected to the clock terminal CKA, and a second conduction terminal connected to the output terminal OUT; the output control unit (transistors Tr2, Tr3) that applies the on-potential (high-level potential) and the off-potential (low-level potential) in a switching manner to the control terminal of the output transistor Tr1; the initialization transistor Tra having a first conduction terminal connected to the control terminal of the output transistor Tr1, a second conduction terminal connected to the output terminal OUT, and a control terminal provided with the initialization signal INIT; and the output initialization transistor Trb having a first conduction terminal connected to the output terminal OUT, a second conduction terminal fixedly applied with the off-potential, and a control terminal provided with the initialization signal INIT. In the unit circuit 11b, the second conduction terminal of the initialization transistor Tra is connected to the clock terminal CKA.

By providing the output initialization transistor Trb, it is possible to control the potential of the output terminal OUT to the off-potential at the time of initialization. Therefore, in the unit circuit 11a, at the time of initialization, the output transistor Tr1 can be controlled into the off-state, to initialize the state of the shift register and the output signal. Further, in the unit circuit 11a, since the second conduction terminal of the initialization transistor Tra always has the same potential as that of the clock signal to be outputted, even at the time of outputting the clock signal having the on-potential, a high voltage is not applied between the conduction terminals of the initialization transistor Tra. In the unit circuit 11b, by controlling the potential of the clock terminal CKA to the off-potential at the time of initialization, the output transistor Tr1 can be controlled into the off-state, to initialize the state of the shift register and the output signal. Further, in the unit circuit 11b, since the second conduction terminal of the initialization transistor Tra always has the same potential as that of the clock signal to be inputted, even at the time of outputting the clock signal having the on-potential, a high voltage is not applied between the conduction terminals of the initialization transistor Tra. Thus, according to the shift register 10 of the present embodiment, it is possible to perform initialization without applying a high voltage between the conduction terminals of the initialization transistor Tra at the time of operation.

Second Embodiment

A shift register according to a second embodiment of the present invention has the configuration shown in FIG. 3. However, the shift register according to the present embodiment includes a unit circuit 12a shown in FIG. 8 or a unit circuit 12b shown in FIG. 9 in place of the unit circuit 11. The unit circuit 12a is formed by adding a capacitor C1 to the unit circuit 11a (FIG. 4). The capacitor C1 is provided between the gate and the source of the transistor Tr1. The unit circuit 12b is formed by changing, in the unit circuit 12a, the connection destination of the source terminal of the transistor Tra to the clock terminal CKA.

By providing the capacitor C1, it is possible to increase push-up effect of the node n1 when the output signal OUT changes from the low level to the high level. Thus, according to the shift register of the present embodiment, by increasing the push-up effect of the node n1, it is possible to more reliably output the high-level potential VDD without a threshold drop as the output signal OUT, so as to increase an operation margin with respect to fluctuation of the threshold voltage of the transistor.

Third Embodiment

Figure 8:
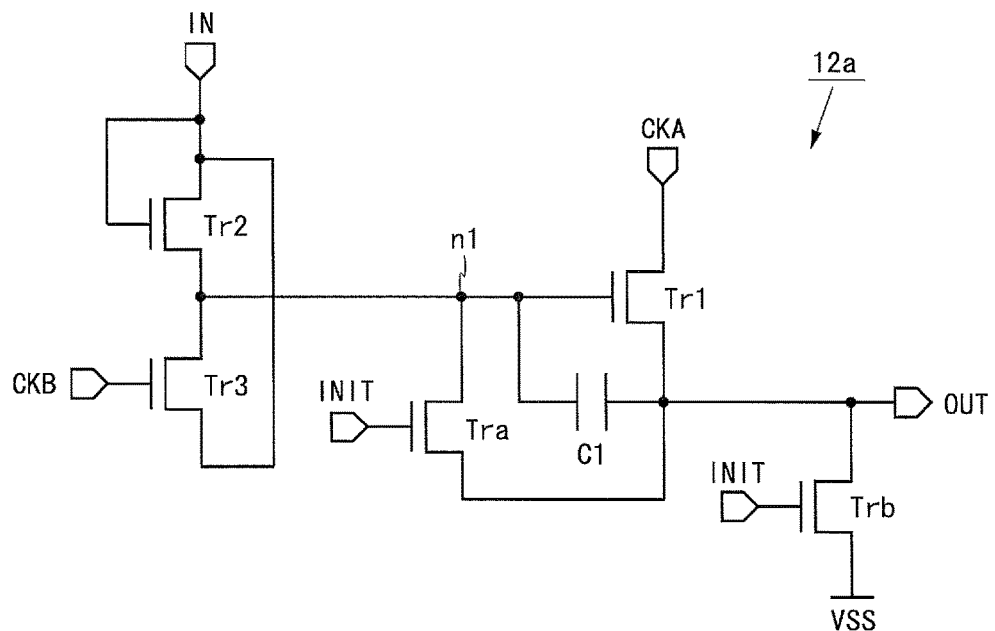
FIG. 8 is a circuit diagram of a unit circuit of a shift register according to a second embodiment.
Figure 9:
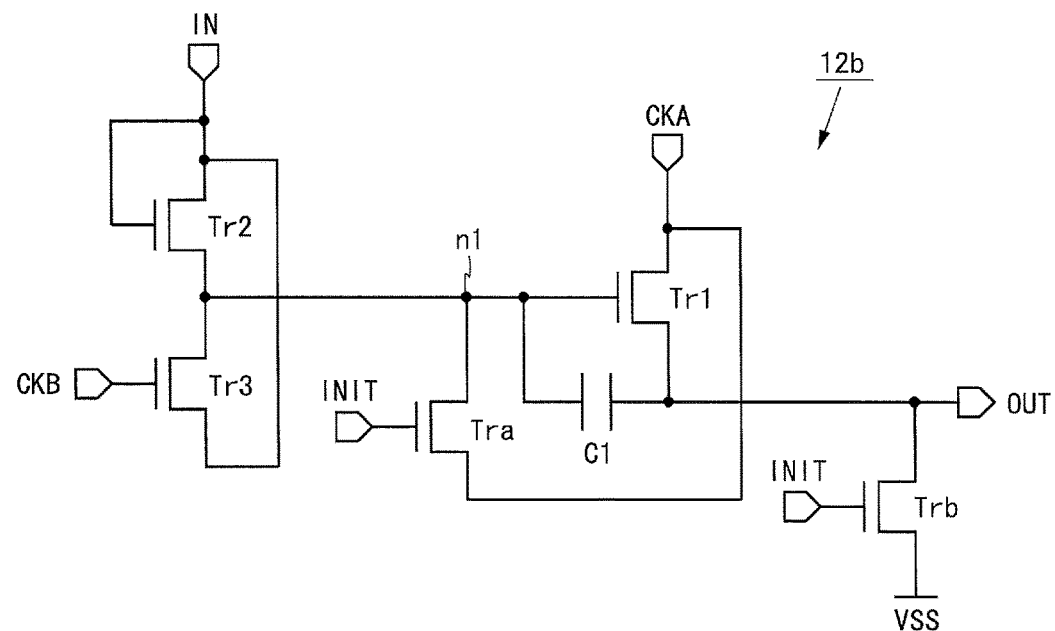
FIG. 9 is a circuit diagram of another unit circuit of the shift register according to the second embodiment.

A shift register according to a third embodiment of the present invention has the configuration shown in FIG. 3. However, the shift register according to the present embodiment includes a unit circuit 13a shown in FIG. 10 or a unit circuit 13b shown in FIG. 11 in place of the unit circuit 11. The unit circuit 13a is formed by adding an N-channel transistor Tr4 to the unit circuit 12a (FIG. 8). A drain terminal of the transistor Tr4 is connected to the output terminal OUT, a source terminal of the transistor Tr4 is applied with the low-level potential VSS, and a gate terminal of the transistor Tr4 is connected to the clock terminal CKB. The unit circuit 13b is formed by changing, in the unit circuit 13a, the connection destination of the source terminal of the transistor Tra to the clock terminal CKA.

After the output signal OUT is changed from the high level to the low level, the output signal OUT is required to be held at the low level until the input signal IN next shifts to the high level. However, the output signal OUT may not be held at the low level due to an off-leak current of the transistor Tr1, a leak current in the circuit connected to the output terminal OUT, or the like, and the shift register may be erroneously operated. In the unit circuits 13a, 13b, the output signal OUT is fixed to the low level by using the transistor Tr4 in the off-period of the transistor Tr1. Thus, according to the shift register of the present embodiment, it is possible to prevent an erroneous operation caused by a potential rise of the output signal OUT.

Fourth Embodiment

A shift register according to a fourth embodiment of the present invention has the configuration shown in FIG. 3.

Figure 10:
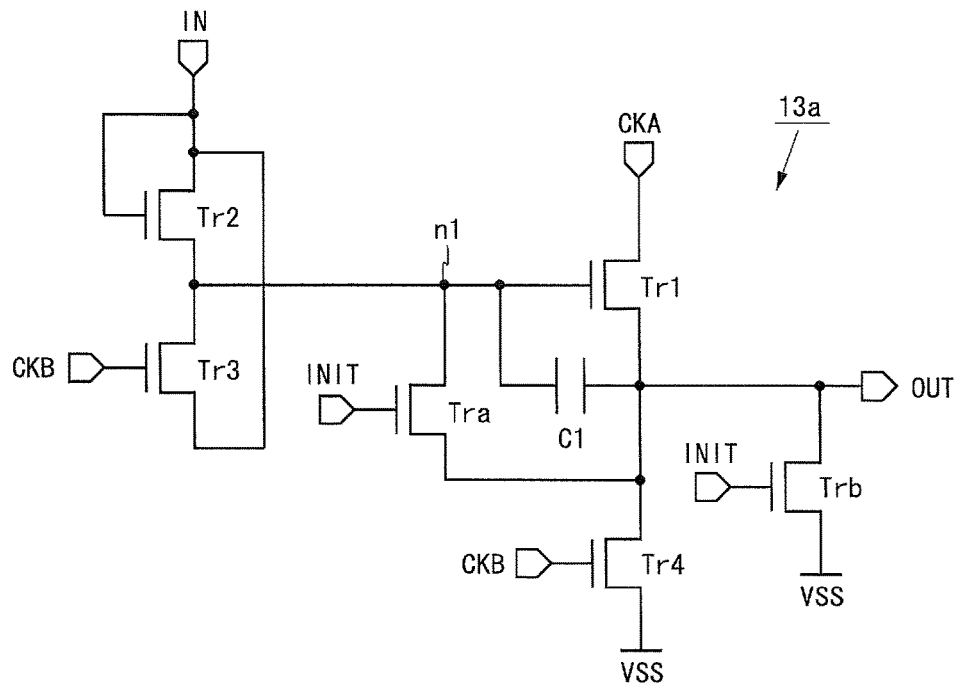
FIG. 10 is a circuit diagram of a unit circuit of a shift register according to a third embodiment.
Figure 11:
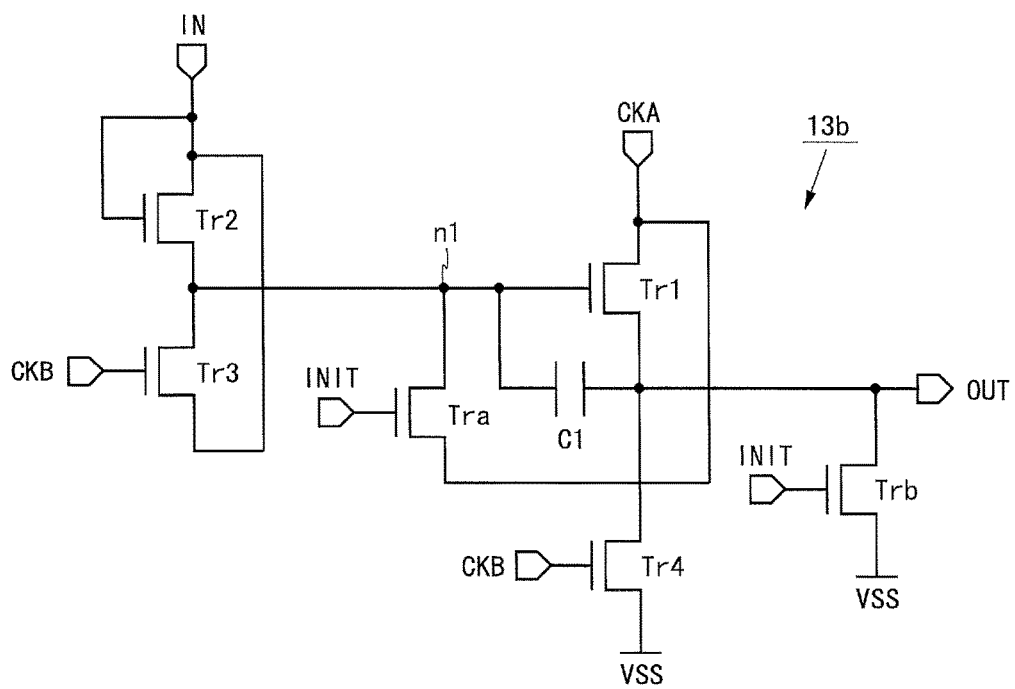
FIG. 11 is a circuit diagram of another unit circuit of the shift register according to the third embodiment.
Figure 12:
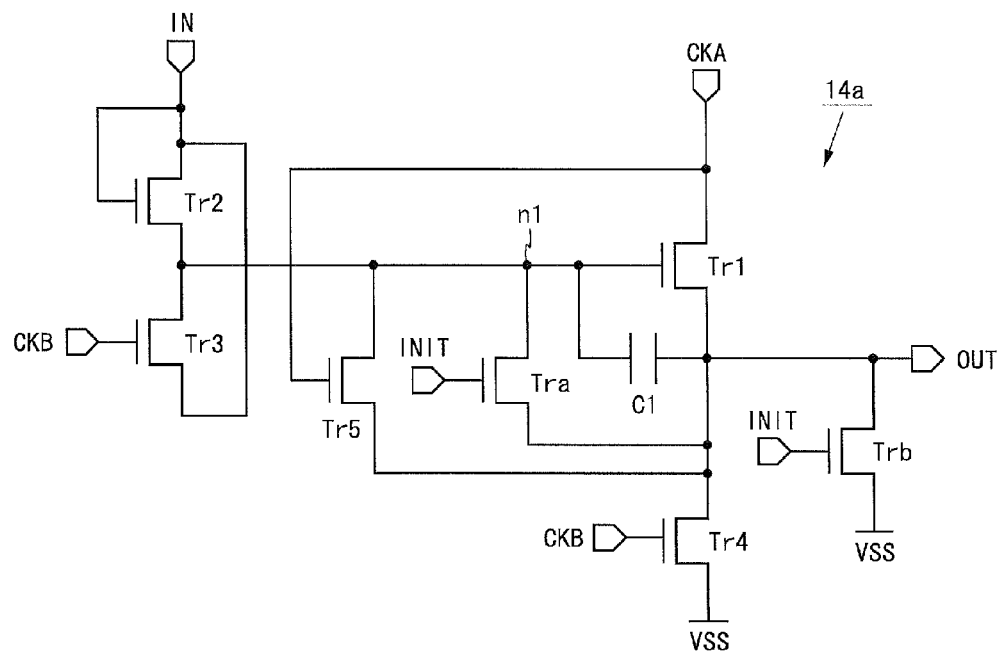
FIG. 12 is a circuit diagram of a unit circuit of a shift register according to a fourth embodiment.
Figure 13:
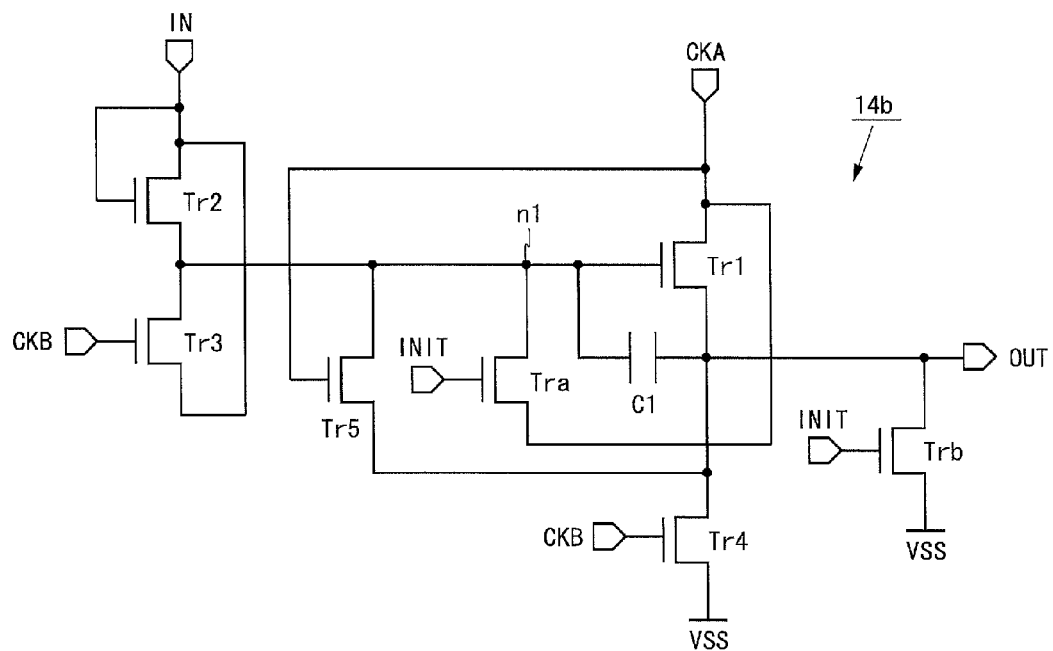
FIG. 13 is a circuit diagram of another unit circuit of the shift register according to the fourth embodiment.

However, the shift register according to the present embodiment includes a unit circuit 14a shown in FIG. 12 or a unit circuit 14b shown in FIG. 13 in place of the unit circuit 11. The unit circuit 14a is formed by adding an N-channel transistor Tr5 to the unit circuit 13a (FIG. 10). A drain terminal of the transistor Tr5 is connected to the gate terminal of the transistor Tr1, a source terminal of the transistor Tr5 is connected to the output terminal OUT, and a gate terminal of the transistor Tr5 is connected to the clock terminal CKA. The unit circuit 14b is formed by changing, in the unit circuit 14a, the connection destination of the source terminal of the transistor Tra to the clock terminal CKA.

In the unit circuits 14a, 14b, when the clock signal CKA is at the high level, the transistor Tr5 is turned on, and the node n1 is electrically connected to the output terminal OUT via the transistor Tr5. Thus, according to the shift register of the present embodiment, it is possible to stabilize the potential of the node n1.

Fifth Embodiment

Figure 14:
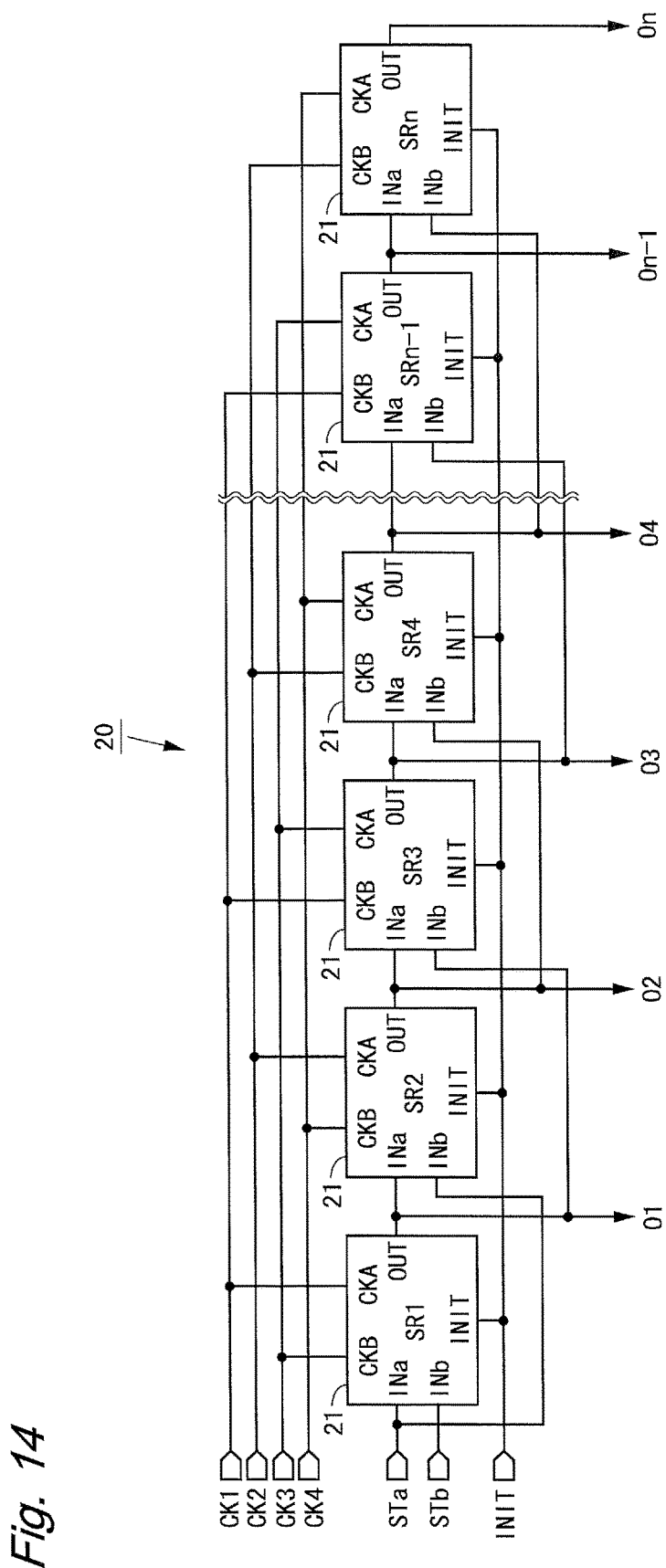
FIG. 14 is a block diagram showing a configuration of a shift register according to a fifth embodiment.

FIG. 14 is a block diagram showing a configuration of a shift register according to a fifth embodiment of the present invention. A shift register 20 shown in FIG. 14 is configured by connecting n unit circuits 21 in multiple stages. The unit circuit 21 has the clock terminals CKA, CKB, input terminals INa, INb, the initialization terminal INIT, and the output terminal OUT. From the outside, the shift register 20 is supplied with start pulses STa, STb, four-phase clock signals CK1 to CK4, and the initialization signal INIT. The initialization signal INIT is provided to the initialization terminals INIT of the n unit circuits 21. The start pulse STa is provided to the input terminal INa of the unit circuit 21 in the first stage and to the input terminal INb of the unit circuit 21 in the second stage. The start pulse STb is provided to the input terminal INb of the unit circuit 21 in the first stage. The output signal OUT of the unit circuit 21 is outputted to the outside as each of the output signals O1 to On, and provided to the input terminal INa of the unit circuit 21 in the next stage and the input terminal INb of the unit circuit 21 in the second stage after the present stage.

When an integer not smaller than 1 and not larger than n/4 is k, the clock signal CK1 is provided to the clock terminal CKA of the unit circuit 21 in the (4k−3)th stage and the clock terminal CKB of the unit circuit 21 in the (4k−1)th stage. The clock signal CK2 is provided to the clock terminal CKA of the unit circuit 21 in the (4k−2)th stage and the clock terminal CKB of the unit circuit 21 in the 4k-th stage. The clock signal CK3 is provided to the clock terminal CKA of the unit circuit 21 in the (4k−1)th stage and the clock terminal CKB of the unit circuit 21 in the (4k−3)th stage. The clock signal CK4 is provided to the clock terminal CKA of the unit circuit 21 in the 4k-th stage and the clock terminal CKB of the unit circuit 21 in the (4k−2)th stage.

Figure 15:
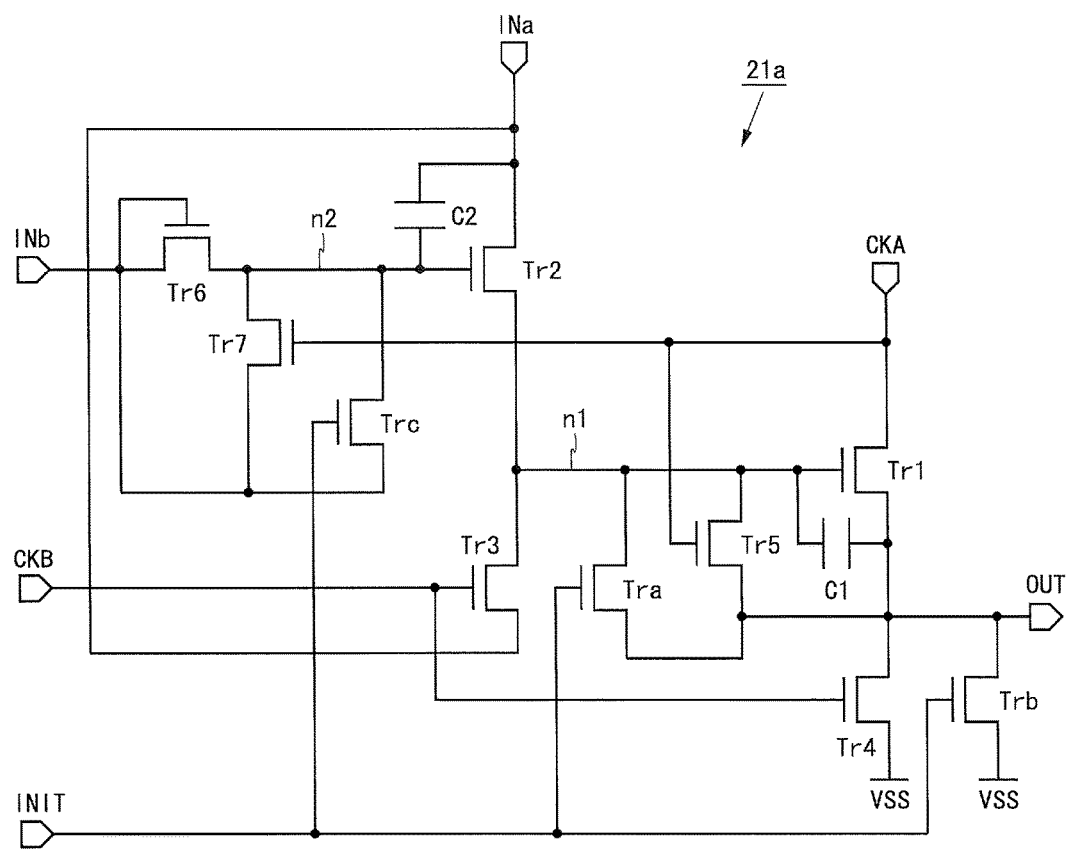
FIG. 15 is a circuit diagram of a unit circuit of the shift register according to the fifth embodiment.
Figure 16:
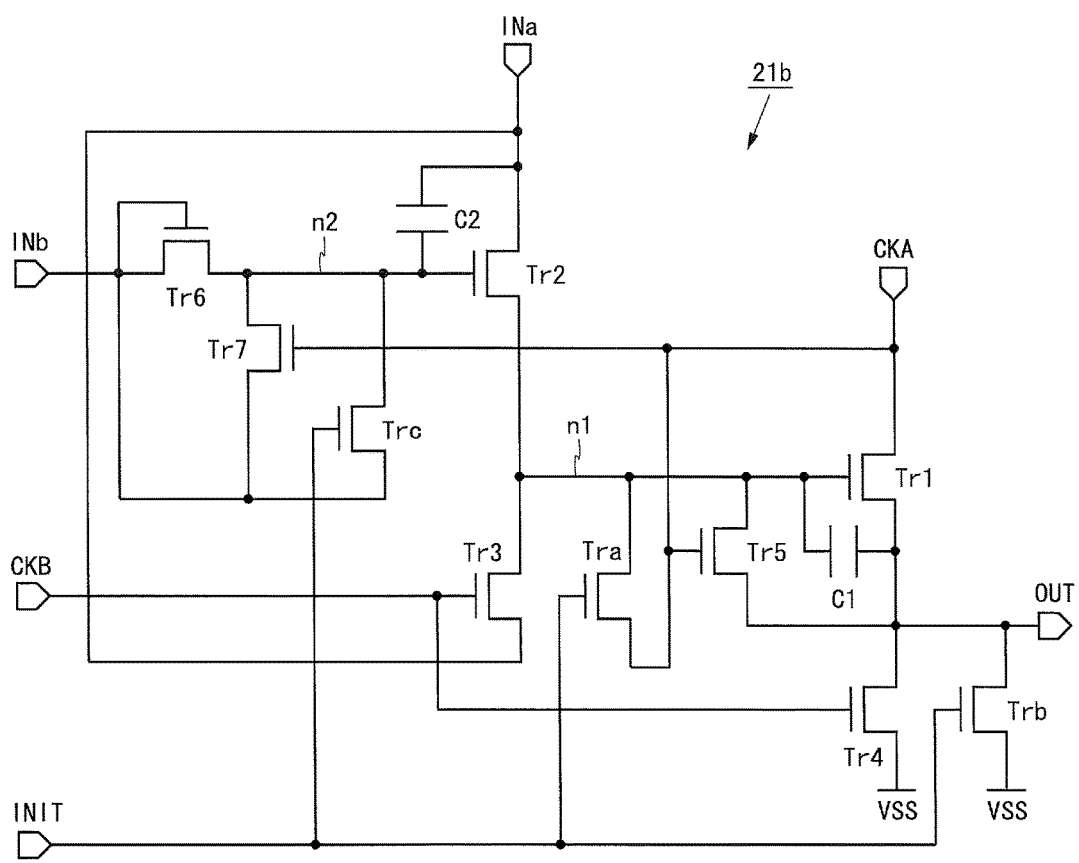
FIG. 16 is a circuit diagram of another unit circuit of the shift register according to the fifth embodiment.

For the unit circuit 21, a unit circuit 21a shown in FIG. 15 or a unit circuit 21b shown in FIG. 16 is used. The unit circuit 21a is formed by adding N-channel transistors Tr6, Tr7, Trc and a capacitor C2 to the unit circuit 14a (FIG. 12), and changing the connection destination of the gate terminal of the transistor Tr2. A gate terminal and a drain terminal of the transistor Tr6 are connected to the input terminal INb, and a source terminal of the transistor Tr6 is connected to the gate terminal of the transistor Tr2. Drain terminals of the transistors Tr7, Trc are connected to the gate terminal of the transistor Tr2, and source terminals of the transistors Tr7, Trc are connected to the input terminal INb. Gate terminals of the transistors Tr7, Trc are respectively connected to the clock terminal CKA and the initialization terminal INIT. The capacitor C2 is provided between the gate and the drain of the transistor Tr2. The transistors Tr2, Tr3, Tr6, Tr7, Trc function as an output control unit. The transistors Tr2, Trc respectively function as a set transistor and a second initialization transistor, and the transistors Tr6, Tr7 function as a set control unit. The unit circuit 21b is formed by changing, in the unit circuit 21a, the connection destination of the source terminal of the transistor Tra to the clock terminal CKA.

Figure 17:
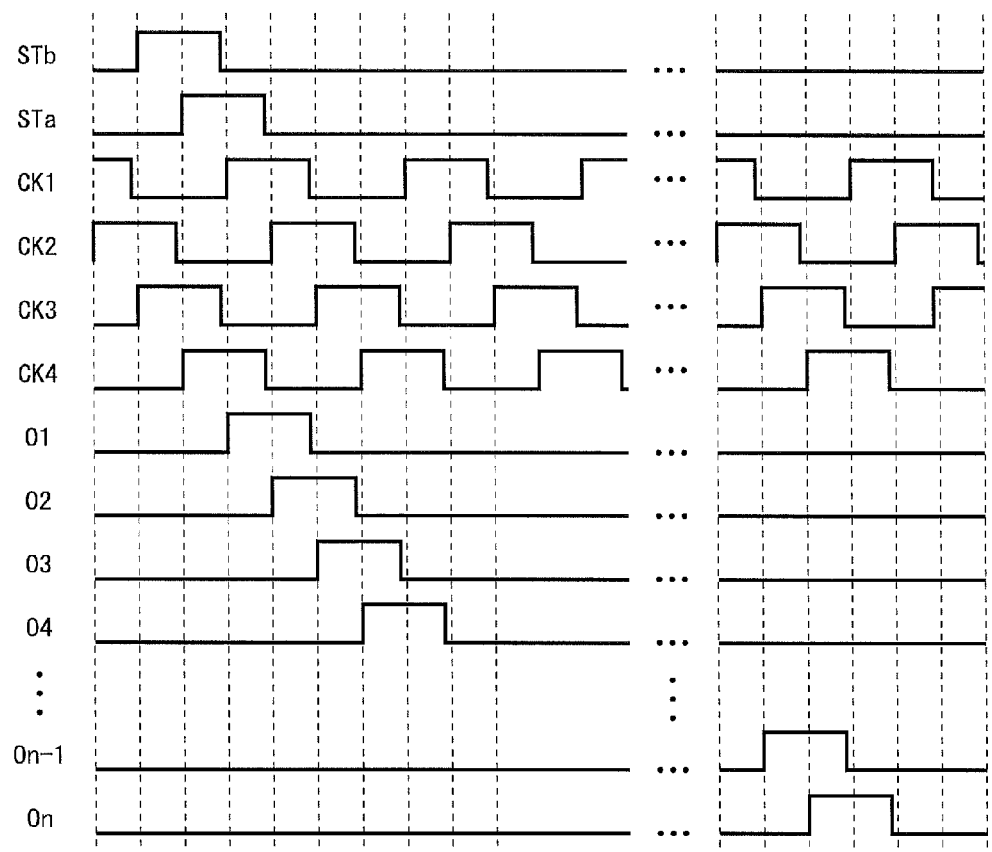
FIG. 17 is a timing chart of the shift register according to the fifth embodiment.

FIG. 17 is a timing chart of the shift register 20. As shown in FIG. 17, the clock signal CK1 shifts to the high level or the low level in a predetermined cycle. However, the high-level period of the clock signal CK1 is shorter than the low-level period of the clock signal CK1. The clock signals CK2 to CK4 are signals respectively obtained by delaying the clock signal CK1 by a quarter cycle, a half cycle, and a three-quarter cycle. At the start of shifting, the start pulse STb shifts to the high level in the high-level period of the clock signal CK3. The start pulse STa is a signal obtained by delaying the start pulse STb by a quarter cycle of the clock signal CK1.

Figure 18:
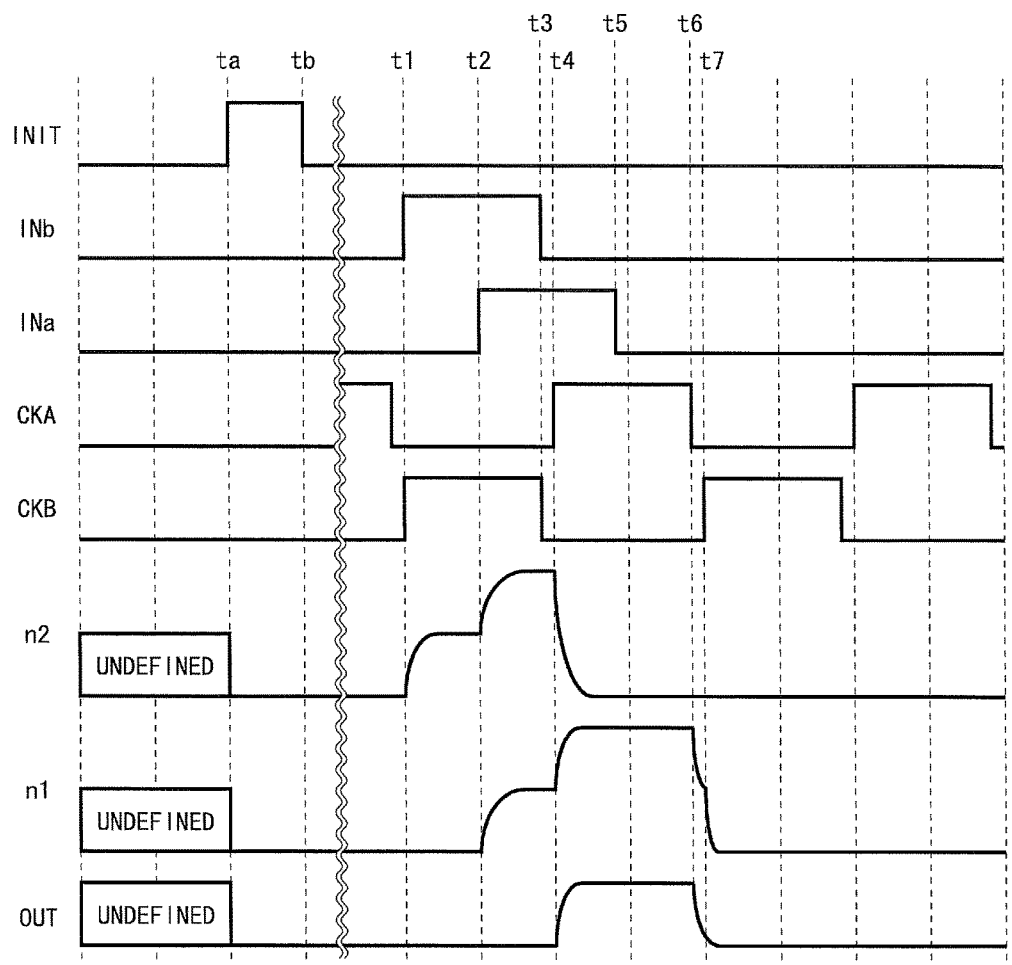
FIG. 18 is a signal waveform diagram of the shift register according to the fifth embodiment.

FIG. 18 is a signal waveform diagram of the shift register 20. An operation of the unit circuit 21 will be described with reference to FIG. 18. Before the time ta, potentials of nodes n1, n2 and the output signal OUT are undefined. At the time ta, the initialization signal INIT changes from the low level to the high level. With this change, the transistors Tra to Trc are turned on. By the transistors Tra, Trb being turned on, the potential of the node n1 and the output signal OUT are initialized to the low level. By the transistor Trc being turned on, the node n2 is connected to the input terminal INb via the transistor Trc. At this time, in each of the unit circuits 21 in the third to n-th stages, the input signal INb (the output signal OUT of the unit circuit 21 in the second stage before the present stage) is at the low level, and hence the potential of the node n2 is initialized to the low level. Further, by controlling the start pulses STa, STb to the low level at the time of initialization, it is possible to initialize the potential of the node n2 to the low level also for the unit circuits 21 in the first and second stages. When the initialization signal INIT changes to the low level at the time tb, the transistors Tra to Trc are turned off.

Before the time t1, potentials of the nodes n1, n2 and the output signal OUT are at the low level. At the time t1, the input signal INb and the clock signal CKB change from the low level to the high level. With this change, the transistor Tr6 is turned on, a current passing through the transistor Tr6 flows from the input terminal INb toward the node n2, and the potential of the node n2 rises (charge of the node n2). When the potential of the node n2 rises to (VDD−Vth), the transistor Tr6 is turned off, and the node n2 enters the floating state after that. When the potential of the node n2 exceeds a predetermined level, the transistor Tr2 is turned on. Further, at the time t1, the transistor Tr3 is turned on. As thus described, after a lapse of certain time from the time t1, the transistors Tr2, Tr3 both enter the on-state. Since an input signal INa is at the low level at this time, the potential of the node n1 is held at the low level even after the transistors Tr2, Tr3 are turned on.

At the time t2, the input signal INa changes from the low level to the high level. At this time, with the transistors Tr2, Tr3 being in the on-state, a current passing through the transistor Tr2 and a current passing through the transistor Tr3 flow from the input terminal INa toward the node n1, and the potential of the node n1 rises (charge of the node n1).

When the potential of the node n1 exceeds a predetermined level, the transistor Tr1 is turned on. Further, when the potential of the node n1 rises, the potential of the node n2 rises by being pushed up by a capacitance between the gate and the channel of the transistor Tr2 and the capacitor C2 (push-up of the node n2). By providing the capacitor C2, it is possible to increase push-up effect of the node n2 when the input signal INa changes from the low level to the high level. When the potential of the node n2 becomes (VDD+Vth) or higher, the potential of the node n1 becomes the high-level potential VDD. At the time t3, the input signal INb and the clock signal CKB change to the low level. With this change, the transistor Tr3 is turned off. Even after the transistor Tr3 is turned off, the potentials of the nodes n1, n2 are held at the high level, and the transistor Tr1 is held in the on-state.

At the time t4, the clock signal CKA changes from the low level to the high level. With this change, from the time t4 on, the high-level potential of the clock signal CKA is outputted as the output signal OUT. Further, when the potential of the output signal OUT rises, the potential of the node n1 is pushed up by the capacitance between the gate and the channel of the transistor Tr1 and the capacitor C1, and rises by $\alpha$ (wherein $\alpha$ is substantially equal to the amplitude of the clock signal CKA) (push-up of the node n1). Since the potential of the node n1 becomes (VDD+Vth) or higher at this time, it is possible to output as the output signal OUT the high-level potential VDD without a threshold drop. Further, at the time t4, the transistor Tr7 is turned on. At this time, with the input signal INb being at the low level, a current passing through the transistor Tr7 flows from the node n2 toward the input terminal INb, and the potential of the node n2 drops to the low level (discharge of the node n2). Hence the transistor Tr2 is turned off. Further, at the time t4, the transistor Tr5 is turned on. Therefore, the output terminal OUT is electrically connected to the clock terminal CKA via the transistor Tr5.

At the time t5, the input signal INa changes to the low level. At this time, with the transistors Tr2, Tr3 being in the off-state, the potentials of the nodes n1, n2 remain unchanged. At the time t6, the clock signal CKA changes to the low level. With this change, the output signal OUT changes to the low level, and the transistors Tr5, Tr7 are turned off. Further, since the push-up of the node n1 is completed, the potential of the node n1 drops to the high-level potential VDD. At the time t7, the clock signal CKB changes to the high level. With this change, the transistor Tr3 is turned on. At this time, with the input signal INa being at the low level, a current passing through the transistor Tr2 flows from the node n1 toward the input terminal INa, and the potential of the node n1 drops to the low level (discharge of the node n1).

As shown in FIG. 17, an output signal O1 of the unit circuit 21 in the first stage shifts to the high level in the high-level period of the clock signal CK1 after the start pulse STa has shifted to the high level. An output signal O2 of the unit circuit 21 in the second stage shifts to the high level in the high-level period of the clock signal CK2 after the output signal O1 has shifted to the high level. An output signal O3 of the unit circuit 21 in the third stage shifts to the high level in the high-level period of the clock signal CK3 after the output signal O2 has shifted to the high level. An output signal O4 of the unit circuit 21 in the fourth stage shifts to the high level in the high-level period of the clock signal CK4 after the output signal O3 has shifted to the high level. Similarly, an output signal O1 of the unit circuit 21 shifts to the high level in the high-level period of any of the clock signals CK1 to CK4 after an output signal Oi−1 of the unit circuit 21 in the previous stage has shifted to the high level. Therefore, the output signals O1 to On of the shift register 20 shift to the high level in ascending order while each being delayed by a quarter cycle of the clock signal CK1.

In the unit circuit 21a, at the time of operation, the potentials of the nodes n1, n2 become (VDD−Vth+$\alpha$) at the maximum by being pushed up. In the push-up period of the node n1, the potential of the output signal OUT is VDD, and hence a voltage ($\alpha$−Vth) is applied between the source and the drain of the transistor Tra. In a large part of the push-up period of the node n2 (the time t2 to t3 shown in FIG. 18), the potential of the input signal INb is VDD, and hence the same voltage ($\alpha$−Vth) is applied between the source and the drain of each of the transistors Tr7 and Trc. The voltage ($\alpha$−Vth) is lower than a driving voltage of the transistor. The same applies to the unit circuit 21b.

As thus described, in the unit circuits 21a, 21b, a high voltage is not applied between the source and the drain of the transistor Tra, and the time during which a high voltage is applied between the source and the drain of each of the transistors Tr7 and Trc is short. Therefore, it is not necessary to take conventional measures for breakdown voltage (method using a plurality of transistors or a transistor with a large L-length) on the transistors Tr7, Tra, Trc. Thus, according to the shift register of the present embodiment, it is possible to prevent degradation and breakdown of the transistor without increasing a layout area.

It should be noted that in the time t3 to t4 shown in FIG. 18, the potential of the node n2 becomes (VDD−Vth+$\alpha$), and the clock signal CKB shifts to the low level. In this period, a high voltage (VDD−Vth+$\alpha$−VSS) is applied between the source and the drain of each of the transistors Tr7 and Trc. In order to prevent this, a duty ratio of the clock signals CK1 to CK4 may be set to 50%, and the lengths of the high-level periods of the start pulses STa, STb may be made the same as the lengths of the high-level periods of the clock signals CK1 to CK4.

As thus described, the unit circuit 21a includes: the output transistor Tr1 having a first conduction terminal connected to the clock terminal CKA, and a second conduction terminal connected to the output terminal OUT; the output control unit (transistors Tr2, Tr3, Tr6, Tr7, Trc) that applies the on-potential (high-level potential) and the off-potential (low-level potential) in a switching manner to the control terminal of the output transistor Tr1; the initialization transistor Tra having a first conduction terminal connected to the control terminal of the output transistor Tr1, a second conduction terminal connected to the output terminal OUT, and a control terminal provided with the initialization signal INIT; and the output initialization transistor Trb having a first conduction terminal connected to the output terminal OUT, a second conduction terminal fixedly applied with the off-potential, and a control terminal provided with the initialization signal INIT. In the unit circuit 21b, the second conduction terminal of the initialization transistor Tra is connected to the clock terminal CKA. Thus, according to the shift register 20 of the present embodiment, it is possible to perform initialization without applying a high voltage between the conduction terminals of the initialization transistor Tra at the time of operation.

Further, the output control unit of each of the unit circuits 21a, 21b includes the set transistor Tr2 having a first conduction terminal provided with the input signal INa with respect to the unit circuit, and a second conduction terminal connected to the control terminal of the output transistor Tr1, the set control unit (transistors Tr6, Tr7) that applies the on-potential and the off-potential in a switching manner to the control terminal of the set transistor Tr2, and the second initialization transistor Trc having a first conduction terminal connected to the control terminal of the set transistor Tr2, a second conduction terminal connected to the second input terminal INb, and a control terminal provided with the initialization signal INIT. The second input signal INb becomes the on-potential at the same level as the control terminal of the output transistor Tr1 in at least part of a period during which the on-potential is applied to the control terminal of the output transistor Tr1.

By controlling the input signal INb to the off-level at the time of initialization, it is possible to control the set transistor Tr2 into the off-state and electrically disconnect the input signal INa and the control terminal of the output transistor Tr1, so as to reliably control the output transistor Tr1 into the off-state. Further, by controlling the potential of the second conduction terminal of the second initialization transistor Trc to the on-potential at the same level as the control terminal of the output transistor Tr1 in at least part of the period during which the on-potential is applied to the control terminal of the output transistor Tr1, it is possible to shorten the time during which a high voltage is applied between the conduction terminals of the second initialization transistor Trc.

Sixth Embodiment

Figure 19:
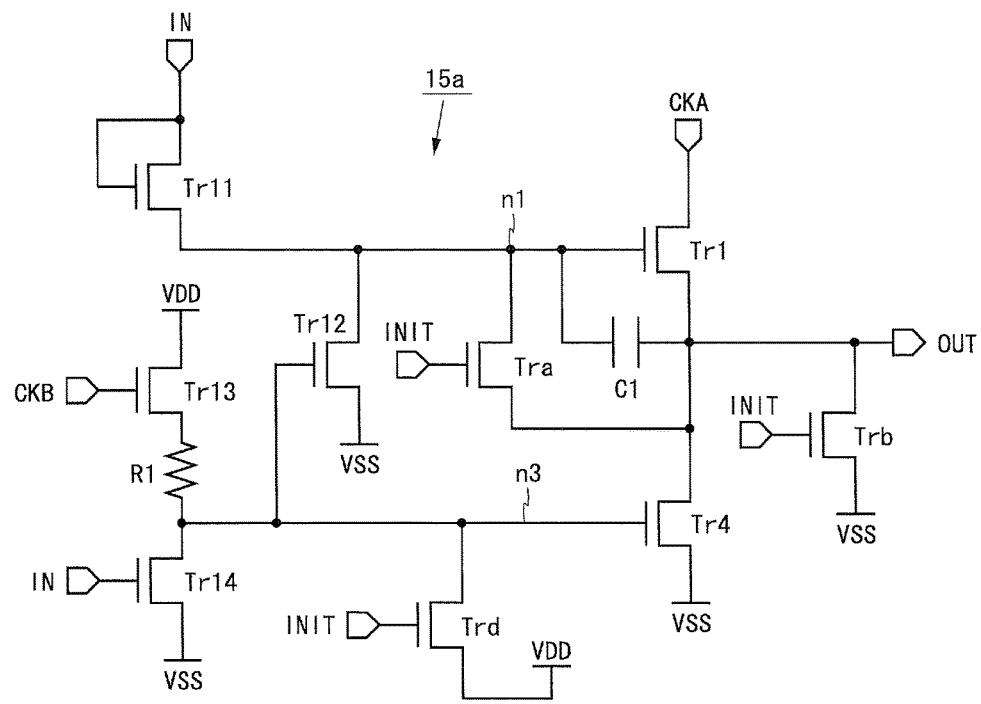
FIG. 19 is a circuit diagram of a unit circuit of a shift register according to a sixth embodiment.
Figure 20:
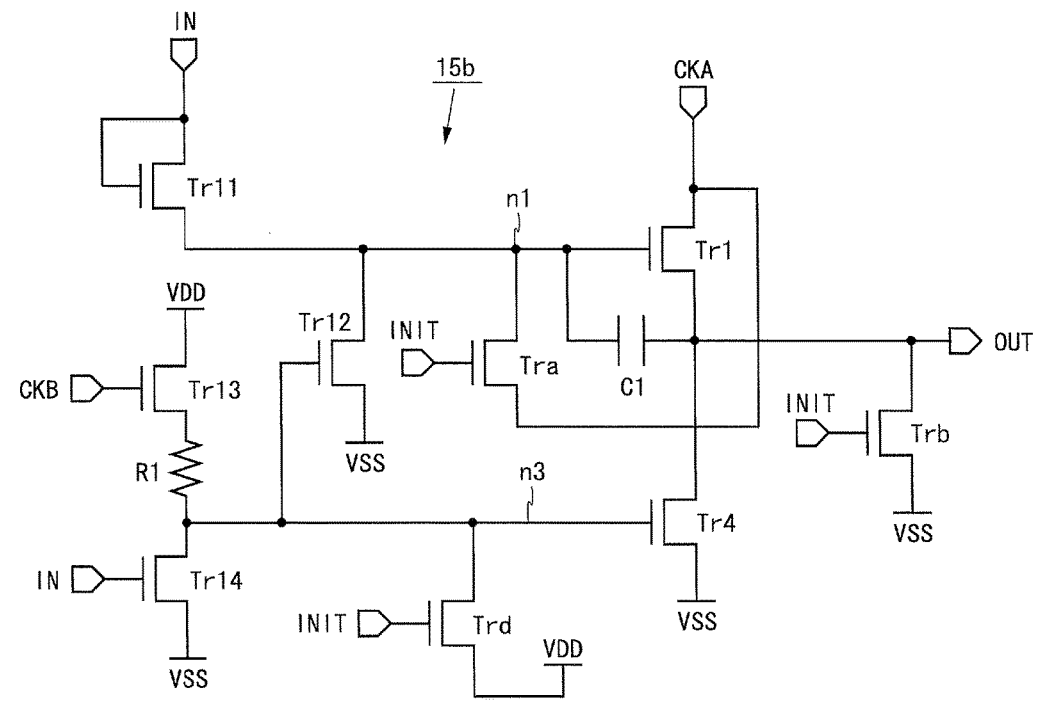
FIG. 20 is a circuit diagram of another unit circuit of the shift register according to the sixth embodiment.

A shift register according to a sixth embodiment of the present invention has the configuration shown in FIG. 3. However, the shift register according to the present embodiment includes a unit circuit 15a shown in FIG. 19 or a unit circuit 15b shown in FIG. 20 in place of the unit circuit 11. The unit circuit 15a includes nine N-channel transistors Tr1, Tr4, Tr11 to Tr14, Tra, Trb, Trd, the capacitor C1, and a resistor R1. A drain terminal of the transistor Tr1 is connected to the clock terminal CKA, and a source terminal of the transistor Tr1 is connected to the output terminal OUT and a drain terminal of the transistor Tr4. A gate terminal and a drain terminal of the transistor Tr11 are connected to the input terminal IN, and a source terminal of the transistor Tr11 is connected to a gate terminal of the transistor Tr1 and a drain terminal of the transistor Tr12. A drain terminal of the transistor Tr13 is applied with the high-level potential VDD, and a source terminal of the transistor Tr13 is connected to one end of the resistor R1. The other end of the resistor R1 is connected to a drain terminal of the transistor Tr14 and gate terminals of the transistors Tr4, Tr12. Source terminals of the transistors Tr4, Tr12, Tr14 are applied with the low-level potential VSS. Gate terminals of the transistors Tr13, Tr14 are respectively connected to the clock terminal CKB and the input terminal IN. The capacitor C1 is provided between the gate and the source of the transistor Tr1. Hereinafter, a node to which the gate terminal of the transistor Tr4 is connected will be referred to as n3.

A drain terminal of the transistor Tra is connected to the gate terminal of the transistor Tr1, and a source terminal of the transistor Tra is connected to the output terminal OUT. A drain terminal of the transistor Trb is connected to the output terminal OUT, and a source terminal of the transistor Trb is applied with the low-level potential VSS. A drain terminal of the transistor Trd is applied with the high-level potential VDD, and a source terminal of the transistor Trd is connected to the node n3. Gate terminals of the transistors Tra, Trb, Trd are connected to the initialization terminal INIT. The transistors Tr11, Tr12 function as an output control unit. The unit circuit 15b is formed by changing, in the unit circuit 15a, the connection destination of the source terminal of the transistor Tra to the clock terminal CKA.

Figure 21:
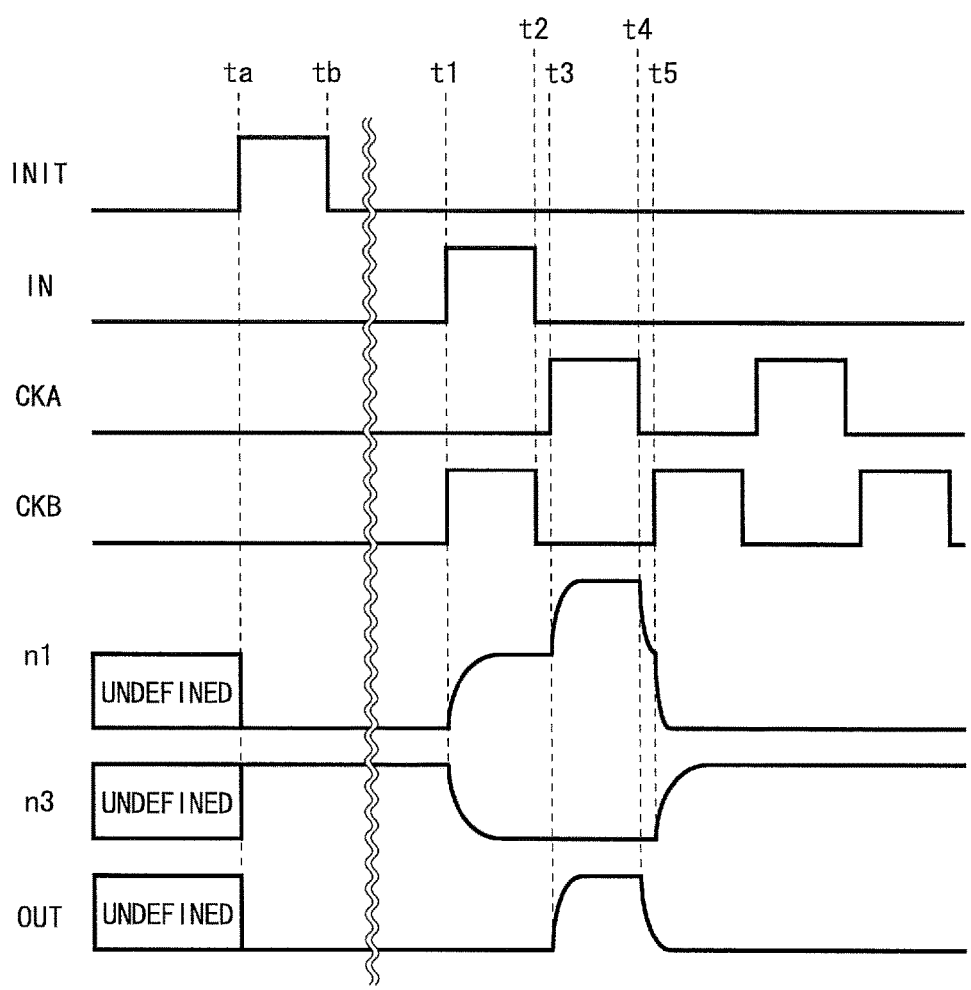
FIG. 21 is a signal waveform diagram of the shift register according to the sixth embodiment.

A timing chart of the shift register according to the present embodiment is the same as the timing chart shown in FIG. 6. FIG. 21 is a signal waveform diagram of the shift register according to the present embodiment. Operations of the unit circuits 15a, 15b will be described with reference to FIG. 21. Before the time ta, potentials of nodes n1, n3 and the output signal OUT are undefined. At the time ta, the initialization signal INIT changes from the low level to the high level. With this change, the transistors Tra, Trb, Trd are turned on. By the transistors Tra, Trb being turned on, the potential of the node n1 and the output signal OUT are initialized to the low level. By the transistor Trd being turned on, the potential of the node n3 is initialized to the high level. When the initialization signal INIT changes to the low level at the time tb, the transistors Tra, Trb, Trd are turned off.

Before the time t1, the potential of the node n1 and the output signal OUT are at the low level, and the potential of the node n3 is (VDD−Vth). At the time t1, the input signal IN and the clock signal CKB change from the low level to the high level. With this change, the transistor Tr11 is turned on, a current passing through the transistor Tr11 flows from the input terminal IN toward the node n1, and the potential of the node n1 rises (charge of the node n1). When the potential of the node n1 rises to (VDD−Vth), the transistor Tr11 is turned off, and the node n1 enters the floating state after that. Further, when the potential of the node n1 exceeds a predetermined level, the transistor Tr1 is turned on. Since the clock signal CKA is at the low level at this time, the output signal OUT is held at the low level even after the transistor Tr1 is turned on. Further, at the time t1, the transistors Tr13, Tr14 are turned on. At this time, due to a current limit by the resistor R1, the potential of the node n3 drops to a low-level potential close to VSS. Hence the transistor Tr12 is turned off. At the time t2, the clock signal CKB and the input signal IN change to the low level. With this change, the transistors Tr13, Tr14 are turned off. Even after the transistors Tr13, Tr14 are turned off, the potential of the node n3 is held at the low level.

At the time t3, the clock signal CKA changes from the low level to the high level. With this change, the push-up of the node n1 is performed, and the high-level potential VDD without a threshold drop is outputted as the output signal OUT. At the time t4, the clock signal CKA changes to the low level. With this change, the output signal OUT changes to the low level. Further, since the push-up of the node n1 is completed, the potential of the node n1 drops to the high-level potential VDD. At the time t5, the clock signal CKB changes to the high level. With this change, the transistor Tr13 is turned on, and the potential of the node n3 rises to (VDD−Vth). Hence the transistors Tr4, Tr12 are turned on. By the transistor Tr4 being turned on, the output signal OUT shifts to the low level. By the transistor Tr12 being turned on, the potential of the node n1 shifts to the low level (discharge of the node n1).

In the unit circuit 15a, at the time of operation, the potential of the node n1 becomes (VDD−Vth+α) at the maximum by being pushed up. In the push-up period of the node n1, the potential of the output signal OUT is VDD, and hence a voltage (α−Vth) is applied between the source and the drain of the transistor Tra. The voltage (α−Vth) is lower than a driving voltage of the transistor. The same applies to the unit circuit 15b. Thus, according to the shift register of the present embodiment, it is possible to perform initialization without applying a high voltage between the source and the drain of the transistor Tra at the time of operation.

Further, in the unit circuits 15a, 15b, the clock signal CKB cyclically shifts to the high level, and the transistor Tr13 is cyclically turned on. Therefore, even when the potential of the node n3 drops by an off-leak current of the transistor Tr14, the potential of the node n3 cyclically becomes (VDD−Vth). Thus, according to the shift register of the present embodiment, it is possible to hold the potential of the node n3 at the high level in the off-period of the transistor Tr1.

In place of the unit circuits 15a, 15b, there may be used a unit circuit formed by connecting the transistor Tr13 and the resistor R1 in the reverse order (a circuit formed by applying the high-level potential VDD to one end of the resistor R1, connecting the other end of the resistor R1 to the drain terminal of the transistor Tr13, and connecting the source terminal of the transistor Tr13 to the drain terminal of the transistor Tr14, the gate terminals of the transistors Tr4, Tr12, and the source terminal of the transistor Trd). By the shift register provided with this unit circuit, a similar effect to that of the shift register provided with the unit circuits 15a, 15b is obtained.

Seventh Embodiment

A shift register according to a seventh embodiment of the present invention has the configuration shown in FIG. 3. However, the shift register according to the present embodiment includes a unit circuit 16a shown in FIG. 22 or a unit circuit 16b shown in FIG. 23 in place of the unit circuit 11. The unit circuit 16a is formed by adding transistors Tr15, Tr16, and a capacitor C2 to the unit circuit 15a (FIG. 19), and changing the connection destination of agate terminal of the transistor Tr11. A drain terminal of the transistor Tr11 is connected to the input terminal IN, and a source terminal of the transistor Tr11 is connected to drain terminals of the transistors Tr12, Tr16. A drain terminal of the transistor Tr15 is connected to the clock terminal CKB, a source terminal of the transistor Tr15 is connected to the gate terminal of the transistor Tr11, and a gate terminal of the transistor Tr15 is applied with the high-level potential VDD. The capacitor C2 is provided between the gate and the drain of the transistor Tr11. A source terminal of the transistor Tr16 is connected to a gate terminal of the transistor Tr1, and a gate terminal of the transistor Tr16 is applied with the high-level potential VDD. The transistors Tr11, Tr12, Tr15 function as an output control unit, and the transistor Tr16 function as a breakdown voltage transistor. Hereinafter, a node to which the gate terminal of the transistor Tr11 is connected will be referred to as n4, a node to which the drain terminal of the transistor Tr16 is connected will be referred to as n5, and a node to which the source terminal of the transistor Tr16 is connected will be referred to as n6. The unit circuit 16b is formed by changing, in the unit circuit 16a, the connection destination of the source terminal of the transistor Tra to the clock terminal CKA.

Figure 24:
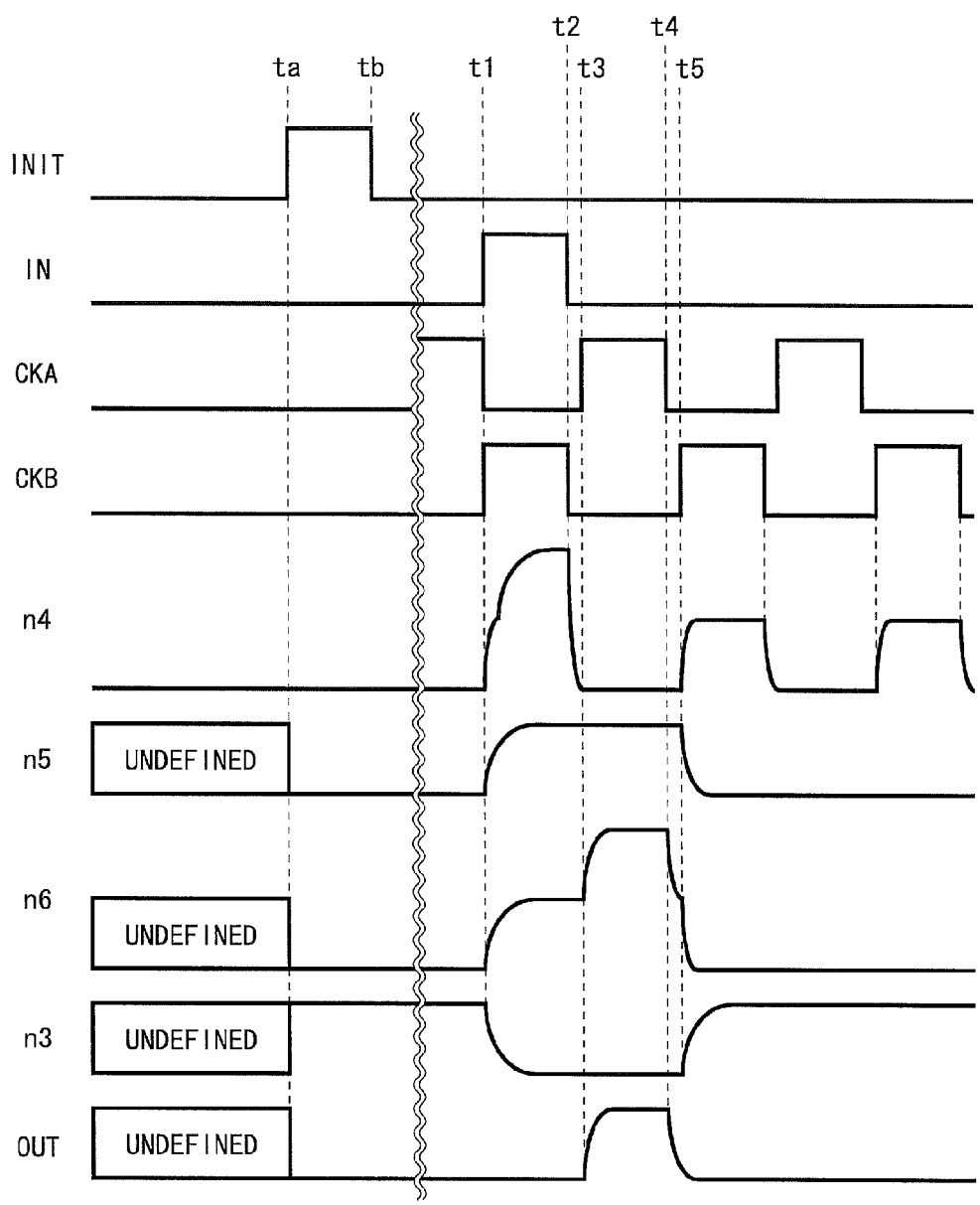
FIG. 24 is a signal waveform diagram of the shift register according to the seventh embodiment.

A timing chart of the shift register according to the present embodiment is the same as the timing chart shown in FIG. 6. FIG. 24 is a signal waveform diagram of the shift register according to the present embodiment. Operations of the unit circuits 16a, 16b will be described with reference to FIG. 24. Before the time ta, potentials of the nodes n3, n5, n6 and the output signal OUT are undefined. By controlling the clock signals CK1, CK2 to the low level at this time, a potential of the node n4 shifts to the low level. At the time ta, the initialization signal INIT changes from the low level to the high level. With this change, the transistors Tra, Trb, Trd are turned on. By the transistors Tra, Trb being turned on, the potential of the node n6 and the output signal OUT are initialized to the low level. At this time, a potential of the node n5 is also initialized to the low level. By the transistor Trd being turned on, the potential of the node n3 is initialized to the high level.

Before the time t1, the potentials of the nodes n4 to n6 and the output signal OUT are at the low level, and the potential of the node n3 is (VDD−Vth). At the time t1, the input signal IN and the clock signal CKB change from the low level to the high level. With this change, a current passing through the transistor Tr15 flows from the clock terminal CKB toward the node n4, and the potential of the node n4 rises (charge of the node n4). When the potential of the node n4 exceeds a predetermined level, the transistor Tr11 is turned on. At this time, with the input signal IN being at the high level, a current passing through the transistor Tr11 flows from the input terminal IN toward the node n5, and the potential of the node n5 rises. When the potential of the node n4 rises to (VDD−Vth), the transistor Tr15 is turned off, and the node n4 enters the floating state after that. Even after the transistor Tr15 is turned off, the potential of the node n5 keeps rising. When the potential of the node n5 rises, the potential of the node n4 rises by being pushed up by a capacitance between the gate and the channel of the transistor Tr11 and the capacitor C2 (push-up of the node n4). When the potential of the node n4 becomes (VDD+Vth) or higher, the potential of the node n5 becomes the high-level potential VDD.

At this time, with the transistor Tr16 being in the on-state, when the potential of the node n5 changes from the low level to the high level, the potential of the node n6 also changes in a similar manner (charge of the node n6). When the potential of the node n6 rises to (VDD−Vth), the transistor Tr16 is turned off, and the nodes n5, n6 are electrically disconnected. Hence the potential of the node n6 only rises to (VDD−Vth) at this time point. When the potential of the node n6 exceeds a predetermined level, the transistor Tr1 is turned on. Further, at the time t1, the transistors Tr13, Tr14 are turned on. Therefore, the potential of the node n3 drops to a low-level potential close to VSS, and the transistor Tr12 is turned off.

At the time t2, the clock signal CKB and the input signal IN change to the low level. With this change, the transistor Tr15 is turned on, a current passing through the transistor Tr15 flows from the node n4 toward the clock terminal CKB, and the potential of the node n4 drops to the low level (discharge of the node n4). When the potential of the node n4 becomes a predetermined level or lower, the transistor Tr11 is turned off. Even after the transistor Tr11 is turned off, the potentials of the nodes n5, n6 remain unchanged, and the transistor Tr1 is held in the on-state. Further, at the time t2, the transistors Tr13, Tr14 are turned off. Even after the transistors Tr13, Tr14 are turned off, the potential of the node n3 is held at the low level.

At the time t3, the clock signal CKA changes from the low level to the high level. With this change, from the time t3 on, the push-up of the node n6 is performed, and the high-level potential VDD without a threshold drop is outputted as the output signal OUT. At the time t4, the clock signal CKA changes to the low level. With this change, the output signal OUT changes to the low level. Further, since the push-up of the node n6 is completed, the potential of the node n6 drops to (VDD−Vth).

At the time t5, the clock signal CKB changes to the high level. With this change, the potential of the node n4 rises to (VDD−Vth), and the transistor Tr11 is turned on. At this time, with the input signal IN being at the low level, a current passing through the transistors Tr11, Tr16 flows from the node n6 toward the input terminal IN. Further, at the time t5, the transistor Tr13 is turned on. Therefore, the potential of the node n3 rises to (VDD−Vth), and the transistor Tr12 is turned on. Hence the potentials of the nodes n5, n6 shift to the low level (discharge of the node n6).

In the unit circuit 16a, at the time of operation, the potential of the node n6 becomes (VDD−Vth+α) at the maximum by being pushed up. In the push-up period of the node n6, the potential of the output signal OUT is VDD, and hence a voltage (α−Vth) is applied between the source and the drain of the transistor Tra. The voltage (α−Vth) is lower than a driving voltage of the transistor. The same applies to the unit circuit 16b. Thus, according to the shift register of the present embodiment, it is possible to perform initialization without applying a high voltage between the source and the drain of the transistor Tra at the time of operation.

Further, in the unit circuit 16a, in the push-up period of the node n6, the potential of the node n5 is VDD, and hence a voltage (VDD−VSS), which is lower than the driving voltage of the transistor, is applied between the gate and the source and between the source and the drain of the transistor Tr11. The same voltage is also applied between the gate and the drain and between the source and the drain of the transistor Tr12. Further, a voltage (α−Vth) is applied between the gate and the source and between the source and the drain of the transistor Tr16. As thus described, by providing a voltage, which is lower than the driving voltage, between the terminals of the transistors Tr11, Tr12 by using the transistor Tr16, it is possible to prevent degradation and breakdown of the transistors Tr11, Tr12.

Further, in the unit circuit 16a, the node n4 enters the floating state in part of the period during which the input signal IN is at the high level by the action of the transistor Tr15. Therefore, the potential of the node n4 becomes higher than the high-level potential VDD, and the potential of the node n5 rises to the high-level potential VDD without a threshold drop. For this reason, when the output signal OUT shifts to the high level, the potential of the node n6 rises to (VDD−Vth+α) by being pushed up. The same applies to the unit circuit 16b. Thus, according to the shift register of the present embodiment, it is possible to provide a potential sufficiently higher than the high-level potential of the clock signal CKA to the gate terminal of the transistor Tr1, so as to reduce rounding of the output signal OUT. Further, even when the threshold voltage of the transistor is originally high or when it becomes high due to a temperature change or degradation of the transistor, it is possible to suppress an influence of waveform rounding, so as to increase an operation margin with respect to fluctuation of the threshold voltage of the transistor.

As thus described, the unit circuit 16a includes: the output transistor Tr1 having a first conduction terminal connected to the clock terminal CKA, and a second conduction terminal connected to the output terminal OUT; the breakdown voltage transistor Tr16 having a first conduction terminal connected to a first node (node n5), a second conduction terminal connected to the control terminal of the output transistor Tr1, and a control terminal fixedly applied with the on-potential (high-level potential); the output control unit (transistors Tr11, Tr12, Tr15) that applies the on-potential and the off-potential (low-level potential) in a switching manner to the first node; the initialization transistor Tra having a first conduction terminal connected to the control terminal of the output transistor Tr1, a second conduction terminal connected to the output terminal OUT, and a control terminal provided with the initialization signal INIT; and the output initialization transistor Trb having a first conduction terminal connected to the output terminal OUT, a second conduction terminal fixedly applied with the off-potential, and a control terminal provided with the initialization signal INIT. In the unit circuit 16b, the second conduction terminal of the initialization transistor Tra is connected to the clock terminal CKA. Thus, according to the shift register of the present embodiment, similarly to the first embodiment, it is possible to perform initialization without applying a high voltage between the conduction terminals of the initialization transistor Tra at the time of operation.

Further, at the time of outputting the clock signal having the on-potential, the potential of the first node remains unchanged from the on-potential applied by the output control unit, by the action of the breakdown voltage transistor Tr16. Hence it is possible to prevent application of a high voltage between the terminals of the transistors Tr11, Tr12 connected to the first node.

Eighth Embodiment

Figure 25:
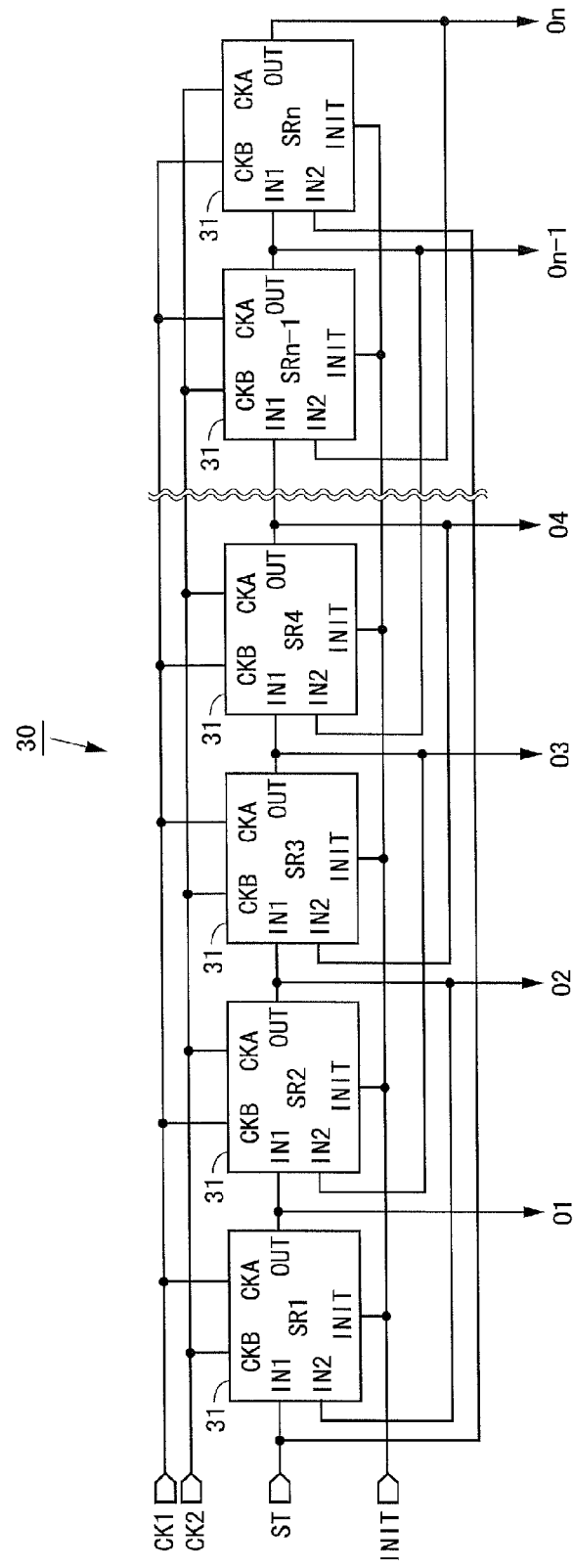
FIG. 25 is a block diagram showing a configuration of a shift register according to an eighth embodiment.

FIG. 25 is a block diagram showing a configuration of a shift register according to an eighth embodiment of the present invention. A shift register 30 shown in FIG. 25 is configured by connecting n unit circuits 31 in multiple stages. The unit circuit 31 has the clock terminals CKA, CKB, input terminals IN1, IN2, the initialization terminal INIT, control terminals UD, UDB (not shown), and the output terminal OUT. From the outside, the shift register 30 is supplied with the start pulse ST, the two-phase clock signals CK1, CK2, the initialization signal INIT, and control signals UD, UDB (not shown). The clock signals CK1, CK2 are provided to each terminal similarly to the shift register 10 (FIG. 3) according to the first embodiment. The initialization signal INIT and the control signals UD, UDB are respectively provided to the initialization terminal INIT and the control terminals UD, UDB of each of the n unit circuits 31. The start pulse ST is provided to the input terminal IN1 of the unit circuit 31 in the first stage and to the input terminal IN2 of the unit circuit 31 in the n-th stage. The output signal OUT of the unit circuit 31 is outputted to the outside as each of the output signals O1 to On, and provided to the input terminal IN1 of the unit circuit 31 in the next stage and the input terminal IN2 of the unit circuit 31 in the previous stage.

Figure 22:
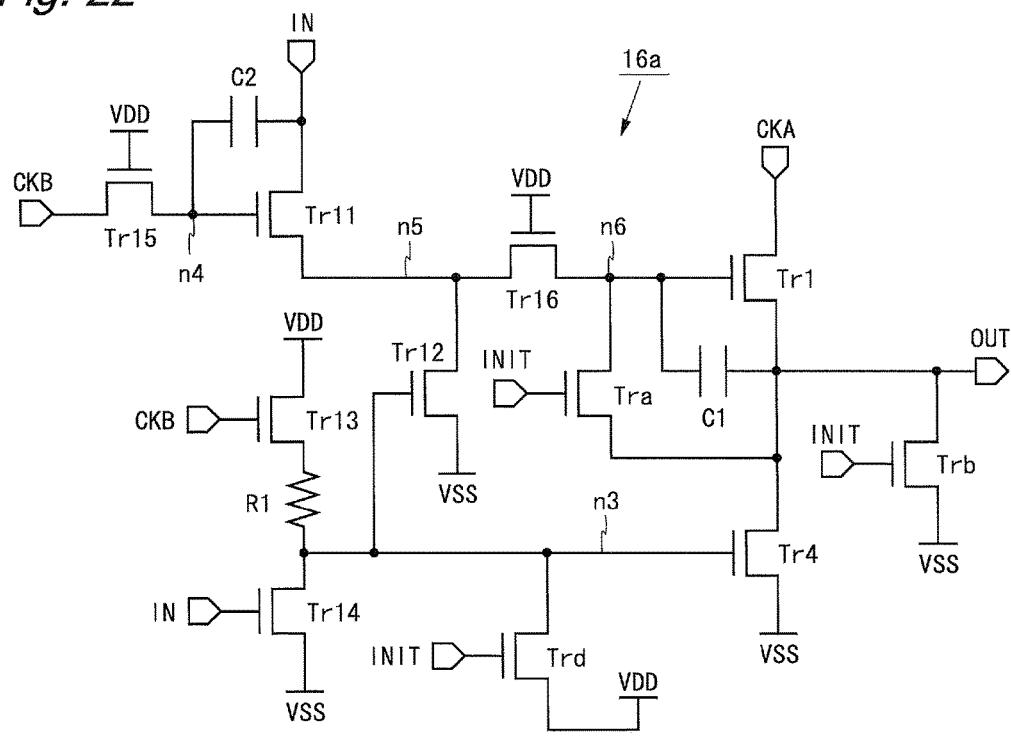
FIG. 22 is a circuit diagram of a unit circuit of a shift register according to a seventh embodiment.
Figure 23:
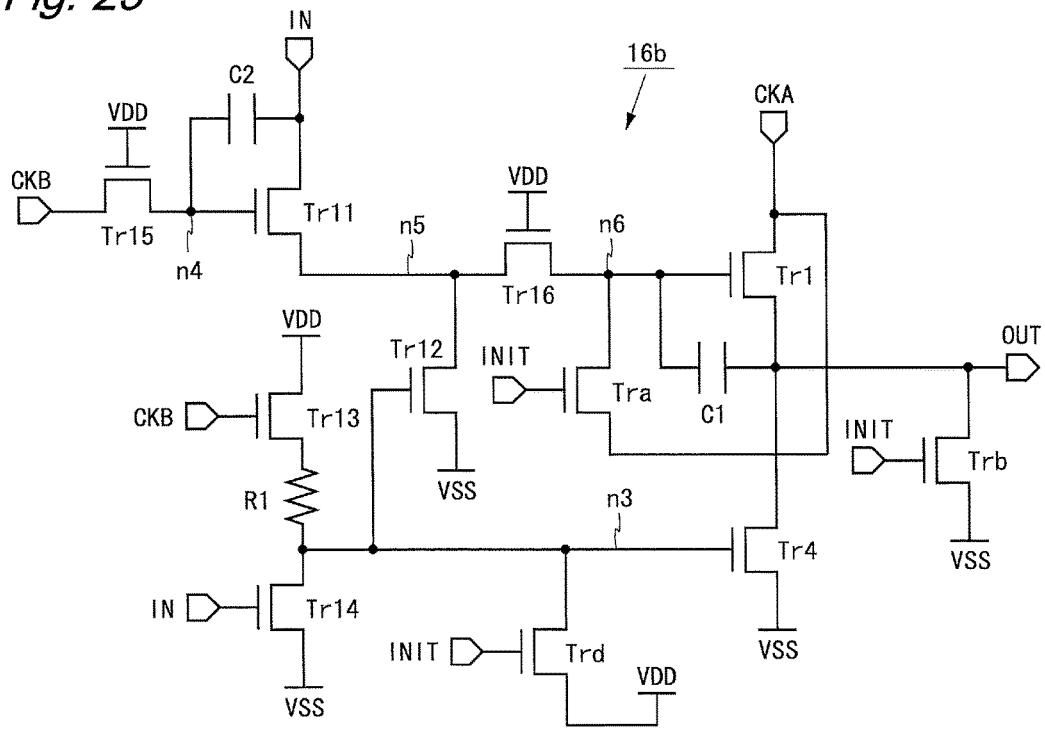
FIG. 23 is a circuit diagram of another unit circuit of the shift register according to the seventh embodiment.
Figure 26:
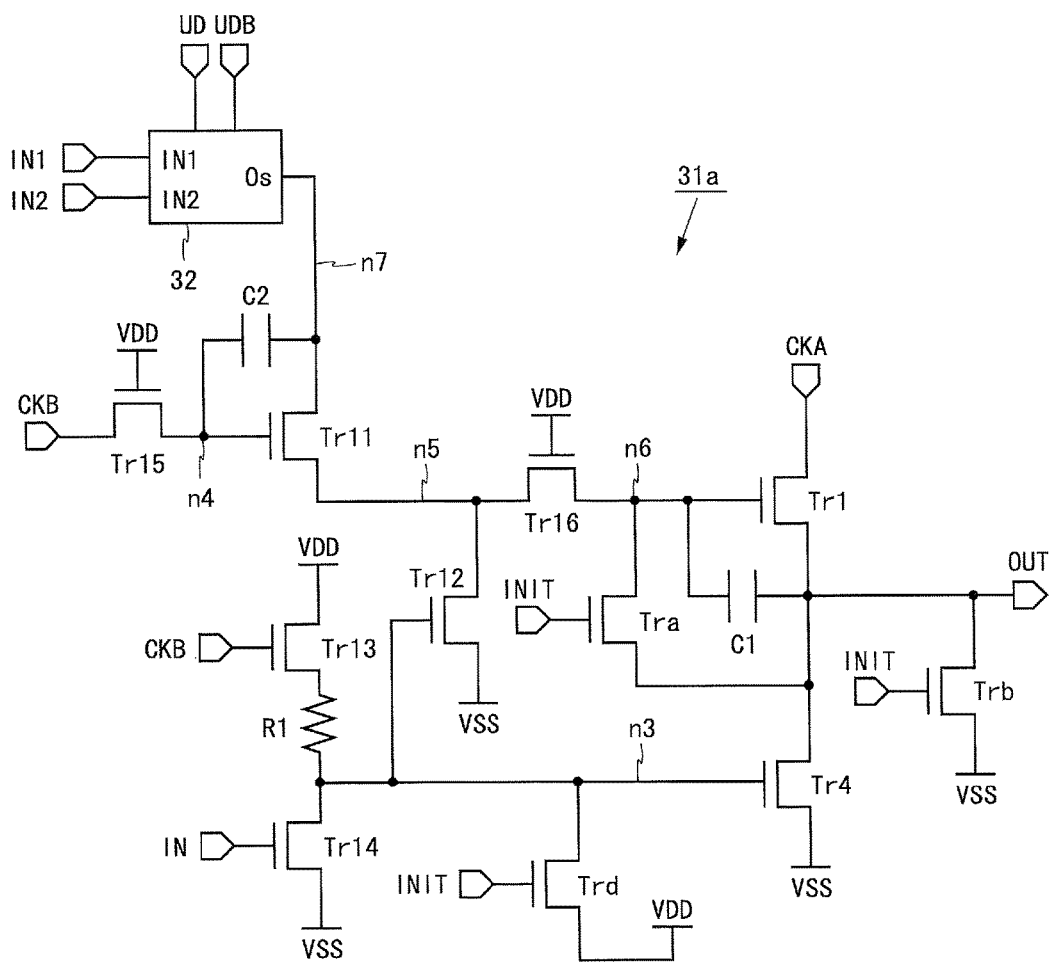
FIG. 26 is a circuit diagram of a unit circuit of the shift register according to the eighth embodiment.
Figure 27:
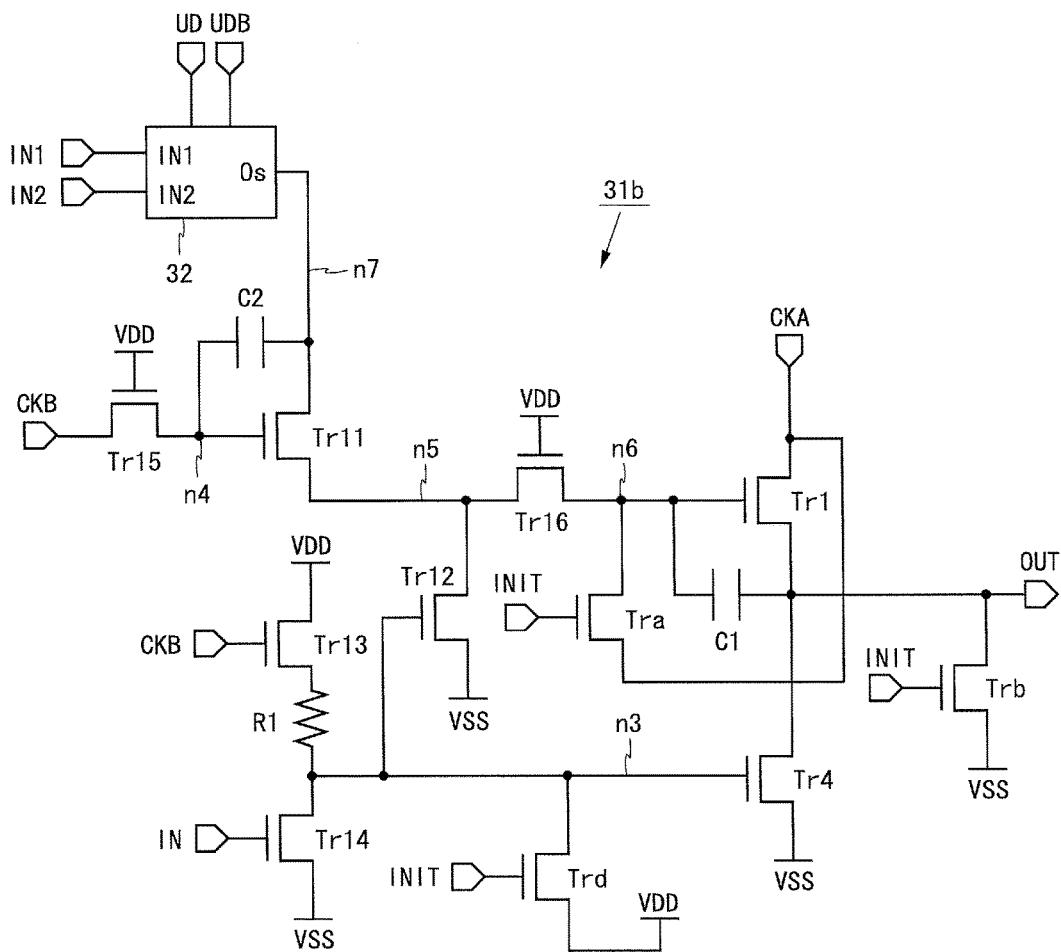
FIG. 27 is a circuit diagram of another unit circuit of the shift register according to the eighth embodiment.

A unit circuit 31a shown in FIG. 26 or a unit circuit 31b shown in FIG. 27 is used for the unit circuit 31. The unit circuit 31a is formed by adding a scan switching circuit 32 to the unit circuit 16a (FIG. 22). The control signal UD is controlled to the high level at the time of forward scanning, and controlled to the low level at the time of backward scanning. The control signal UDB is an inverted signal of the control signal UD. In accordance with the control signals UD, UDB, the scan switching circuit 32 outputs an input signal IN1 at the time of forward scanning, and outputs an input signal IN2 at the time of backward scanning. An output signal Os of the scan switching circuit 32 is provided to a drain terminal of the transistor Tr11. The unit circuit 31b is formed by changing, in the unit circuit 31a, the connection destination of the source terminal of the transistor Tra to the clock terminal CKA. Hereinafter, a node to which the output terminal Os of the scan switching circuit 32 is connected will be referred to as n7.

At the time of forward scanning, the unit circuit 31 is operated taking the output signal OUT of the unit circuit 31 in the previous stage as an input signal. At this time, the output signals O1 to On of the shift register 30 shift to the high level in ascending order (cf. FIG. 6). At the time of backward scanning, the unit circuit 31 is operated taking the output signal OUT of the unit circuit 31 in the next stage as an input signal. At this time, the output signals O1 to On of the shift register 30 shift to the high level in descending order (in the order of On, On−1, . . . , O1) (cf. FIG. 28).

Figure 28:
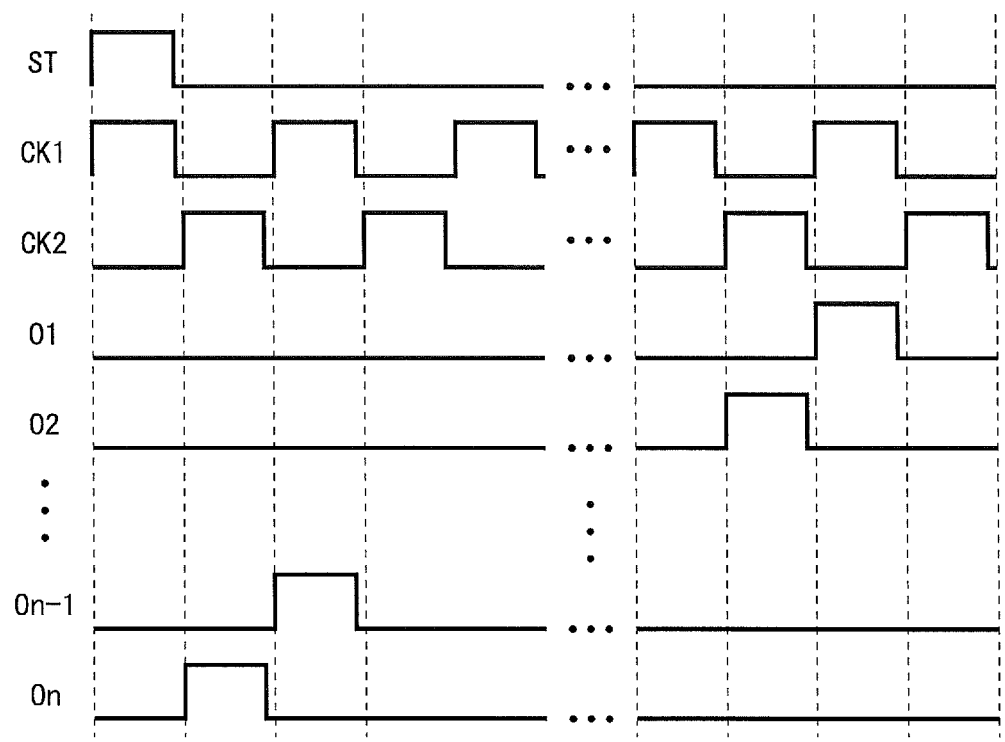
FIG. 28 is a timing chart of the shift register according to the eighth embodiment at the time of backward scanning.
Figure 29:
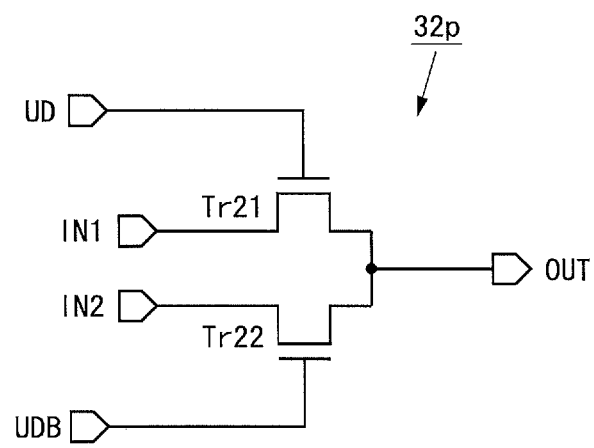
FIG. 29 is a circuit diagram of a first example of a scan switching circuit of the shift register according to the eighth embodiment.
Figure 30:
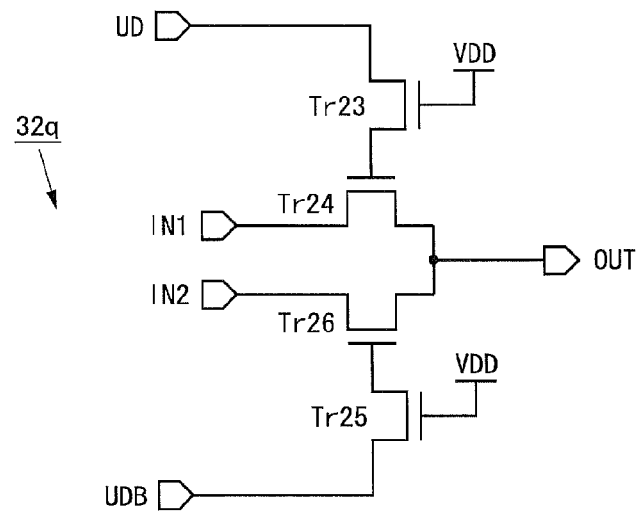
FIG. 30 is a circuit diagram of a second example of the scan switching circuit of the shift register according to the eighth embodiment.
Figure 31:
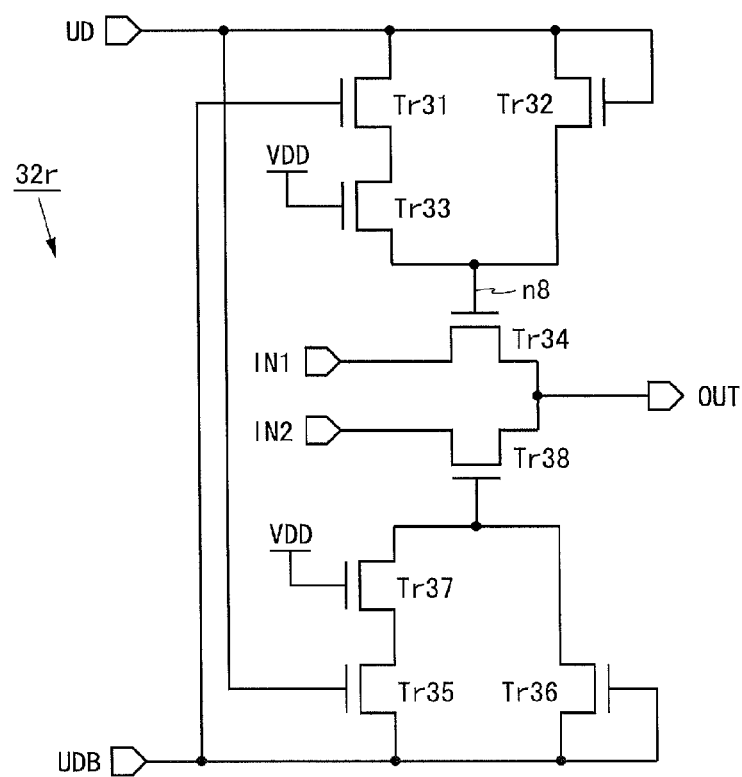
FIG. 31 is a circuit diagram of a third example of the scan switching circuit of the shift register according to the eighth embodiment.

FIGS. 29 to 31 are circuit diagrams showing examples of the scan switching circuit 32. In a scan switching circuit 32p shown in FIG. 29, at the time of forward scanning, the transistor Tr21 is turned on and the transistor Tr22 is turned off. At this time, the scan switching circuit 32p provides, to the node n7, the output signal OUT of the unit circuit 31 in the previous stage which is provided to the input terminal IN1. At the time of backward scanning, the transistor Tr21 is turned off and the transistor Tr22 is turned on. At this time, the scan switching circuit 32p provides, to the node n7, the output signal OUT of the unit circuit 31 in the next stage which is provided to the input terminal IN2. By selecting the input signal by using the scan switching circuit 32p, it is possible to switch the scanning direction as shown in FIGS. 6 and 28.

In the scan switching circuit 32p, the high-level potential outputted from the output terminal Os is (VDD−Vth), and hence the operation margin is small. In order to make the operation margin large, a scan switching circuit 32q shown in FIG. 30 or a scan switching circuit 32r shown in FIG. 31 may be used in place of the scan switching circuit 32p.

In the scan switching circuit 32r, a node to which agate terminal of a transistor Tr34 is connected is referred to as n8. In the scan switching circuit 32r, at the time of forward scanning, a potential of the node n8 becomes (VDD−Vth) and the node n8 enters the floating state, by the action of a transistor Tr32. When the input signal IN1 changes from the low level to the high level, the potential of the node n8 rises by being pushed up by a capacitance between agate and a channel of the transistor Tr34. Therefore, it is possible to output, from the output terminal Os, the high-level potential VDD without a threshold drop. At this time, a transistor Tr33 prevents application of a high voltage to a transistor Tr31. At the time of backward scanning, the transistors Tr31, Tr33 are turned on, and hence the potential of the node n8 shifts to the low level similarly to the control signal UD, and the transistor Tr34 is turned off. By using the scan switching circuit 32r, the scanning direction can be switched while the operation margin is increased.

In the case of using the scan switching circuit 32q, at the time of forward scanning, (VDD−Vth) and VSS are respectively provided to gate terminals of transistors Tr24, Tr26. At the time of backward scanning, VSS and (VDD−Vth) are respectively provided to the gate terminals of the transistors Tr24, Tr26. Hence a similar effect to that of the scan switching circuit 32r can also be obtained in the scan switching circuit 32q.

According to the shift register of the present embodiment, concerning the shift register that switches the scanning direction, it is possible to perform initialization without applying a high voltage between the source and the drain of the transistor Tra at the time of operation. Further, by using the scan switching circuits 32q, 32r shown in FIGS. 30, 31, it is possible to provide the high-level potential VDD without a threshold drop to the gate terminal of the transistor where the input signals IN1, IN2 pass, so as to increase the operation margin.

Ninth Embodiment

Figure 32:
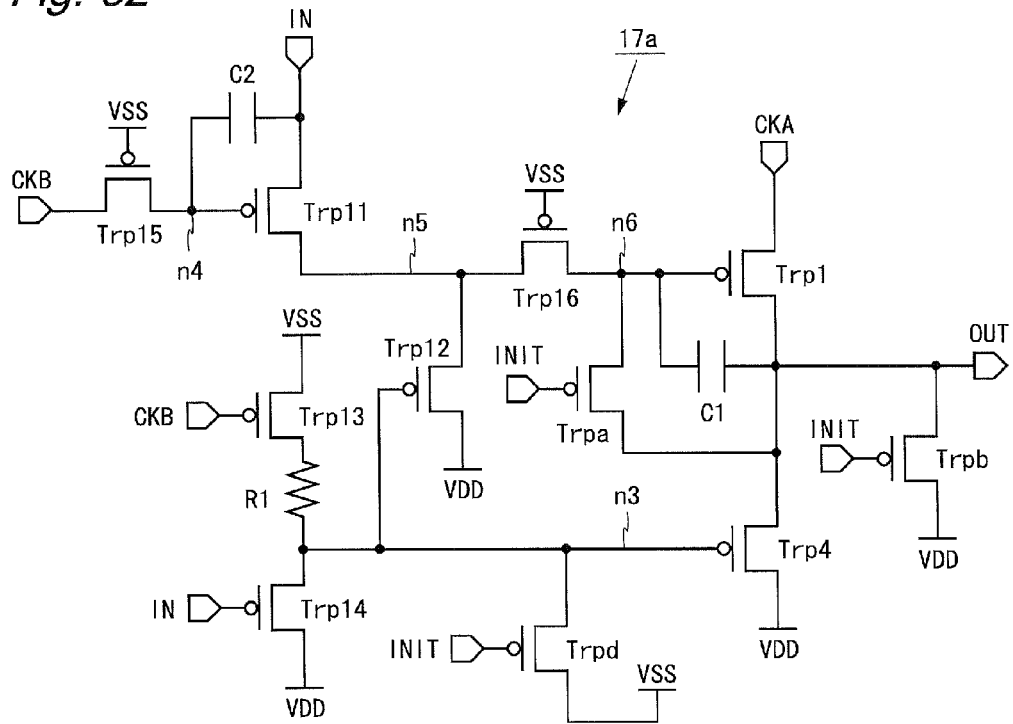
FIG. 32 is a circuit diagram of a unit circuit of a shift register according to a ninth embodiment.
Figure 33:
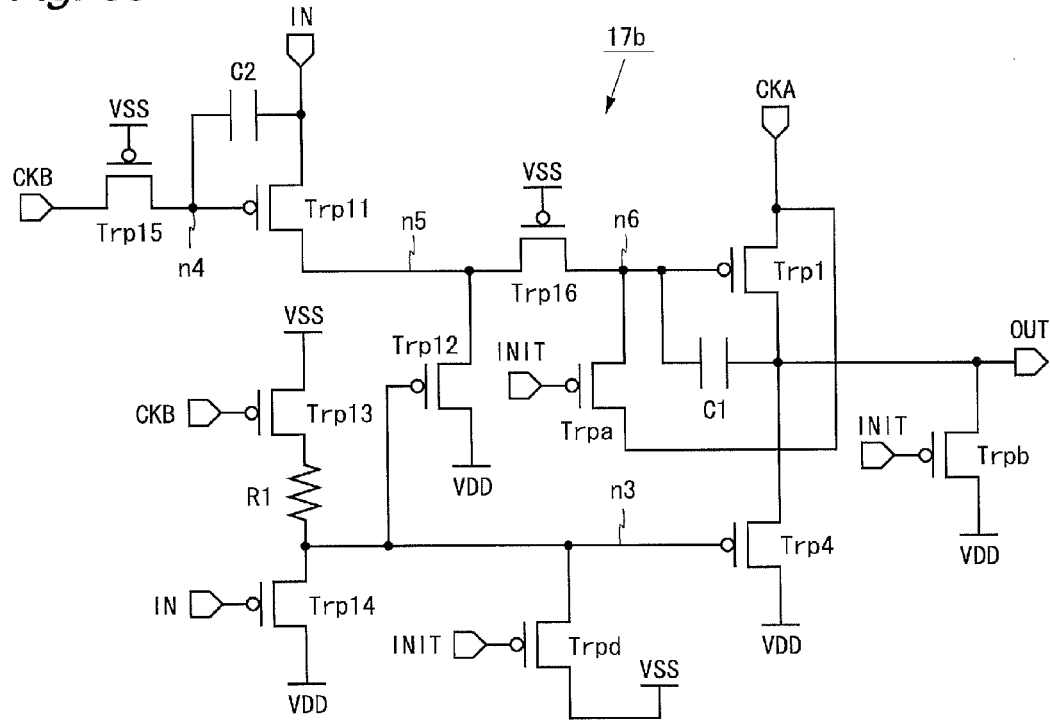
FIG. 33 is a circuit diagram of another unit circuit of the shift register according to the ninth embodiment.

A shift register according to a ninth embodiment of the present invention has the configuration shown in FIG. 3. However, the shift register according to the present embodiment includes a unit circuit 17a shown in FIG. 32 or a unit circuit 17b shown in FIG. 33 in place of the unit circuit 11. The unit circuit 17a is formed by configuring the unit circuit 16a (FIG. 22) by using P-channel transistors. The unit circuit 17a includes eleven P-channel transistors Trp1, Trp4, Trp11 to Trp16, Trpa, Trpb, Trpd, the capacitors C1, C2, and a resistor R1. The unit circuit 17b is formed by changing, in the unit circuit 17a, the connection destination of the drain terminal of the transistor Trpa to the clock terminal CKA.

Figure 34:
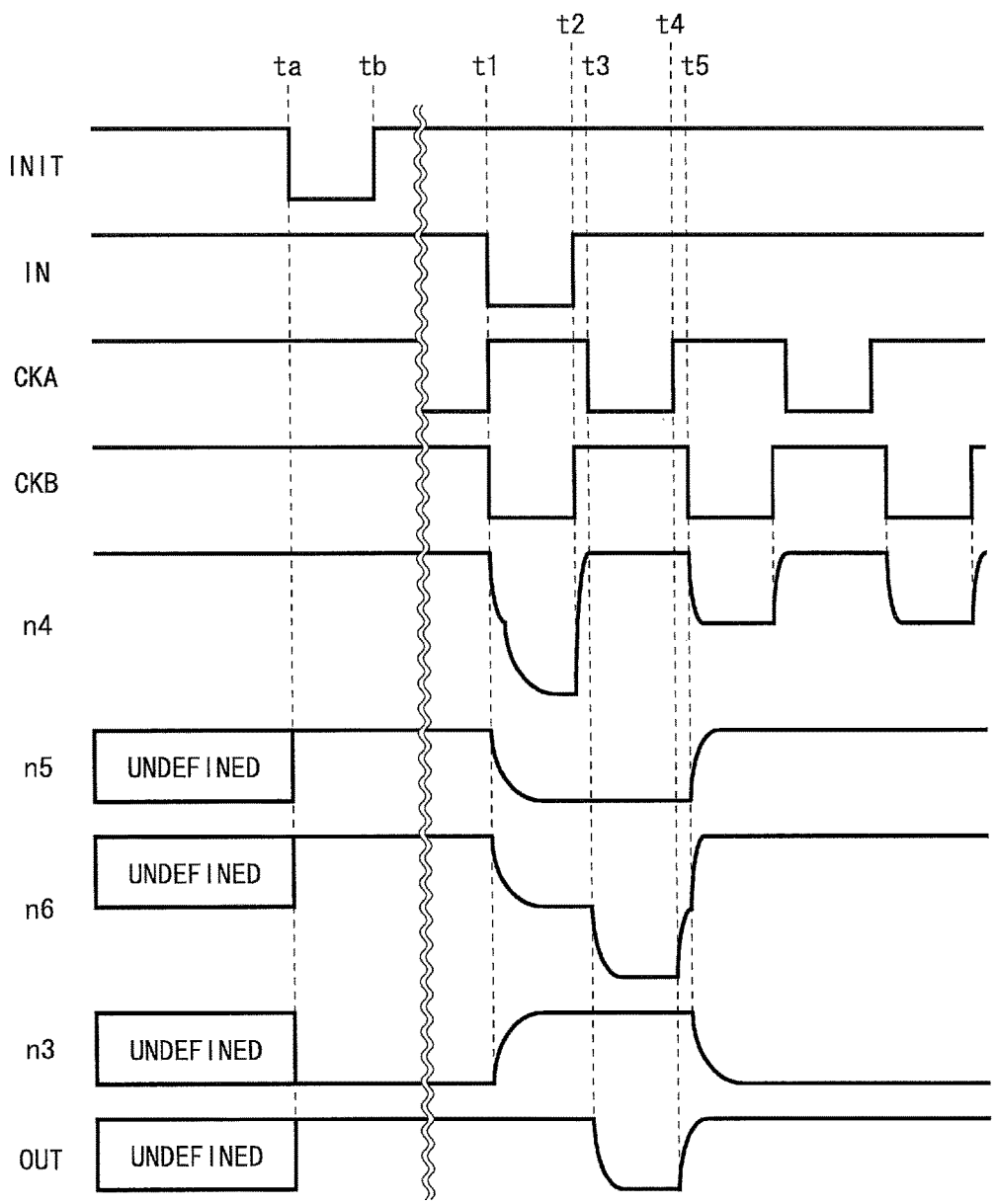
FIG. 34 is a signal waveform diagram of the shift register according to the ninth embodiment.

Generally, in order to configure, by using P-channel transistors, a circuit configured by using N-channel transistors, the N-channel transistors may be replaced with the P-channel transistors, a polarity of a power source may be switched (the high-level potential VDD and the low-level potential VSS may be exchanged), and the polarity of the input signal may be inverted (the high level and the low level may be exchanged). FIG. 34 is a signal waveform diagram of the shift register according to the present embodiment. The signal waveform diagram shown in FIG. 34 is obtained by inverting polarities of the signals and the potentials of the nodes with regard to the signal waveform diagram shown in FIG. 24.

According to the shift register of the present embodiment, concerning the shift register configured by using the P-channel transistors, it is possible to perform initialization without applying a high voltage between the source and the drain of the transistor Trpa at the time of operation. Although the case of forming the unit circuits 16a, 16b according to the seventh embodiment by using the P-channel transistors is described as an example herein, similar methods may also be applied to the unit circuits according to the first to sixth and eighth embodiments and unit circuits according to tenth to sixteenth embodiments to be described later.

Tenth Embodiment

Figure 35:
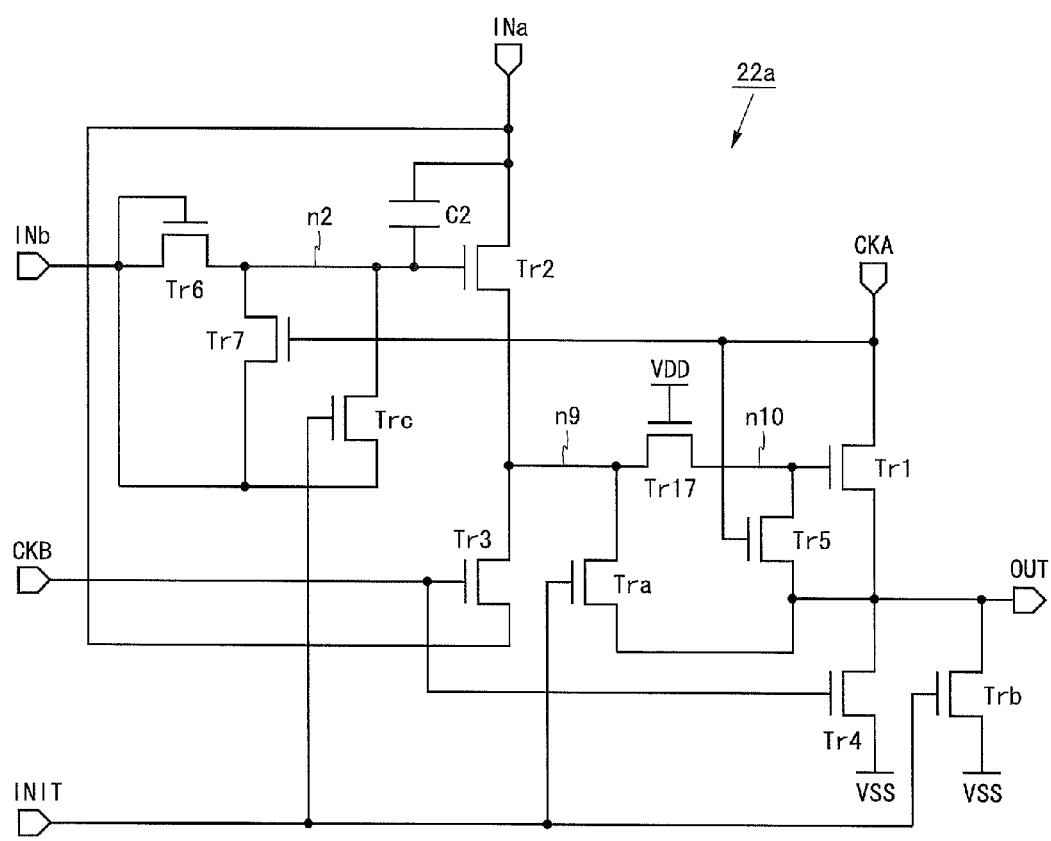
FIG. 35 is a circuit diagram of a unit circuit of a shift register according to a tenth embodiment.
Figure 36:
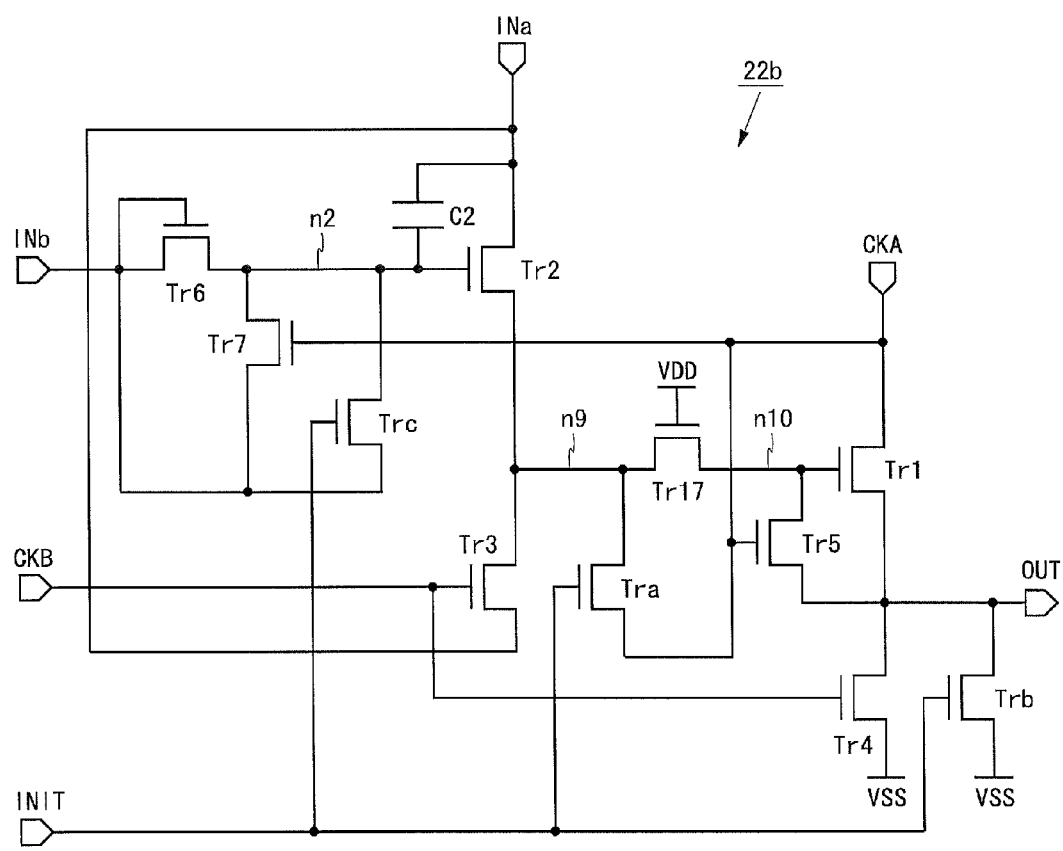
FIG. 36 is a circuit diagram of another unit circuit of the shift register according to the tenth embodiment.

A shift register according to a tenth embodiment of the present invention has the configuration shown in FIG. 14. However, the shift register according to the present embodiment includes a unit circuit 22a shown in FIG. 35 or a unit circuit 22b shown in FIG. 36 in place of the unit circuit 21. The unit circuit 22a is formed by deleting the capacitor C1 from the unit circuit 21a (FIG. 15), adding an N-channel transistor Tr17, and changing the connection destination of the drain terminal of the transistor Tra. Drain terminals of the transistors Tr17, Tra are connected to a source terminal of the transistor Tr2, a source terminal of the transistor Tr17 is connected to a gate terminal of the transistor Tr1, and a gate terminal of the transistor Tr17 is applied with the high-level potential VDD. The transistor Tr17 functions as a breakdown voltage transistor. The unit circuit 22b is formed by changing, in the unit circuit 22a, the connection destination of the source terminal of the transistor Tra to the clock terminal CKA. Hereinafter, a node to which the drain terminal of the transistor Tr17 is connected will be referred to as n9, and a node to which the source terminal of the transistor Tr17 is connected will be referred to as n10.

Figure 37:
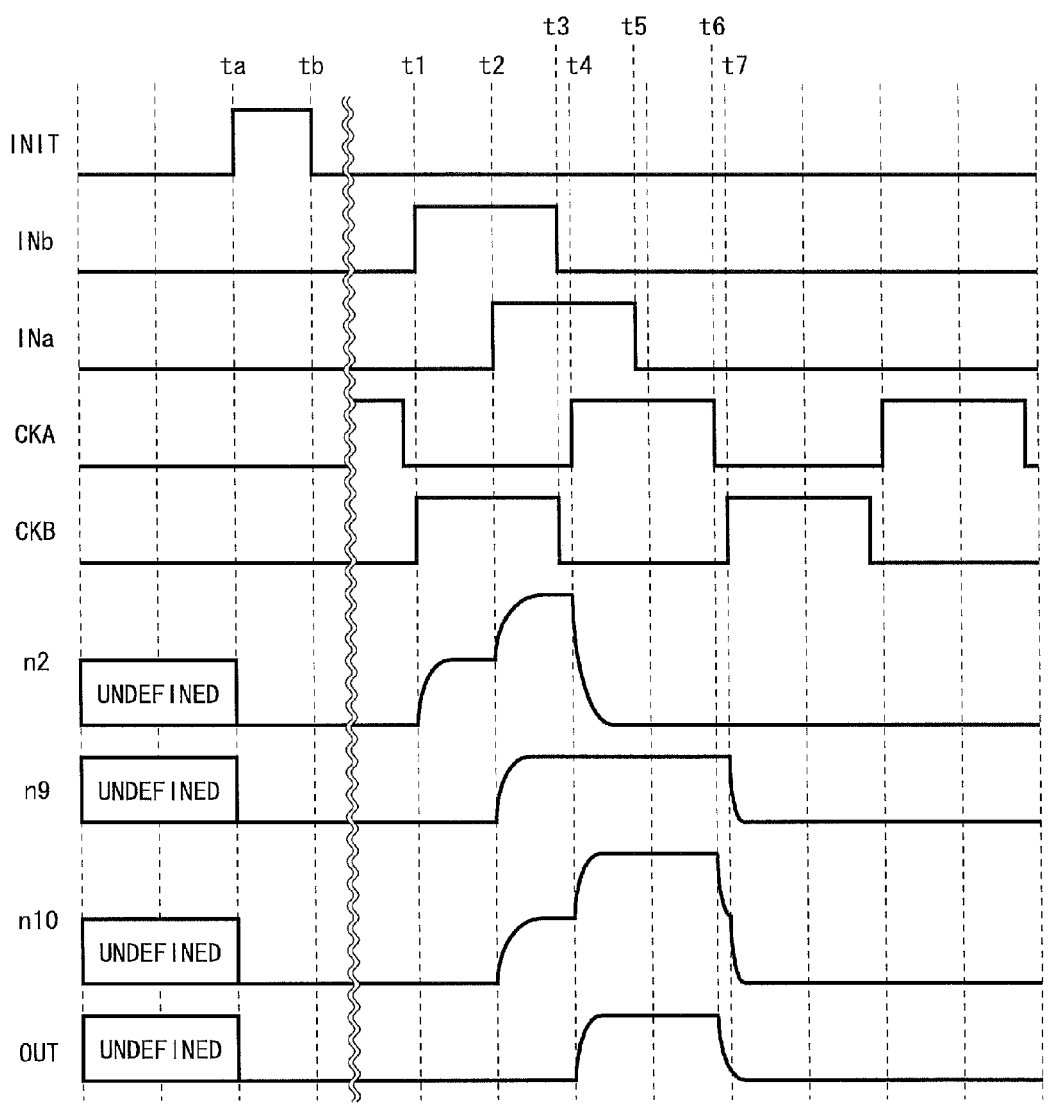
FIG. 37 is a signal waveform diagram of the shift register according to the tenth embodiment.

FIG. 37 is a signal waveform diagram of the shift register according to the present embodiment. The signal waveform diagram shown in FIG. 37 is obtained by deleting the change in the potential of the node n1 from the signal waveform diagram shown in FIG. 18 and adding changes in potentials of the node n9, n10. Similarly to the unit circuit 16a (FIG. 22) including the transistor Tr16, in the unit circuits 22a, 22b including the transistor Tr17, a voltage lower than the driving voltage of the transistor is provided between the terminals of the transistors Tr2, Tr3, Tra even in a push-up period of the node n10. Thus, according to the shift register of the present embodiment, it is possible to prevent degradation and breakdown of the transistor.

Further, in the unit circuits 22a, 22b, the node n2 enters the floating state in part of the period during which the input signal INa is at the high level, by the action of the transistor Tr6. For this reason, the potential of the node n2 becomes higher than the high-level potential VDD, and an output impedance of the transistor Tr2 becomes low, whereby it is possible to charge the node n10 at a high speed. Accordingly, even when an operation frequency is high, the potential of the node n10 can reach (VDD−Vth) within predetermined time. Thus, according to the shift register of the present embodiment, as compared to the case of taking measures for breakdown voltage on a shift register not including the transistor Tr6, it is possible to increase the operation margin while preventing degradation and breakdown of the transistor.

As thus described, the unit circuit 22a includes: the output transistor Tr1 having a first conduction terminal connected to the clock terminal CKA, and a second conduction terminal connected to the output terminal OUT; the breakdown voltage transistor Tr17 having a first conduction terminal connected to a first node (node n9), a second conduction terminal connected to the control terminal of the output transistor Tr1, and a control terminal fixedly applied with the on-potential (high-level potential); the output control unit (transistors Tr2, Tr3, Tr6, Tr7, Trc) that applies the on-potential and the off-potential (low-level potential) in a switching manner to the first node; the initialization transistor Tra having a first conduction terminal connected to the control terminal of the output transistor Tr1, a second conduction terminal connected to the output terminal OUT, and a control terminal provided with the initialization signal INIT; and the output initialization transistor Trb having a first conduction terminal connected to the output terminal OUT, a second conduction terminal fixedly applied with the off-potential, and a control terminal provided with the initialization signal INIT. In the unit circuit 22b, the second conduction terminal of the initialization transistor Tra is connected to the clock terminal CKA. Thus, according to the shift register of the present embodiment, similarly to the first embodiment, it is possible to perform initialization without applying a high voltage between the conduction terminals of the initialization transistor Tra at the time of operation.

Further, the output control unit of each of the unit circuits 22a, 22b includes the set transistor Tr2 having a first conduction terminal provided with the input signal INa with respect to the unit circuit, and a second conduction terminal connected to the first node, the set control unit (transistors Tr6, Tr7) that applies the on-potential and the off-potential in a switching manner to the control terminal of the set transistor Tr2, and the second initialization transistor Trc having a first conduction terminal connected to the control terminal of the set transistor Tr2, a second conduction terminal connected to the second input terminal INb, and a control terminal provided with the initialization signal INIT. The second input signal INb becomes the on-potential at the same level as the first node in at least part of a period during which the on-potential is applied to the first node.

By controlling the input signal INb to the off-level at the time of initialization, it is possible to control the set transistor Tr2 into the off-state and electrically disconnect the input signal INa and the first node, so as to reliably control the output transistor Tr1 into the off-state. Further, by controlling the potential of the second conduction terminal of the second initialization transistor Trc to the on-potential at the same level as the first node in at least part of the period during which the on-potential is applied to the first node, it is possible to shorten the time during which a high voltage is applied between the conduction terminals of the second initialization transistor Trc.

Moreover, at the time of outputting the clock signal having the on-potential, the potential of the first node remains unchanged from the on-potential applied by the output control unit, by the action of the breakdown voltage transistor Tr17. Hence it is possible to prevent application of a high voltage between the terminals of the transistors Tr2, Tr3, Tra connected to the first node.

Eleventh Embodiment

Figure 38:
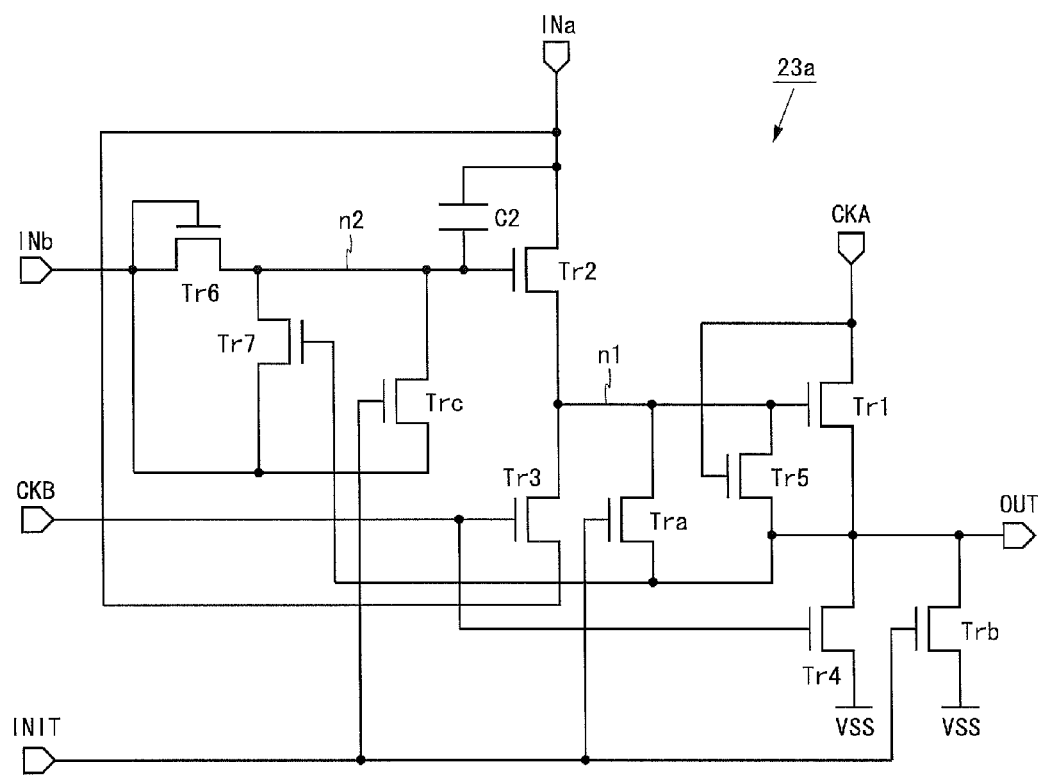
FIG. 38 is a circuit diagram of a unit circuit of a shift register according to an eleventh embodiment.
Figure 39:
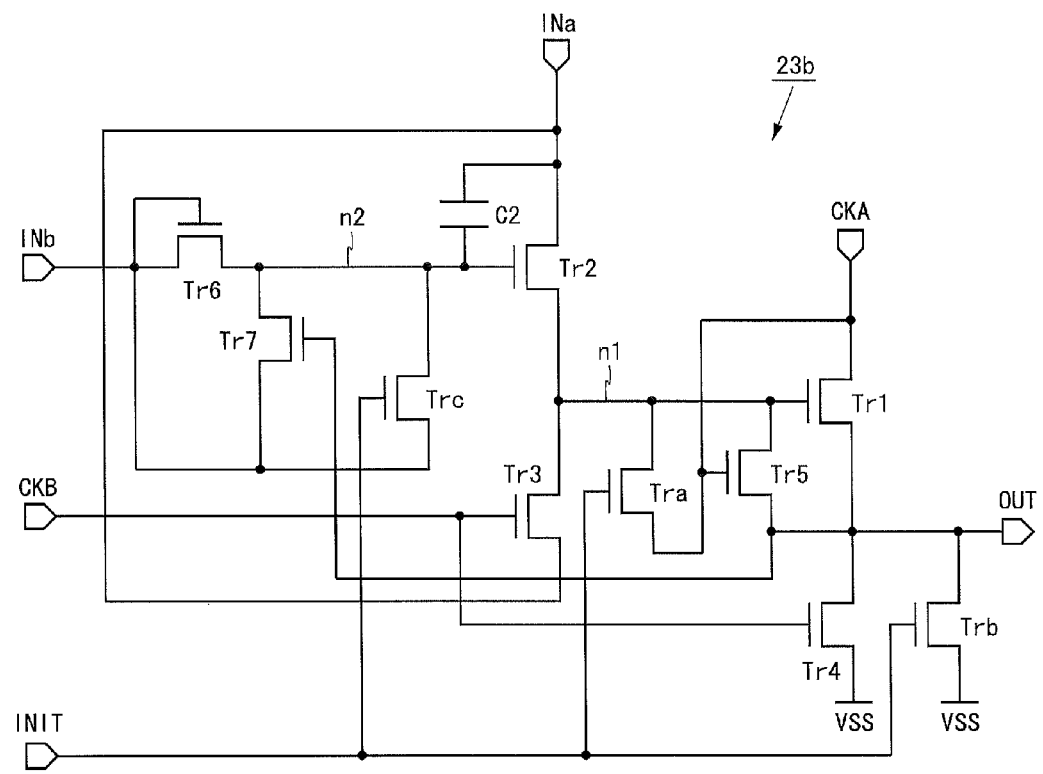
FIG. 39 is a circuit diagram of another unit circuit of the shift register according to the eleventh embodiment.

A shift register according to an eleventh embodiment of the present invention has the configuration shown in FIG. 14. However, the shift register according to the present embodiment includes a unit circuit 23a shown in FIG. 38 or a unit circuit 23b shown in FIG. 39 in place of the unit circuit 21. The unit circuit 23a is formed by deleting the capacitor C1 from the unit circuit 21a (FIG. 15), and changing the connection destination of the gate terminal of the transistor Tr7 to the output terminal OUT. The unit circuit 23b is formed by changing, in the unit circuit 23a, the connection destination of the source terminal of the transistor Tra to the clock terminal CKA.

The signal waveform diagram of the shift register according to the present embodiment is the same as the signal waveform diagram shown in FIG. 18. Before the time t4, the unit circuits 23a, 23b operate similarly to the unit circuit 21a. When the clock signal CKA changes from the low level to the high level at the time t4, the high-level potential of the clock signal CKA is outputted as the output signal OUT from the time t4 on. Further, when the output signal OUT shifts to the high level, the transistor Tr7 is turned on. At this time, with the input signal INb being at the low level, the potential of the node n2 drops to the low level (discharge of the node n2). Hence the transistor Tr2 is turned off.

In the unit circuit 21a, the gate terminal of the transistor Tr7 is connected to the clock terminal CKA. In contrast, in the unit circuits 23a, 23b, the gate terminal of the transistor Tr7 is connected to the output terminal OUT. The frequency of changes in the output signal OUT is smaller than the frequency of changes in the clock signal CKA. Thus, according to the shift register of the present embodiment, it is possible to reduce charge and discharge of a parasitic capacitance accompanying the gate terminal of the transistor Tr7, so as to reduce power consumption.

Twelfth Embodiment

Figure 40:
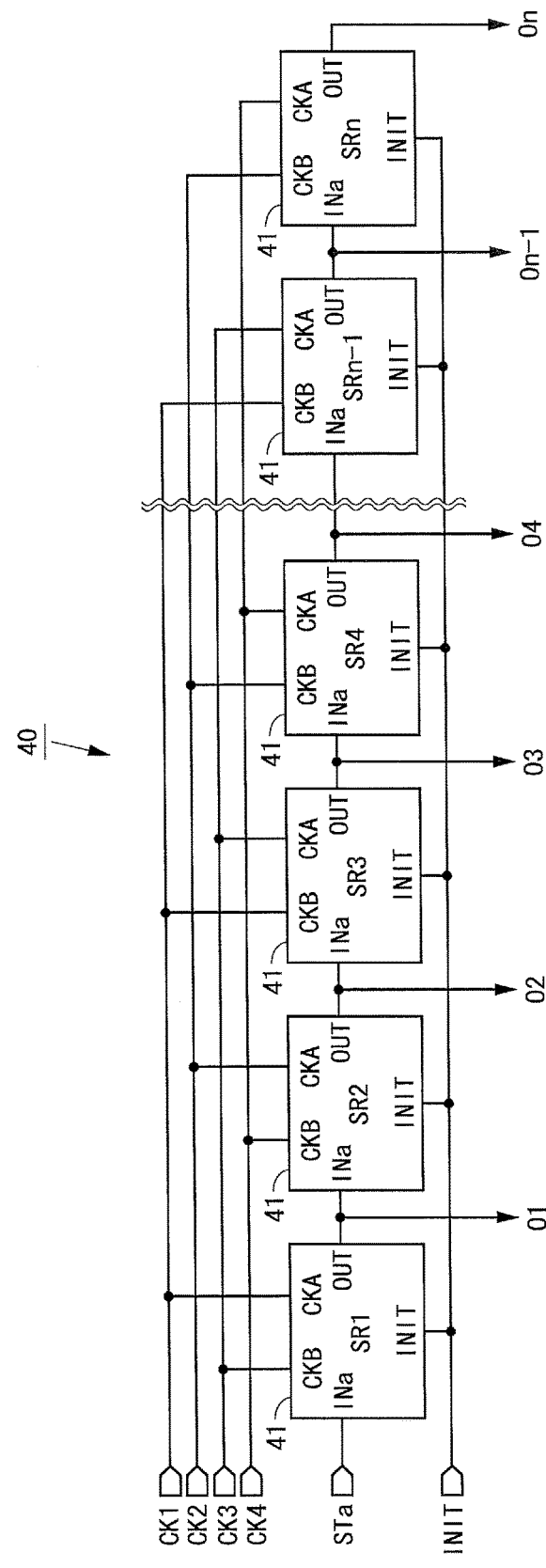
FIG. 40 is a block diagram showing a configuration of a shift register according to a twelfth embodiment.

FIG. 40 is a block diagram showing a configuration of a shift register according to a twelfth embodiment of the present invention. A shift register 40 shown in FIG. 40 is configured by connecting n unit circuits 41 in multiple stages. The unit circuit 41 has the clock terminals CKA, CKB, the input terminal INa, the initialization terminal INIT, and the output terminal OUT. From the outside, the shift register 40 is supplied with the start pulse STa, the four-phase clock signals CK1 to CK4, and the initialization signal INIT. The clock signals CK1 to CK4 and the initialization signal INIT are provided to each terminal similarly to the shift register 20 (FIG. 14) according to the fifth embodiment. The start pulse STa is provided to the input terminal INa of the unit circuit 41 in the first stage. The output signal OUT of the unit circuit 41 is outputted to the outside as each of the output signals O1 to On, and provided to the input terminal INa of the unit circuit 41 in the next stage.

Figure 41:
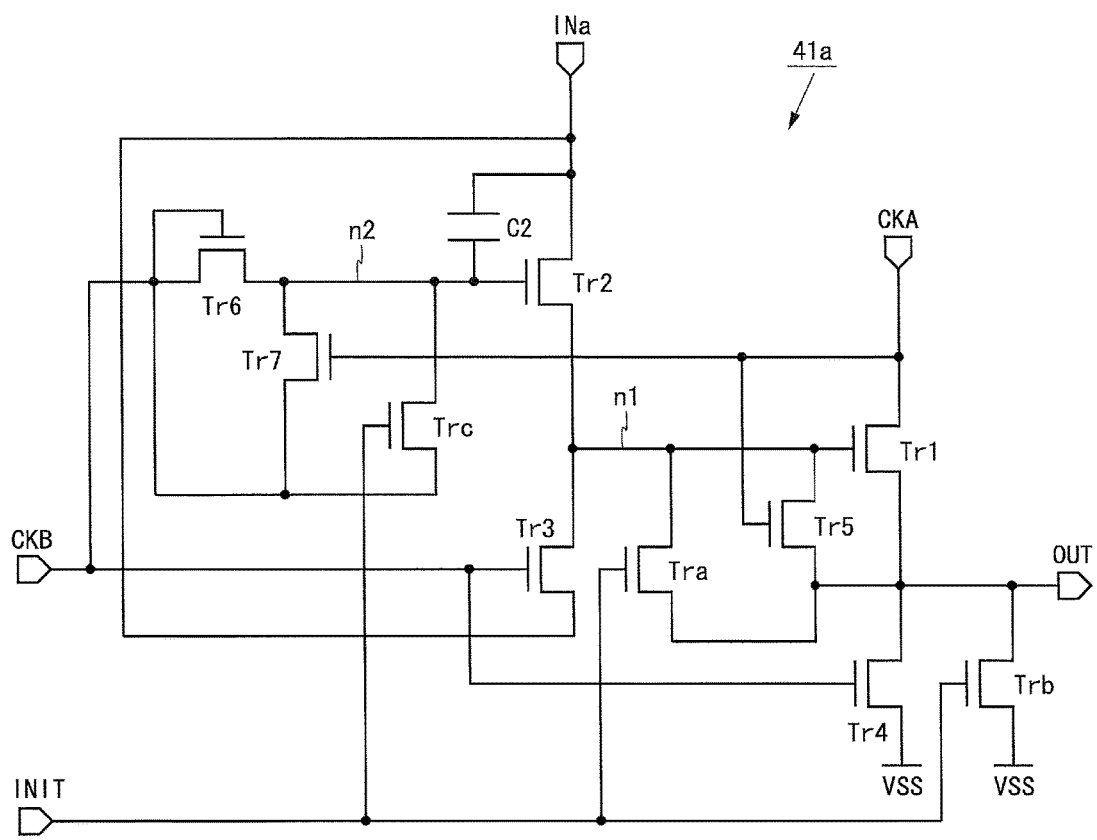
FIG. 41 is a circuit diagram of a unit circuit of the shift register according to the twelfth embodiment.
Figure 42:
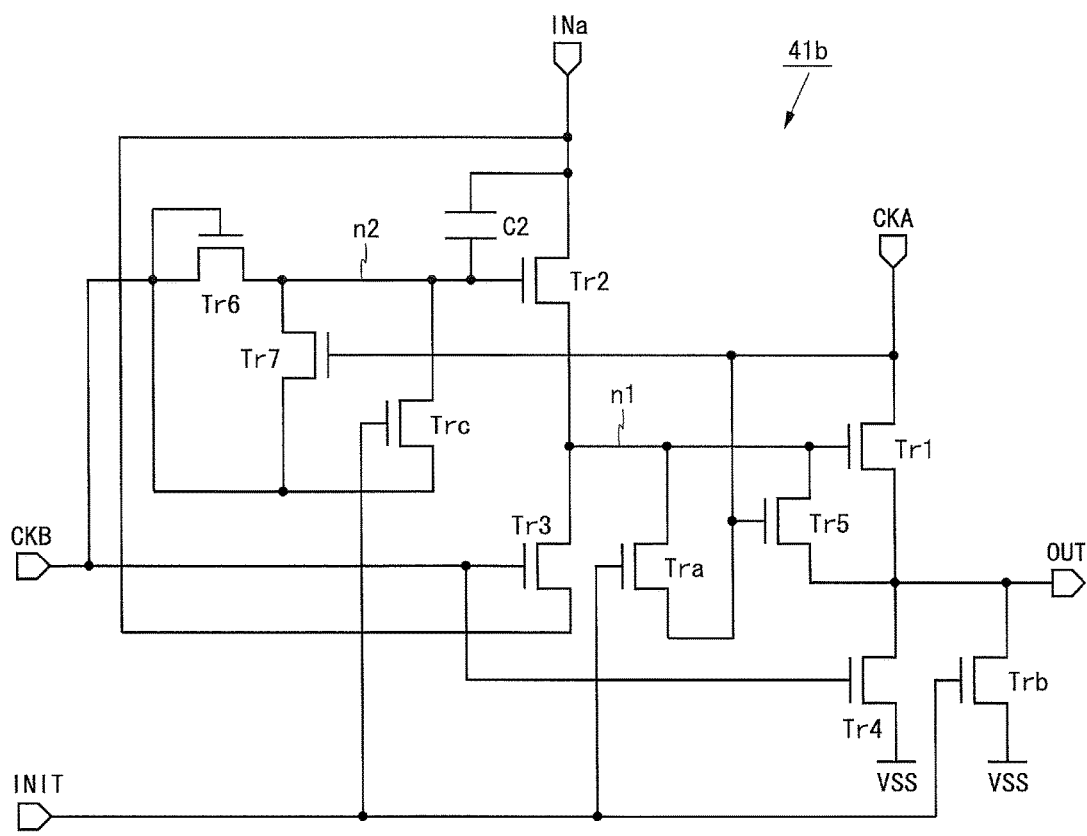
FIG. 42 is a circuit diagram of another unit circuit of the shift register according to the twelfth embodiment.

A unit circuit 41a shown in FIG. 41 or a unit circuit 41b shown in FIG. 42 is used for the unit circuit 41. The unit circuit 41a is formed by deleting the capacitor C1 from the unit circuit 21a (FIG. 15), and changing the connection destinations of the gate terminal and the drain terminal of the transistor Tr6 and the source terminals of the transistor Tr7, Trc to the clock terminal CKB. The unit circuit 41b is formed by changing, in the unit circuit 41a, the connection destination of the source terminal of the transistor Tra to the clock terminal CKA.

Figure 43:
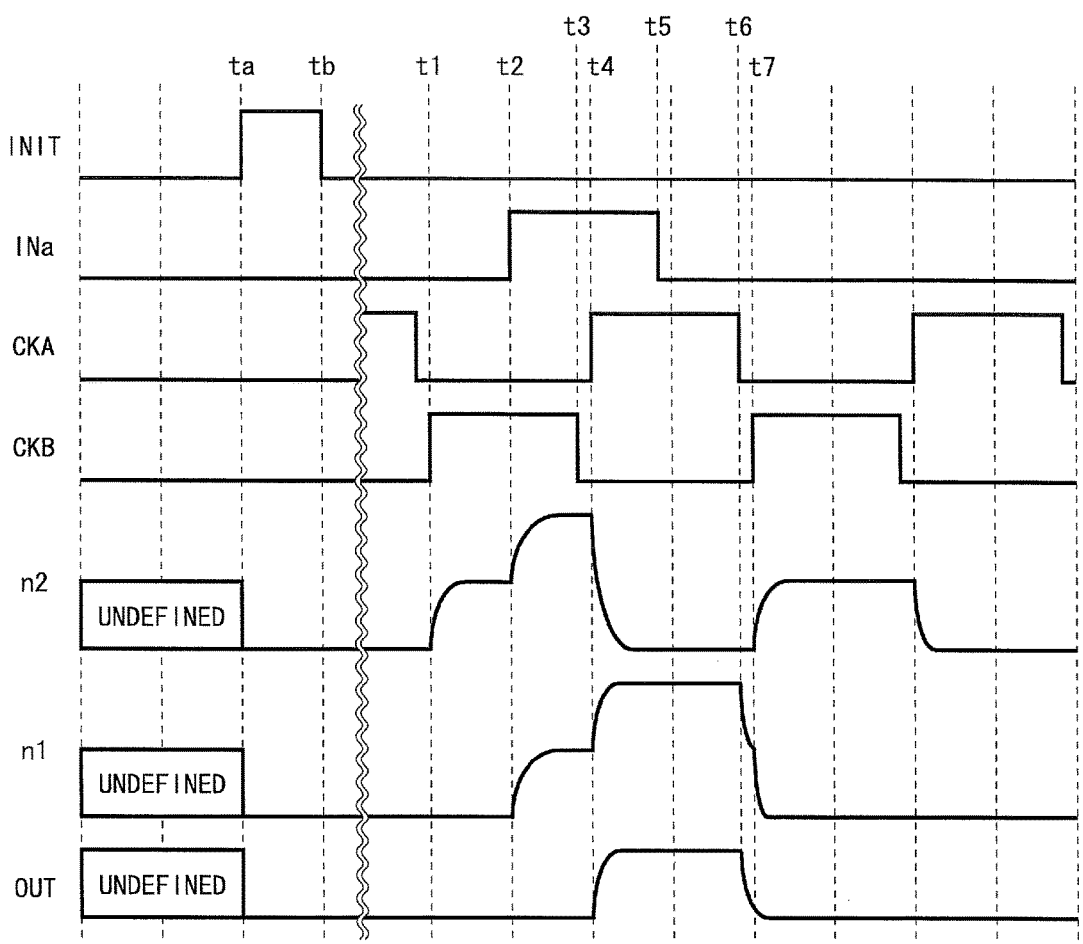
FIG. 43 is a signal waveform diagram of the shift register according to the twelfth embodiment.

FIG. 43 is a signal waveform diagram of the shift register 60. The signal waveform diagram shown in FIG. 43 is the same as the signal waveform diagram shown in FIG. 18 except that the change in the potential of the input signal INb is deleted and that the potential of the node n2 cyclically shifts to a predetermined level (VDD−Vth) from the time t7 on. Before the time t1, potentials of the nodes n1, n2 and the output signal OUT are at the low level. When the clock signal CKB changes to the high level at the time t1, the transistor Tr6 is turned on, a current passing through the transistor Tr6 flows from the clock terminal CKB toward the node n2, and the potential of the node n2 rises (charge of the node n2). After a lapse of certain time from the time t1, the transistors Tr2, Tr3 both enter the on-state.

When the input signal INa changes to the high level at the time t2, the node n1 is charged and the node n2 is pushed up. When the clock signal CKB changes to the low level at the time t3, the transistor Tr3 is turned off. Even after the transistor Tr3 is turned off, the potentials of the nodes n1, n2 remain unchanged, and the transistor Tr1 is held in the on-state. In time t3 to t7, the unit circuits 41a, 41b operate similarly to the unit circuit 21a.

When the clock signal CKB changes to the high level at the time t7, the transistor Tr3 is turned on, and the discharge of the node n1 is performed. Further, at the time t7, the transistor Tr6 is turned on. Therefore, a current passing through the transistor Tr6 flows from the clock terminal CKB toward the node n2, and the potential of the node n2 rises. From the time t7 on, the potential of the node n2 changes to (VDD−Vth) when the clock signal CKB changes to the high level, and the potential of the node n2 changes to the low level when the clock signal CKA changes to the high level.

The shift register 40 is not required to be supplied with the start pulse STb, and the unit circuits 41a, 41b are not required to be provided with the output signals OUT of the unit circuits 41a, 41b in the second stage before the present stage. Thus, according to the shift register 40 of the present embodiment, it is possible to reduce wiring between the unit circuits, so as to reduce a layout area of the circuits.

Thirteenth Embodiment

Figure 44:
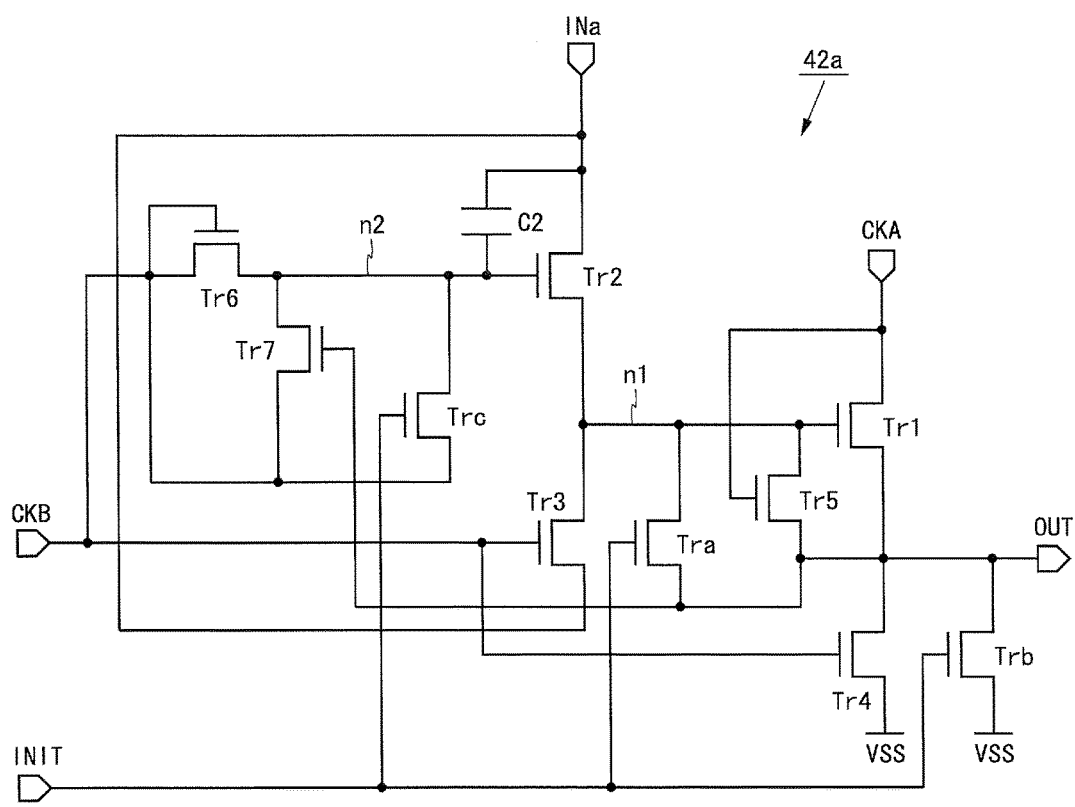
FIG. 44 is a circuit diagram of a unit circuit of a shift register according to a thirteenth embodiment.
Figure 45:
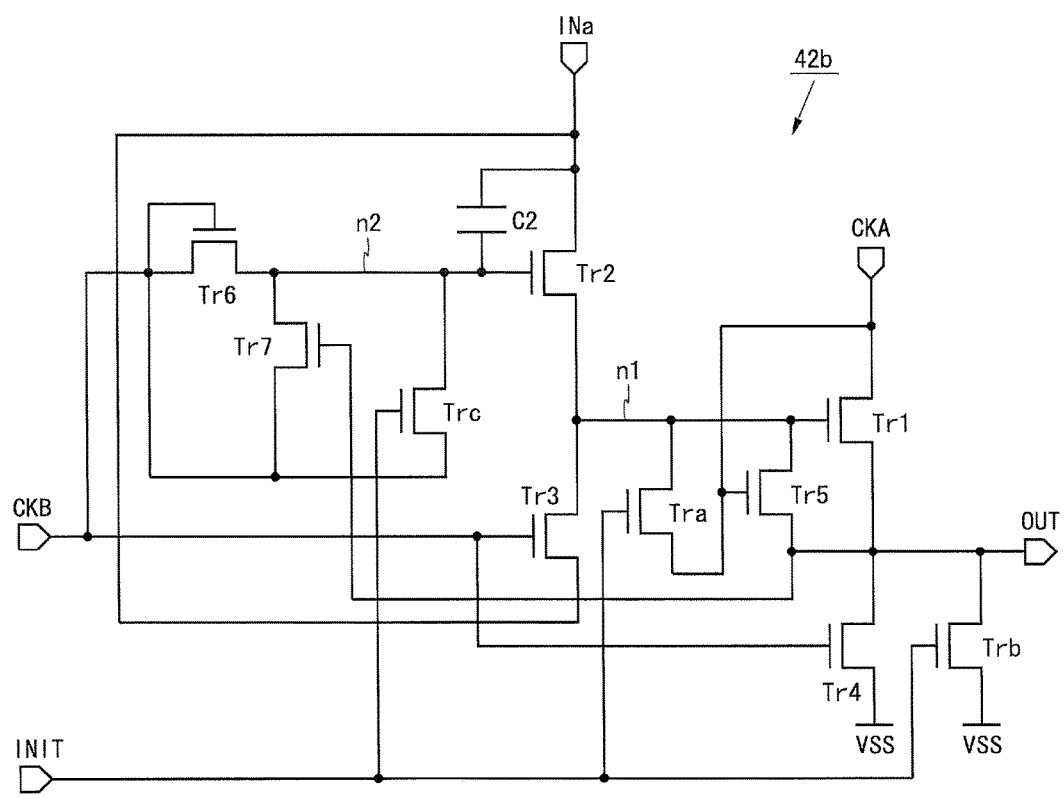
FIG. 45 is a circuit diagram of another unit circuit of the shift register according to the thirteenth embodiment.

A shift register according to a thirteenth embodiment of the present invention has the configuration shown in FIG. 40. However, the shift register according to the present embodiment includes a unit circuit 42a shown in FIG. 44 or a unit circuit 42b shown in FIG. 45 in place of the unit circuit 41. The unit circuit 42a is formed by changing, in the unit circuit 41a (FIG. 41), the connection destination of the gate terminal of the transistor Tr7 to the output terminal OUT. The unit circuit 42b is formed by changing, in the unit circuit 42a, the connection destination of the source terminal of the transistor Tra to the clock terminal CKA.

Figure 46:
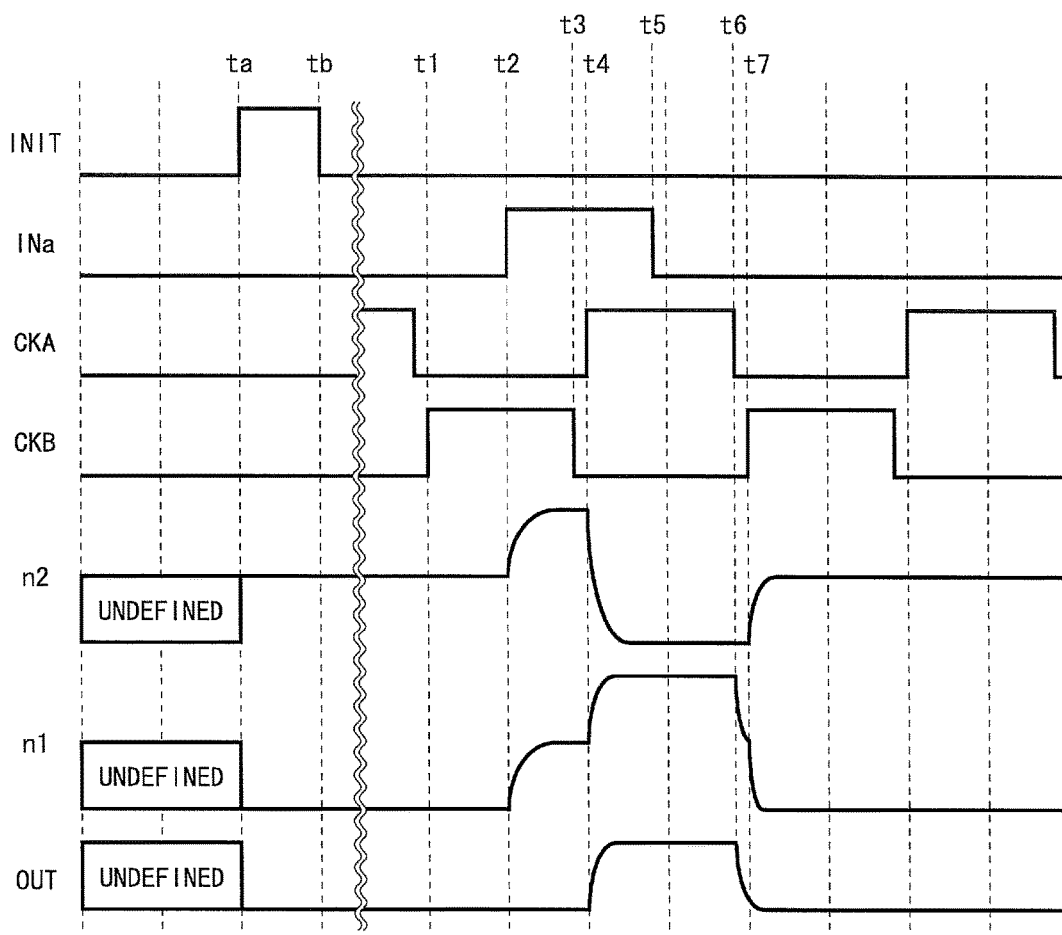
FIG. 46 is a signal waveform diagram of the shift register according to the thirteenth embodiment.

FIG. 46 is a signal waveform diagram of the shift register according to the present embodiment. The signal waveform diagram shown in FIG. 46 is the same as the signal waveform diagram shown in FIG. 18 except for the change in the potential of the node n2. Before the time t2, the potential of the node n1 and the output signal OUT are at the low level, the potential of the node n2 is (VDD−Vth), the node n2 is in the floating state, and the transistor Tr2 is in the on-state.

When the input signal INa changes to the high level at the time t2, the node n1 is charged and the node n2 is pushed up. When the clock signal CKB changes to the low level at the time t3, the transistor Tr3 is turned off. Even after the transistor Tr3 is turned off, the potentials of the nodes n1, n2 remain unchanged, and the transistors Tr1, Tr2 are held in the on-state. When the clock signal CKA changes from the low level to the high level at the time t4, the node n1 is pushed up, and the high-level potential VDD without a threshold drop is outputted as the output signal OUT. Further, when the output signal OUT shifts to the high level, the transistor Tr7 is turned on. At this time, with the clock signal CKB being at the low level, the potential of the node n2 drops to the low level (discharge of the node n2). Hence the transistor Tr2 is turned off.

At the time t5, the input signal INa changes to the low level. At this time, with the transistors Tr2, Tr3 being in the off-state, the potentials of the nodes n1, n2 remain unchanged. When the clock signal CKA changes to the low level at the time t6, the output signal OUT changes to the low level, and the transistor Tr7 is turned off. Further, since the push-up of the node n1 is completed, the potential of the node n1 drops to the high-level potential VDD. When the clock signal CKB changes to the high level at the time t7, the discharge of the node n1 is performed. Further, at the time t7, the transistor Tr6 is turned on, and hence the potential of the node n2 rises to become (VDD−Vth) (charge of the node n2).

According to the shift register of the present embodiment, similarly to the eleventh embodiment, it is possible to reduce charge and discharge of a parasitic capacitance accompanying the gate terminal of the transistor Tr7, so as to reduce power consumption. Further, the discharge of the node n2 is performed only when the output signal OUT is at the high level. Thus, according to the shift register of the present embodiment, it is possible to reduce charge and discharge of a parasitic capacitance accompanying the node n2, so as to reduce power consumption.

Fourteenth Embodiment

Figure 47:
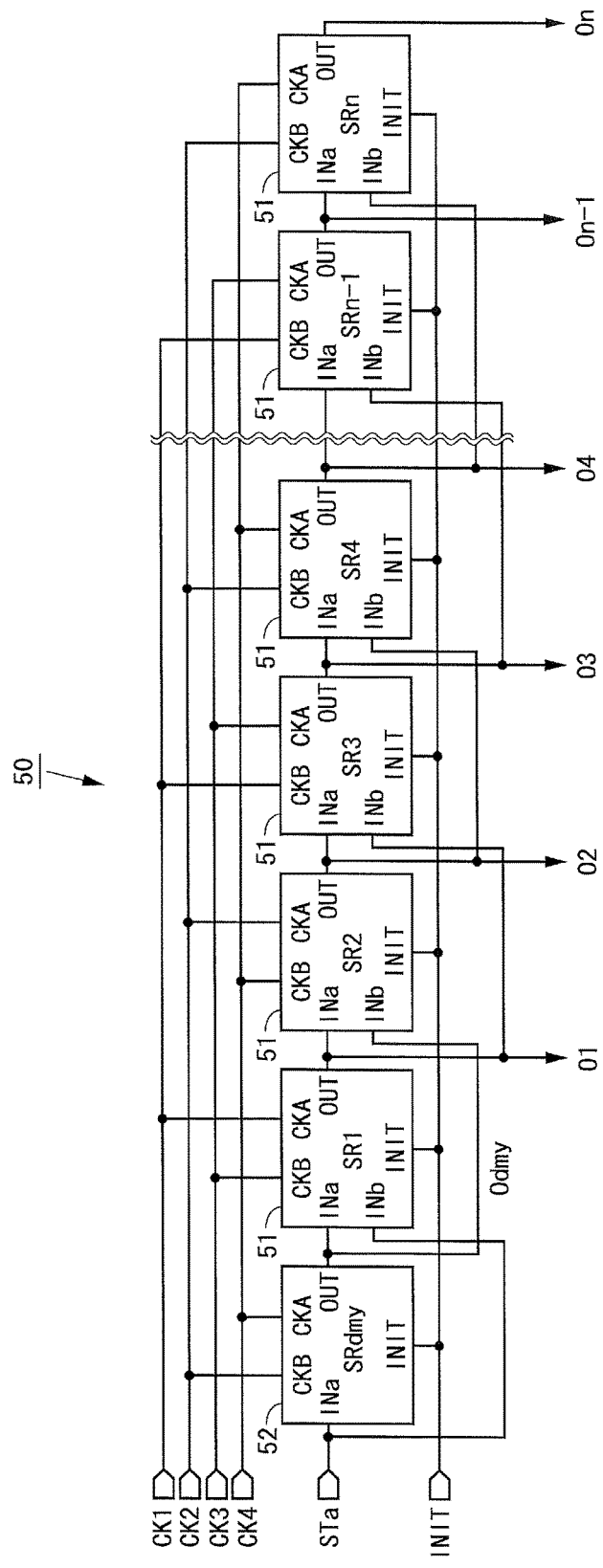
FIG. 47 is a block diagram showing a configuration of a shift register according to a fourteenth embodiment.

FIG. 47 is a block diagram showing a configuration of a shift register according to a fourteenth embodiment of the present invention. A shift register 50 shown in FIG. 47 is configured by connecting n unit circuits 51 in multiple stages and connecting a dummy unit circuit 52 to the previous stage thereof. The unit circuit 51 has the clock terminals CKA, CKB, the input terminals INa, INb, the initialization terminal INIT, and the output terminal OUT. The dummy unit circuit 52 has the clock terminals CKA, CKB, the input terminal INa, the initialization terminal INIT, and the output terminal OUT. For example, the unit circuit 22a (FIG. 35) is used for the unit circuit 51, and the unit circuit 41a (FIG. 41) is used for the dummy unit circuit 52.

From the outside, the shift register 50 is supplied with the start pulse STa, the four-phase clock signals CK1 to CK4, and the initialization signal INIT. The clock signals CK1 to CK4 are provided to each terminal similarly to the shift register 20 (FIG. 14) according to the fifth embodiment. In addition to this, the clock signal CK2 is provided to the clock terminal CKB of the dummy unit circuit 52, and the clock signal CK4 is provided to the clock terminal CKA of the dummy unit circuit 52. The start pulse STa is provided to the input terminal INa of the dummy unit circuit 52 and the input terminal INb of the unit circuit 51 in the first stage. The initialization signal INIT is provided to the initialization terminals INIT of the n unit circuits 51 and the dummy unit circuit 52. The output signal OUT of the dummy unit circuit 52 is not outputted to the outside, and is provided to the input terminal INa of the unit circuit 51 in the first stage and the input terminal INb of the unit circuit 51 in the second stage. The output signal OUT of the unit circuit 51 is outputted to the outside as each of the output signals O1 to On, and provided to the input terminal INa of the unit circuit 51 in the next stage and the input terminal INb of the unit circuit 51 in the second stage after the present stage.

Figure 48:
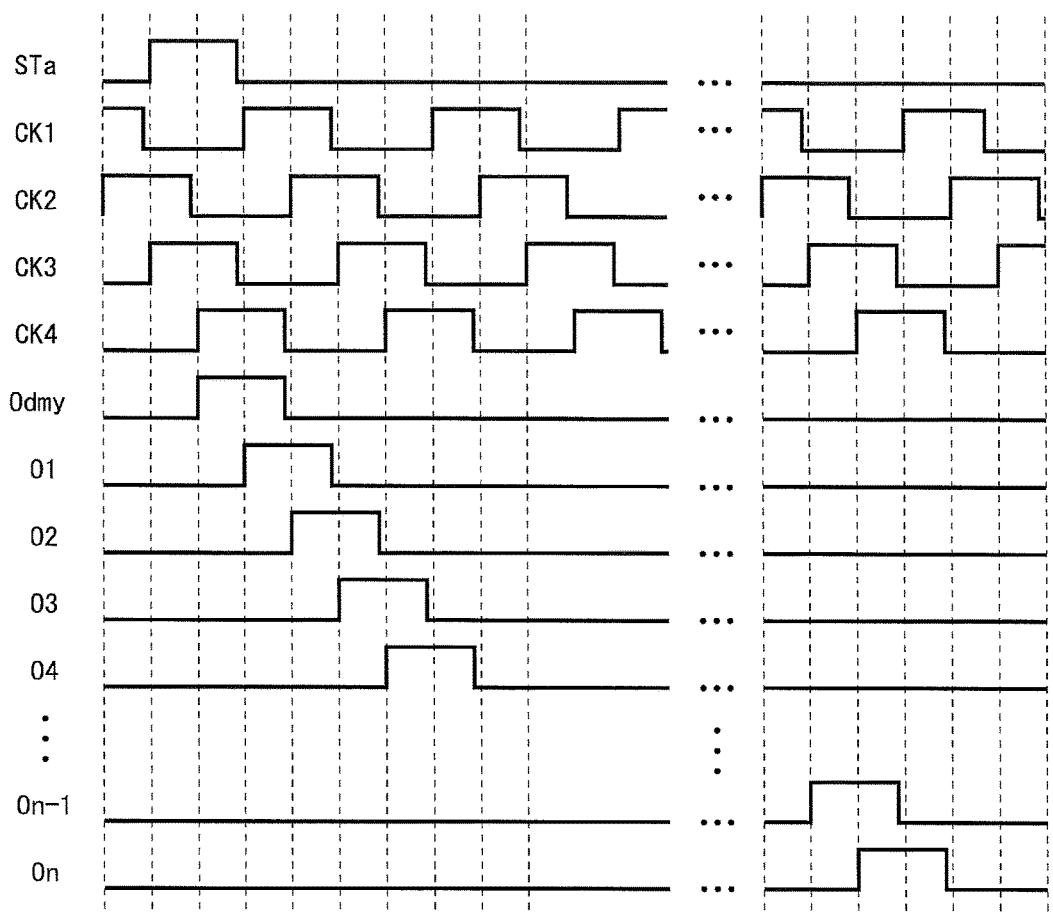
FIG. 48 is a timing chart of the shift register according to the fourteenth embodiment.

FIG. 48 is a timing chart of the shift register 50. As shown in FIG. 48, the start pulse STa and the clock signals CK1 to CK4 change at the same timing as in the fifth embodiment (cf. FIG. 17). The output signal OUT of the dummy unit circuit 52 (hereinafter referred to as dummy output signal Odmy) is a signal obtained by delaying the start pulse STa by a quarter cycle of the clock signal CK1. The start pulse STa and the dummy output signal Odmy respectively serve as the start pulses STb, STa in the shift register 20 according to the fifth embodiment.

As thus described, the shift register 50 is provided with the dummy unit circuit 52 that outputs the signal obtained by delaying the start pulse STa by a quarter cycle of the clock signal CK1. Hence the number of start pulses to be supplied to the shift register 50 may be one. Thus, according to the shift register 50 of the present embodiment, it is possible to reduce the layout area by an area corresponding to the input terminal for supplying the start pulse and wiring for transmitting the start pulse.

Fifteenth Embodiment

Figure 49:
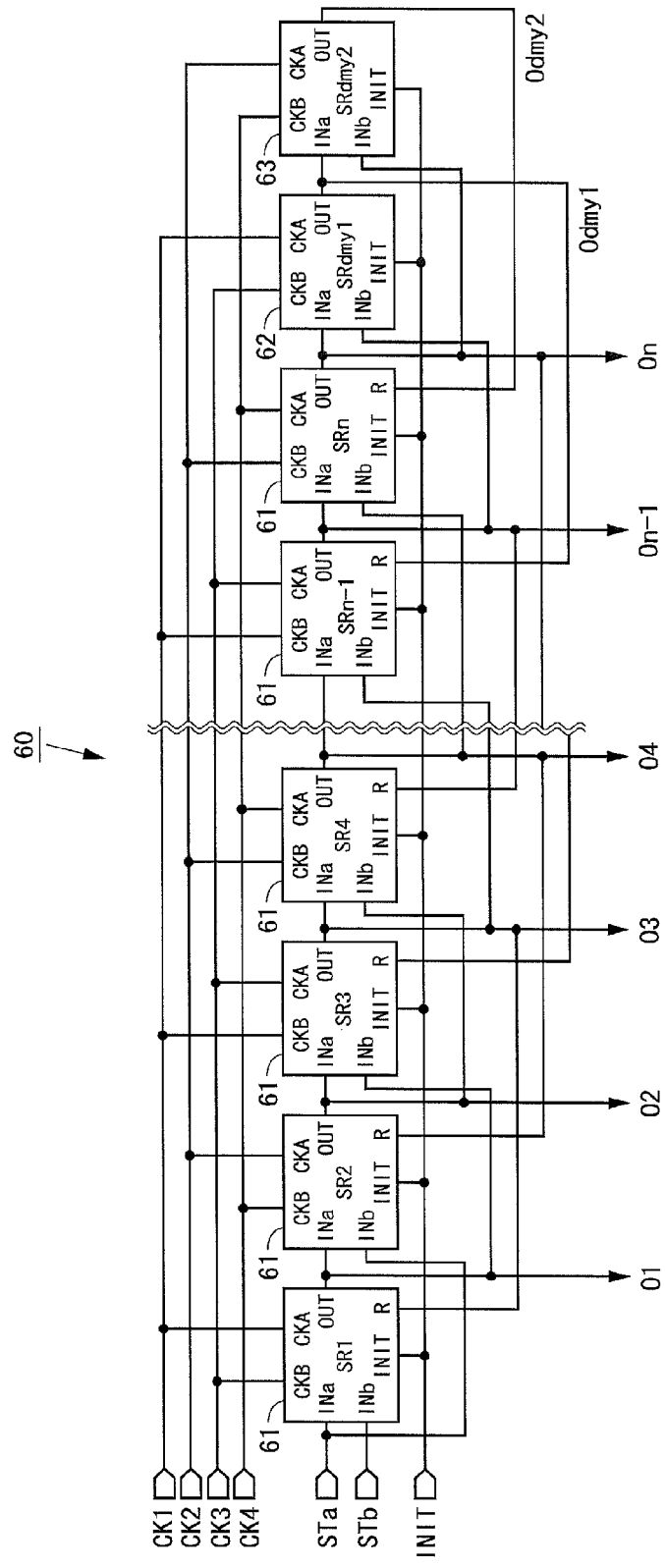
FIG. 49 is a block diagram showing a configuration of a shift register according to a fifteenth embodiment.

FIG. 49 is a block diagram showing a configuration of a shift register according to a fifteenth embodiment of the present invention. A shift register 60 shown in FIG. 49 is configured by connecting n unit circuits 61 and two dummy unit circuits 62, 63 in multiple stages. The unit circuit 61 has the clock terminals CKA, CKB, the input terminals INa, INb, the initialization terminal INIT, a reset terminal R, and the output terminal OUT. The dummy unit circuits 62, 63 each have the clock terminals CKA, CKB, the input terminals INa, INb, the initialization terminal INIT, and the output terminal OUT.

From the outside, the shift register 60 is supplied with the start pulses STa, STb, the four-phase clock signals CK1 to CK4, and the initialization signal INIT. The start pulses STa, STb and the clock signals CK1 to CK4 are provided to each terminal similarly to the shift register 20 (FIG. 14) according to the fifth embodiment. In addition, the clock signals CK1 to CK4 are each provided to the clock terminal CKA of the dummy unit circuit 62, the clock terminal CKA of the dummy unit circuit 63, the clock terminal CKB of the dummy unit circuit 62, and the clock terminal CKB of the dummy unit circuit 63. The initialization signal INIT is provided to the initialization terminals INIT of the n unit circuits 61 and the dummy unit circuits 62, 63. The output signal OUT of the unit circuit 61 is outputted to the outside as each of the output signals O1 to On, and provided to the input terminal INa of the unit circuit 61 in the next stage (or the dummy unit circuit 62), the input terminal INb of the unit circuit 61 in the second stage after the present stage (or the dummy unit circuits 62, 63), and the reset terminal R of the unit circuit 61 in the second stage before the present stage. The output signal OUT of the dummy unit circuit 62 (hereinafter referred to as dummy output signal Odmy1) is provided to the input terminal INa of the dummy unit circuit 63 and the reset terminal R of the unit circuit 61 in the (n−1)th stage. The output signal OUT of the dummy unit circuit 63 (hereinafter referred to as dummy output signal Odmy2) is provided to the reset terminal R of the unit circuit 61 in the n-th stage.

Figure 50:
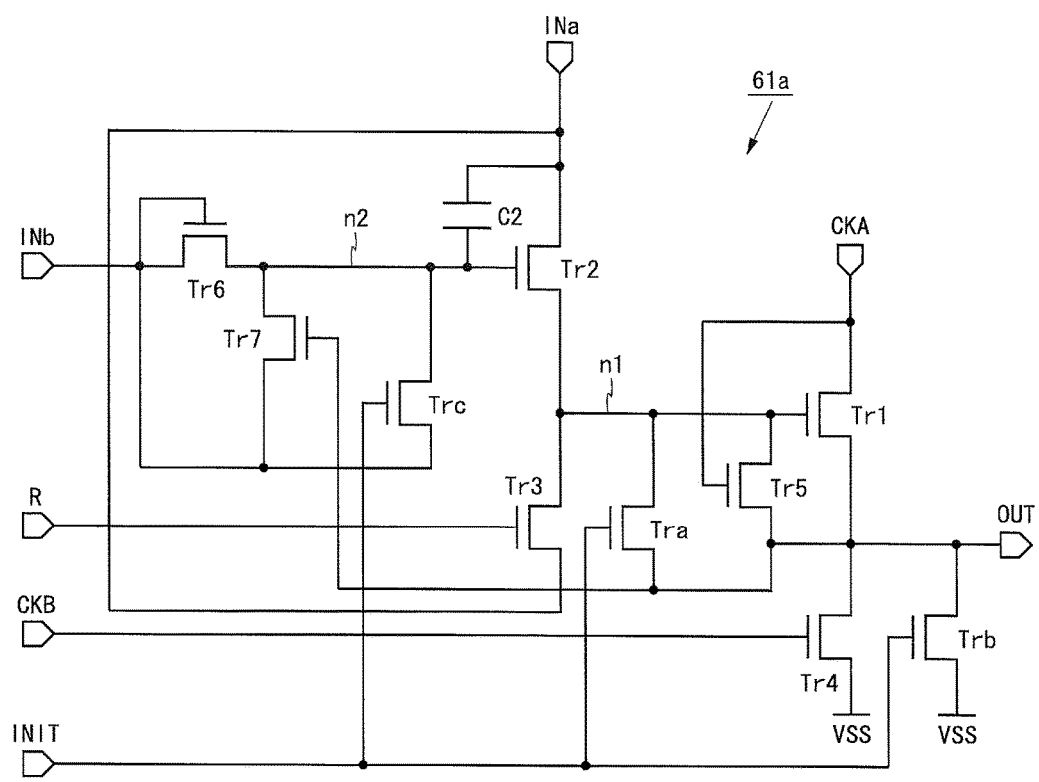
FIG. 50 is a circuit diagram of a unit circuit of the shift register according to the fifteenth embodiment.
Figure 51:
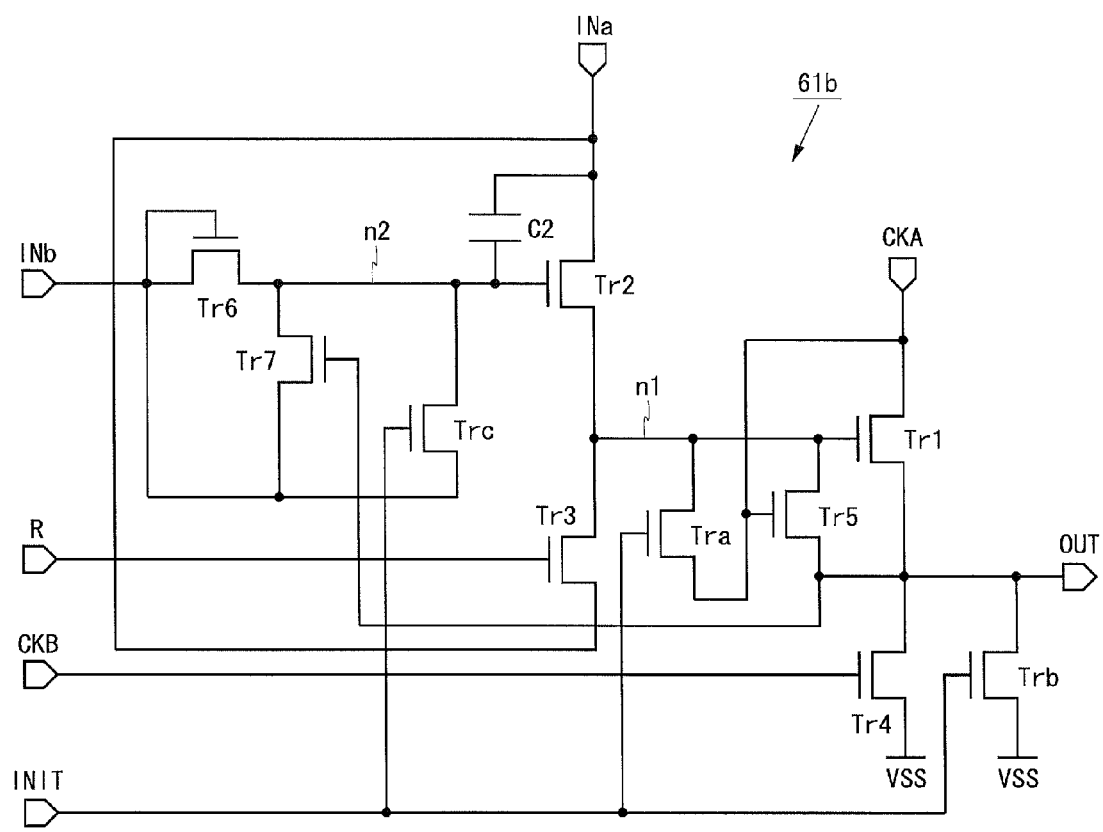
FIG. 51 is a circuit diagram of another unit circuit of the shift register according to the fifteenth embodiment.

A unit circuit 61a shown in FIG. 50 or a unit circuit 61b shown in FIG. 51 is used for the unit circuit 61. The unit circuit 61a is formed by changing, in the unit circuit 42a (FIG. 44), the connection destination of the gate terminal of the transistor Tr3 to the reset terminal R. The unit circuit 61b is formed by changing, in the unit circuit 61a, the connection destination of the source terminal of the transistor Tra to the clock terminal CKA. A unit circuit not having the reset terminal R (e.g., unit circuit 42a) is used for the dummy unit circuit 62.

In the shift register 60, the discharge of the node n1 is performed by using the transistor Tr3 whose gate terminal is provided with the output signal OUT of the unit circuit 61 in the second stage after the present stage. The shift register 60 is provided with the dummy unit circuits 62, 63 in order to provide, to the unit circuits 61 in the (n−1)th stage and the n-th stage, the output signals OUT of the unit circuits 61 in the second stage after the present stage. The dummy output signal Odmy1 is provided to the gate terminal of the transistor Tr3 of the unit circuit 61 in the (n−1)th stage. The dummy output signal Odmy2 is provided to the gate terminal of the transistor Tr3 of the unit circuit 61 in the n-th stage.

Figure 52:
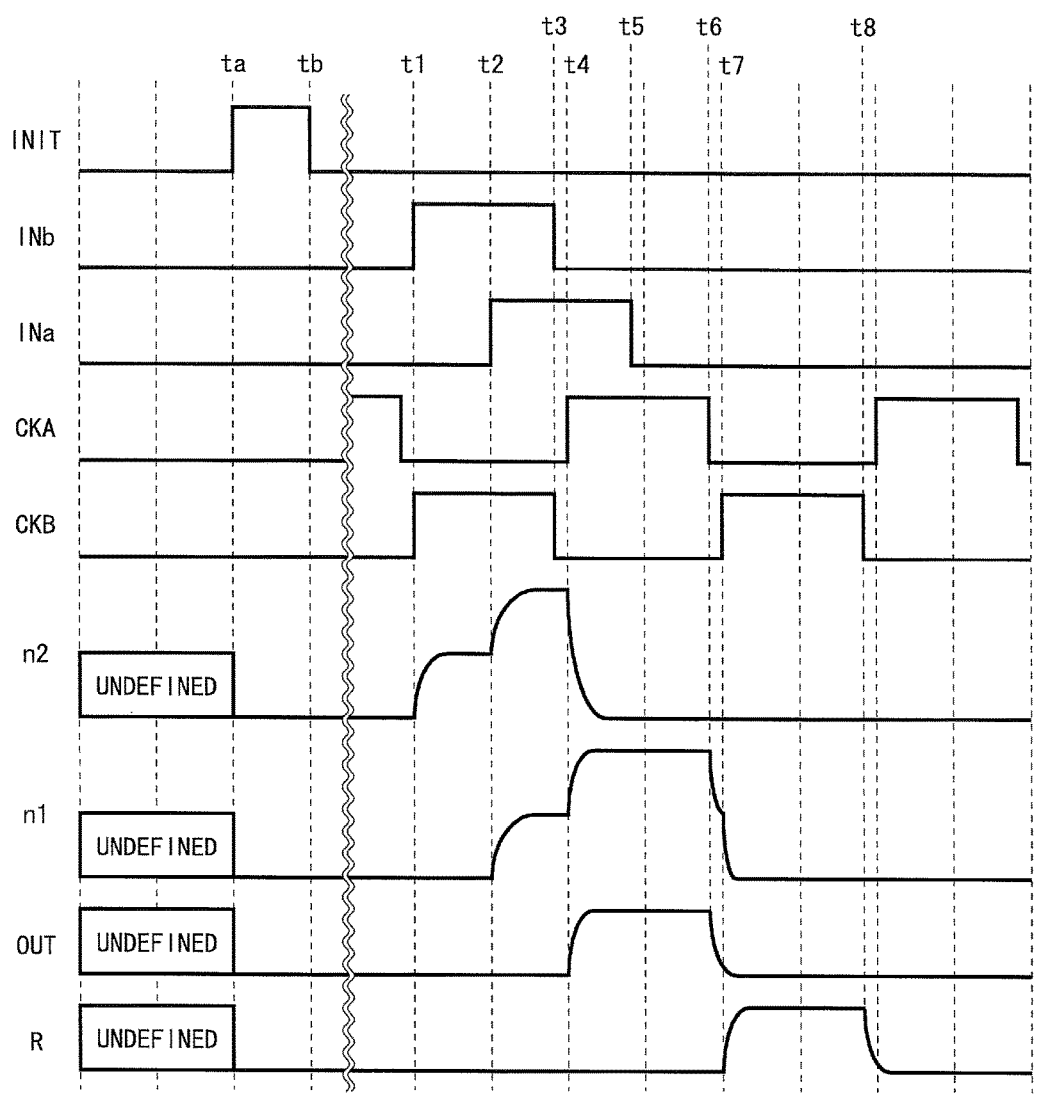
FIG. 52 is a signal waveform diagram of the shift register according to the fifteenth embodiment.

FIG. 52 is a signal waveform diagram of the shift register 60. The signal waveform diagram shown in FIG. 52 is obtained by adding a change in the reset signal R to the signal waveform diagram shown in FIG. 18. The output signal OUT changes to the high level at the time t4, and changes to the low level at the time t6. Being delayed by a half cycle of the clock signal CK1, the reset signal R changes to the high level at the time t7 and changes to the low level at the time t8. When the clock signal CKA changes to the low level at the time t6, the push-up of the node n1 is completed, and the potential of the node n1 drops to the high-level potential VDD. When the reset signal R changes to the high level at the time t7, the transistor Tr3 is turned on, and the potential of the node n1 drops to the low level (discharge of the node n1).

In the unit circuit 42a, when the clock signal CKB is at the high level, the transistor Tr3 is turned on, and the discharge of the node n1 is performed. In contrast, in the unit circuits 61a, 61b, when the reset signal R is at the high level, the transistor Tr3 is turned on, and the discharge of the node n1 is performed. The frequency of changes in the reset signal R is smaller than the frequency of changes in the clock signal CKB. Thus, according to the shift register 60 of the present embodiment, it is possible to reduce charge and discharge of a parasitic capacitance accompanying the gate terminal of the transistor Tr3, so as to reduce power consumption.

Figure 53:
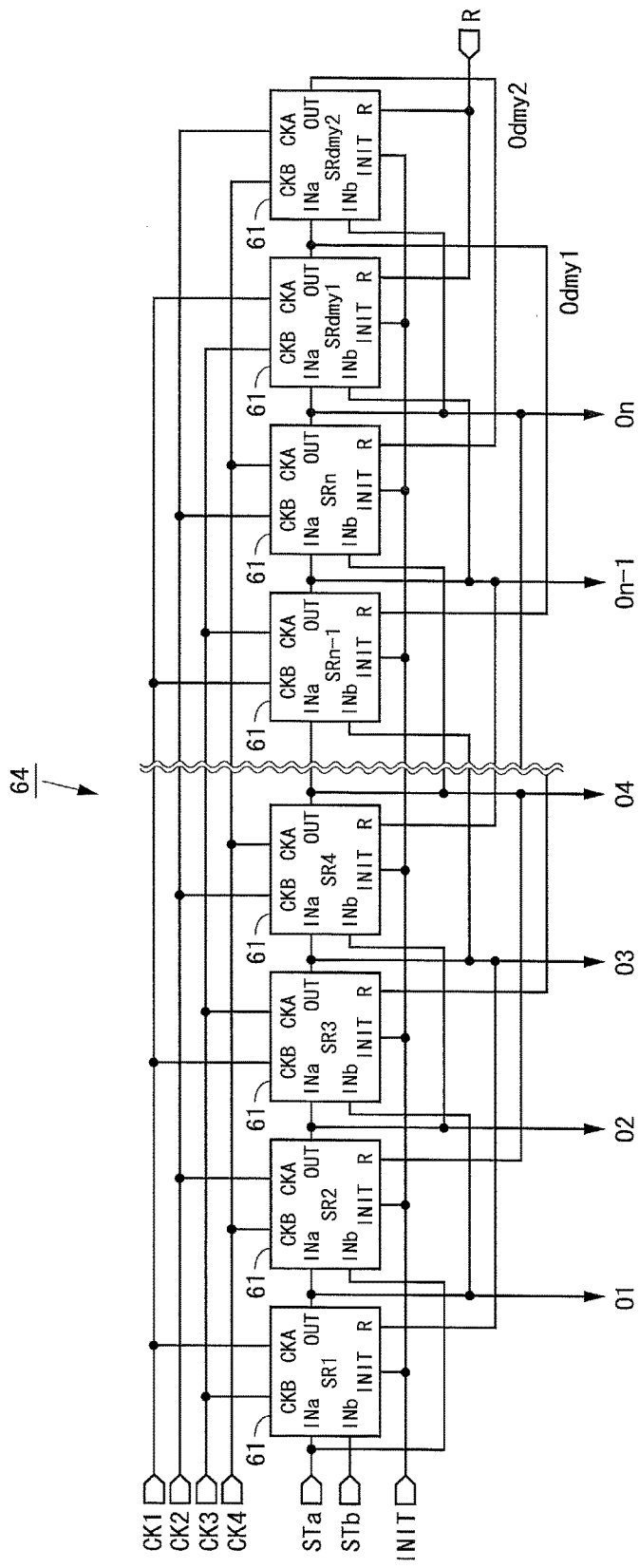
FIG. 53 is a block diagram showing a configuration of a shift register according to a modified example of the fifteenth embodiment.

As for the shift register 60 according to the present embodiment, a modified example shown in FIG. 53 can be formed. A shift register 64 shown in FIG. 53 is configured by connecting (n+2) unit circuits 61 in multiple stages. The unit circuits 61 in the (n+1)th stage and the (n+2)th stage function as dummy unit circuits. From the outside, the shift register 64 is supplied with the start pulses STa, STb, the four-phase clock signals CK1 to CK4, the initialization signal INIT, and the reset signal R. The reset signal R is provided to the reset terminals R of the unit circuits 61 in the (n+1)th stage and the (n+2) th stage Signals other than that are provided to each terminal similarly to the shift register 60.

In the shift register 64, similarly to the shift register 60, the discharge of the node n1 is performed by using the transistor Tr3 whose gate terminal is provided with the output signal OUT of the unit circuit 61 in the second stage after the present stage. The shift register 64 is provided with the unit circuits 61 in the (n+1)th stage and the (n+2)th stage in order to provide, to the unit circuits 61 in the (n−1)th stage and the n-th stage, the output signals OUT of the unit circuits 61 in the second stage after the present stage. The output signal OUT of the unit circuit 61 in the (n+1)th stage (hereinafter referred to as dummy output signal Odmy1) is provided to the gate terminal of the transistor Tr3 of the unit circuit 61 in the (n−1)th stage. The output signal OUT of the unit circuit 61 in the (n+2)th stage (hereinafter referred to as dummy output signal Odmy2) is provided to the gate terminal of the transistor Tr3 of the unit circuit 61 in the n-th stage.

Figure 54:
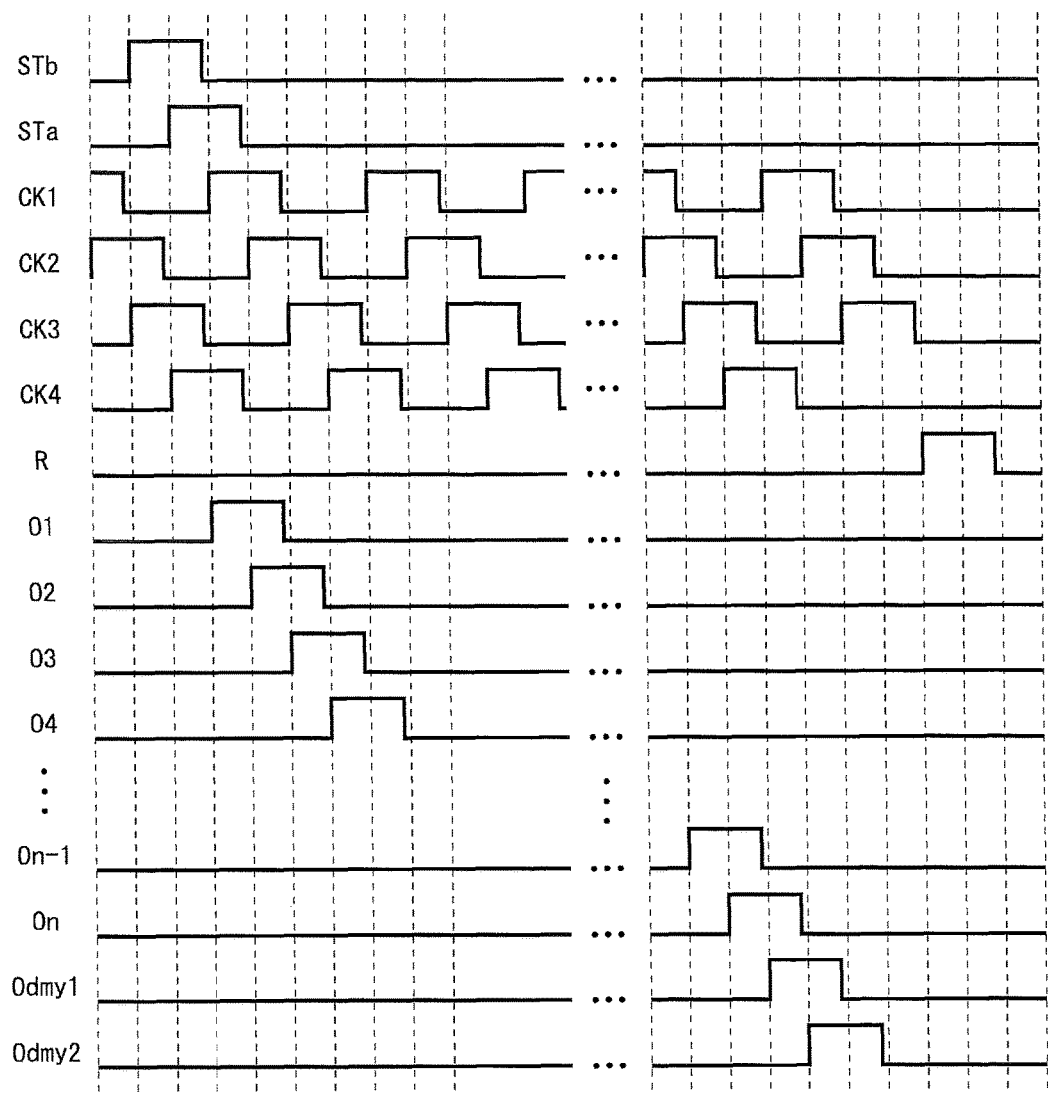
FIG. 54 is a timing chart of the shift register shown in FIG. 53.

FIG. 54 is a timing chart of the shift register 64. As shown in FIG. 54, the dummy output signal Odmy1 shifts to the high level in the high-level period of the clock signal CK1 after the output signal OUT of the unit circuit 61 in the n-th stage is shifted to the high level. The dummy output signal Odmy2 shifts to the high level in the high-level period of the clock signal CK2 after the dummy output signal Odmy1 is shifted to the high level. The reset signal R shifts to the high level after the high-level period of the dummy output signal Odmy2. When the reset signal R shifts to the high level, in the unit circuits 61 in the (n+1)th stage and the (n+2)th stage, the transistor Tr3 is turned on, and the potential of the node n1 shifts to the low level.

Also in the shift register 64, similarly to the shift register 60, it is possible to reduce charge and discharge of a parasitic capacitance accompanying the gate terminal of the transistor Tr3, so as to reduce power consumption. In place of the initialization signal INIT and the reset signal R, the shift register 64 may be supplied with a control signal which shifts to the high level at the time of initialization and at the time of resetting. In this case, one of the transistors Tr3, Tra may be deleted from the unit circuit 61.

Sixteenth Embodiment

Figure 55:
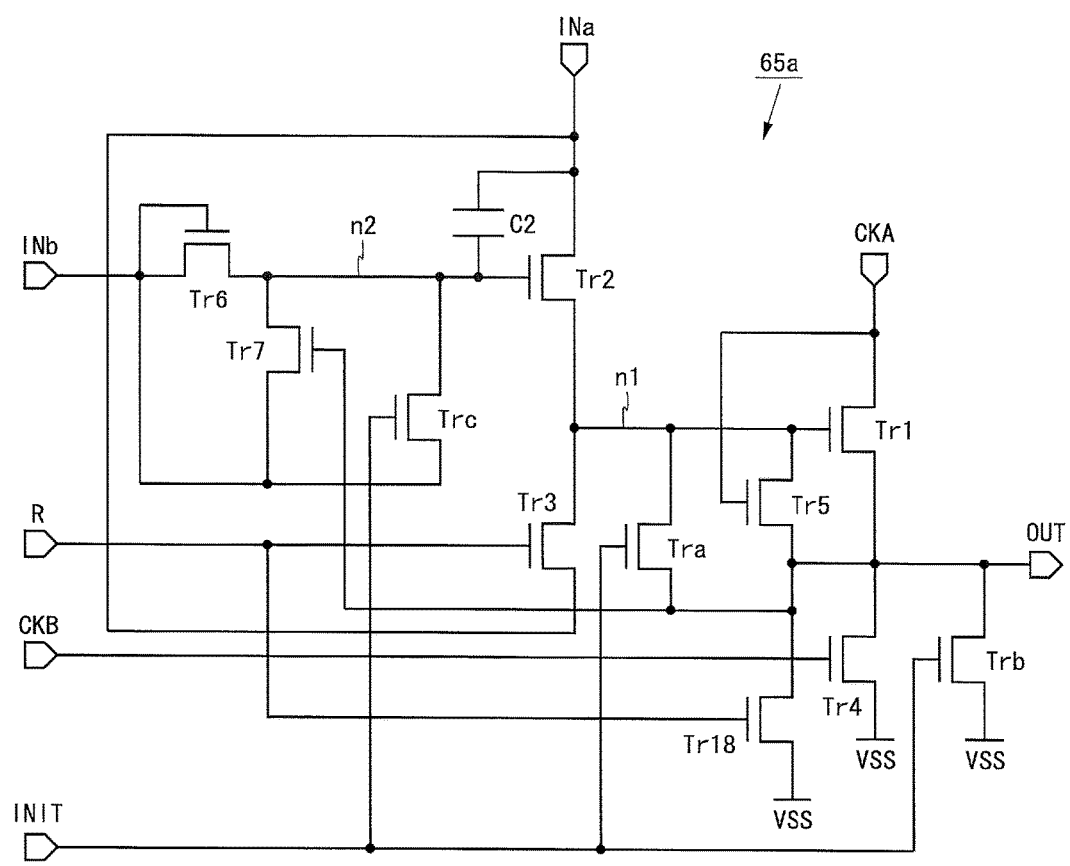
FIG. 55 is a circuit diagram of a unit circuit of a shift register according to a sixteenth embodiment.
Figure 56:
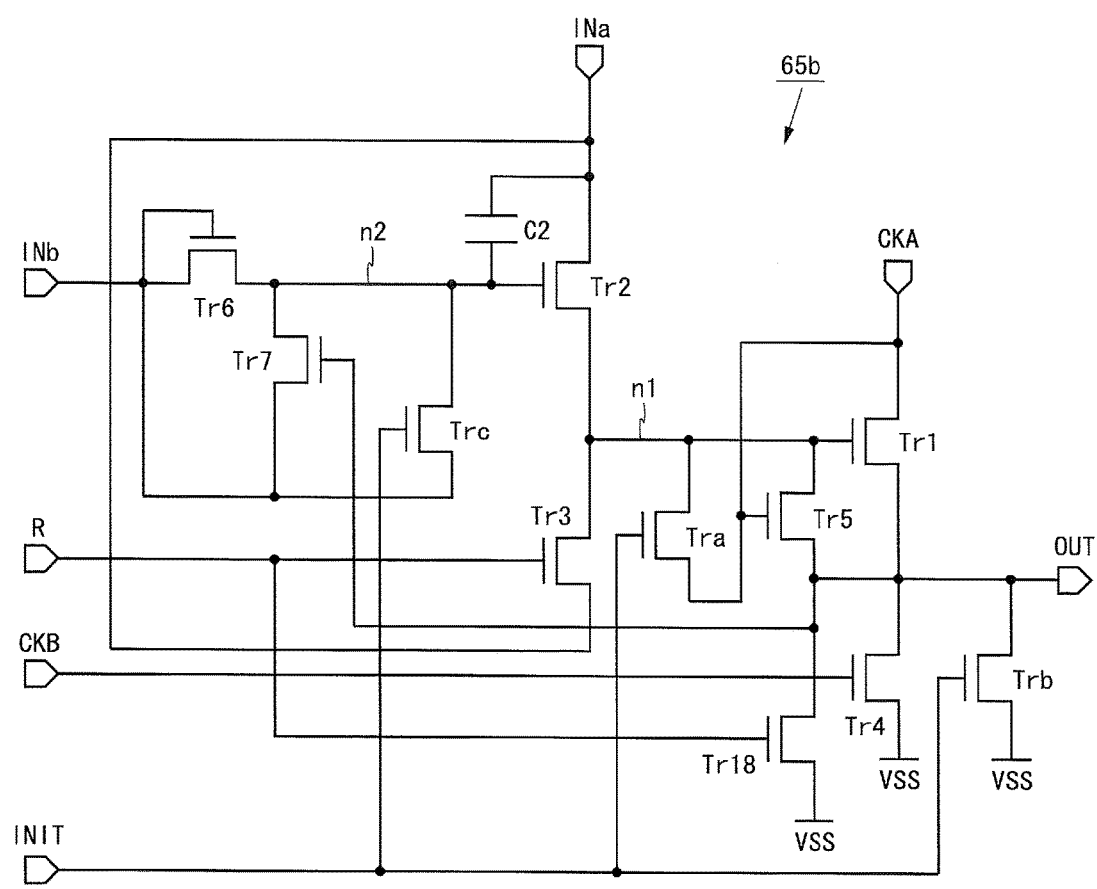
FIG. 56 is a circuit diagram of another unit circuit of the shift register according to the sixteenth embodiment.

A shift register according to a sixteenth embodiment of the present invention has the configuration shown in FIG. 49 or FIG. 53. The shift register according to the present embodiment includes a unit circuit 65*a* shown in FIG. 55 or a unit circuit 65*b* shown in FIG. 56 in place of the unit circuit 61. The unit circuit 65*a* is formed by adding a transistor Tr18 to the unit circuit 61*a* (FIG. 50). A drain terminal of the transistor Tr18 is connected to the output terminal OUT, a source terminal of the transistor Tr18 is applied with the low-level potential VSS, and a gate terminal of the transistor Tr18 is connected to the reset terminal R. The signal waveform diagram of the shift register according to the present embodiment is the same as the signal waveform diagram according to the fifteenth embodiment.

In the unit circuit 21*a* (FIG. 15), when the transistor Tr1 is turned off before the output signal OUT shifts to the low level, the output signal OUT does not shift to the low level, but has an intermediate potential. The unit circuit 61*a* includes the transistor Tr4 whose gate terminal is connected to the clock terminal CKB in order to shift the output signal OUT to the low level. However, when the transistor Tr4 is increased in size in order to reliably shift the output signal OUT to the low level, power consumption increases. To solve this problem, the unit circuits 65*a*, 65*b* each include the transistor Tr18 whose gate terminal is connected to the reset terminal R.

In the unit circuits 65*a*, 65*b*, when the reset signal R shifts to the high level, the transistor Tr18 is turned on, and hence the output signal OUT reliably shifts to the low level. This eliminates the need for increasing the size of the transistor Tr4 in the unit circuits 65*a*, 65*b*. Further, the frequency of changes in the output signal OUT is smaller than the frequency of changes in the clock signal CKB. For this reason, even when the size of the transistor Tr18 is increased, power consumption does not increase as much as when the size of the transistor Tr4 is increased. Thus, according to the shift register of the present embodiment, it is possible to reliably shift the output signal OUT to the low level without increasing power consumption.

Further, the transistor Tr4 is cyclically turned on based on the clock signal CKB. Therefore, even when the potential of the output signal OUT rises due to a leak current of the transistor Tr1, or the like, the potential of the output signal OUT can be cyclically shifted to the low level by using the transistor Tr4. It is to be noted that although the unit circuits 65*a*, 65*b* include the transistors Tr4, Tr18, they do not necessarily include the transistor Tr4 so long as the transistor Tr18 is included.

Figure 57:
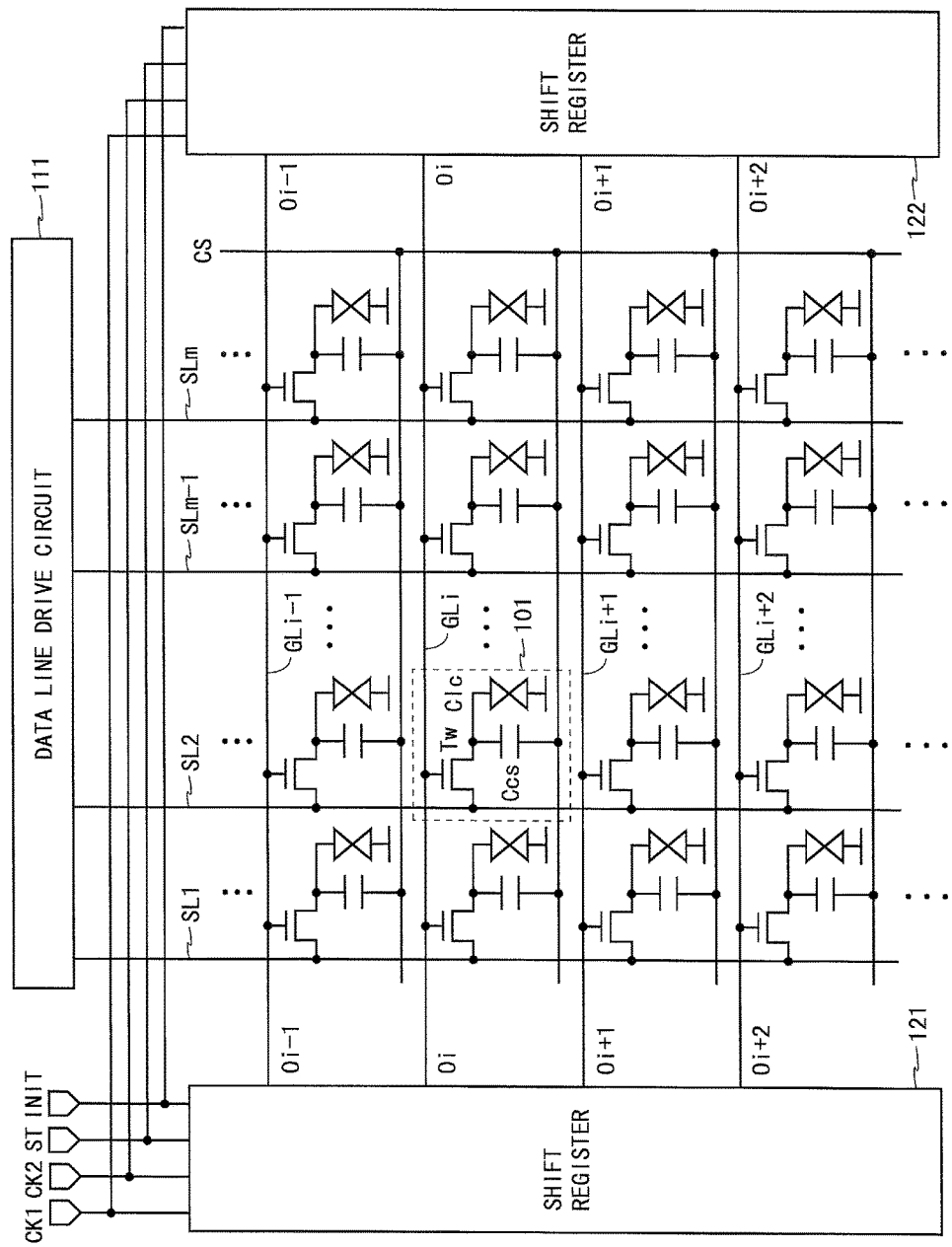
FIG. 57 is a block diagram showing a first configuration example of a liquid crystal display device provided with the shift register according to the embodiment of the present invention.

Hereinafter, a description will be given of examples of a display device provided with the shift register according to the embodiment of the present invention. FIG. 57 is a block diagram showing a first configuration example of a liquid crystal display device provided with the shift register according to the embodiment of the present invention. The liquid crystal display device shown in FIG. 57 is provided with n scanning lines GL1 to GLn, m (m is an integer not smaller than 2) data lines SL1 to SLm, (m×n) pixel circuits 101, a data line drive circuit 111, and shift registers 121, 122.

The scanning lines GL1 to GLn are arranged in parallel to each other, and the data lines SL1 to SLm are arranged in parallel to each other so as to be orthogonal to the scanning lines GL1 to GLn. The (m×n) pixel circuits 101 are arranged corresponding to intersections of the scanning lines GL1 to GLn and the data lines SL1 to SLm. The pixel circuit 101 includes a transistor Tw, a liquid crystal capacitor Clc and an auxiliary capacitor Ccs. A gate terminal of the transistor Tw is connected to one scanning line, and a source terminal of the transistor Tw is connected to one data line. Hereinafter, an arrangement region of the pixel circuit 101 is referred to as a region A.

The data line drive circuit 111 is arranged along one side (upper side in FIG. 57) of the region A. The data line drive circuit 111 is connected to one end (upper end in FIG. 57) of the data lines SL1 to SLm, to drive the data lines SL1 to SLm.

The shift registers 121, 122 each have n output terminals O1 to On, and function as a scanning line drive circuit. For the shift registers 121, 122, for example, the shift registers according to the first to fourth and sixth to ninth embodiments are used. In the shift registers 121, 122, the same circuit is used and the same signals are supplied. The shift register 121 is arranged along one side (left side in FIG. 57) of the region A, and the shift register 122 is arranged along the opposed side (right side in FIG. 57) of the region A. The output terminals O1 to On of the shift register 121 are respectively connected to one ends (left ends in FIG. 57) of the scanning lines GL1 to GLn. The shift register 121 drives the scanning lines GL1 to GLn from the one end side. The output terminals O1 to On of the shift register 122 are respectively connected to the other ends (right ends in FIG. 57) of the scanning lines GL1 to GLn. The shift register 122 drives the scanning lines GL1 to GLn from the other end side. As thus described, in the liquid crystal display device shown in FIG. 57, the scanning lines GL1 to GLn are driven from both sides by using the two shift registers 121, 122.

Figure 58:
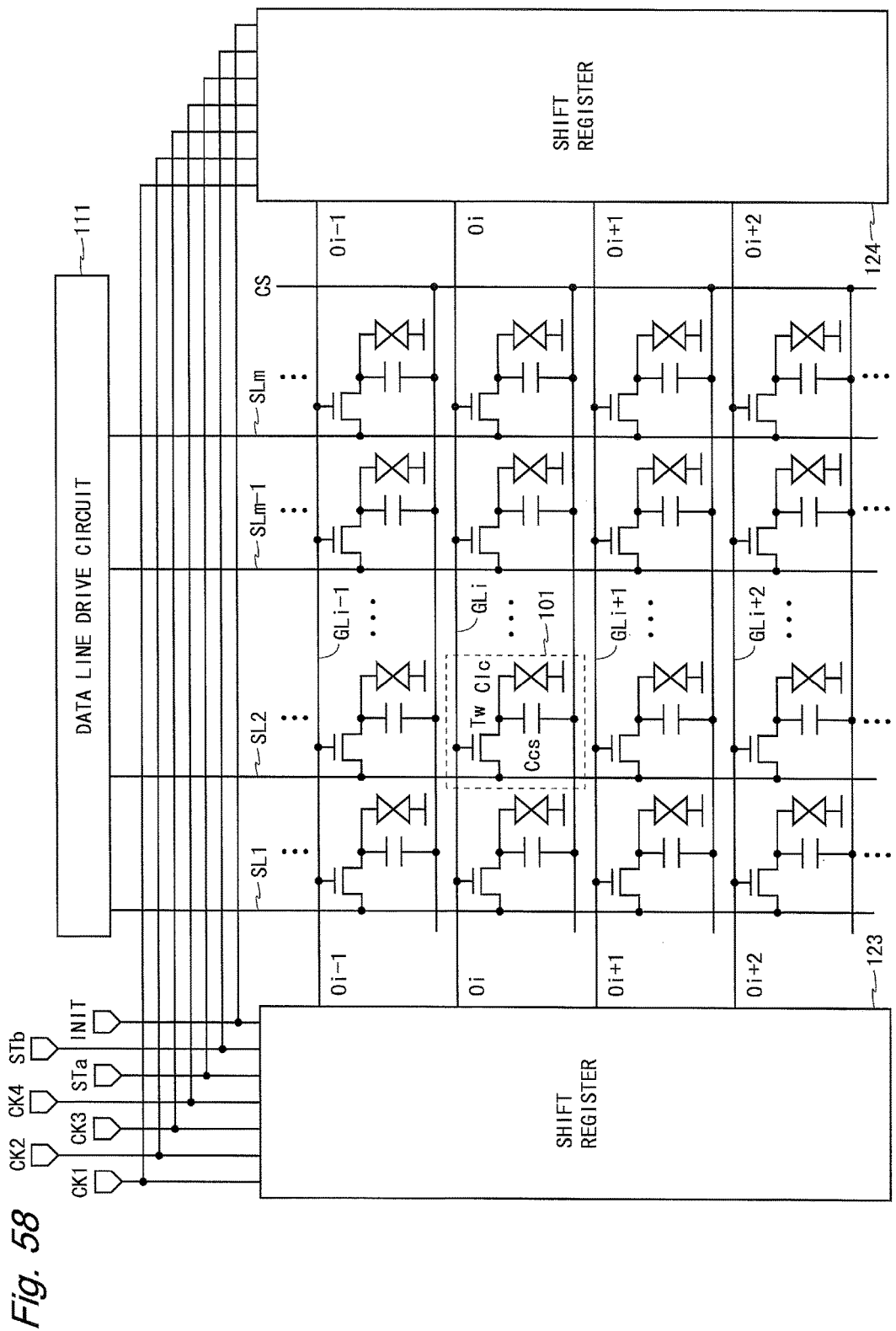
FIG. 58 is a block diagram showing a second configuration example of the liquid crystal display device provided with the shift register according to the embodiment of the present invention.

FIG. 58 is a block diagram showing a second configuration example of the liquid crystal display device provided with the shift register according to the embodiment of the present invention. The liquid crystal display device shown in FIG. 58 is obtained by replacing the shift registers 121, 122 with shift registers 123, 124, in the liquid crystal display device shown in FIG. 57. The shift registers 123, 124 each have n output terminals O1 to On, and function as a scanning line drive circuit. For the shift registers 123, 124, for example, the shift registers according to the fifth and tenth to sixteenth embodiments are used.

It is to be noted that in the liquid crystal display device shown in FIGS. 57 and 58, the scanning lines GL1 to GLn are driven from both sides by using the two shift registers arranged along the two opposed sides of the region A. Alternatively, in the liquid crystal display device provided with the shift register according to the embodiment of the present invention, the scanning lines GL1 to GLn may be driven from one side by using one shift register arranged along one side of the region A.

Figure 59:
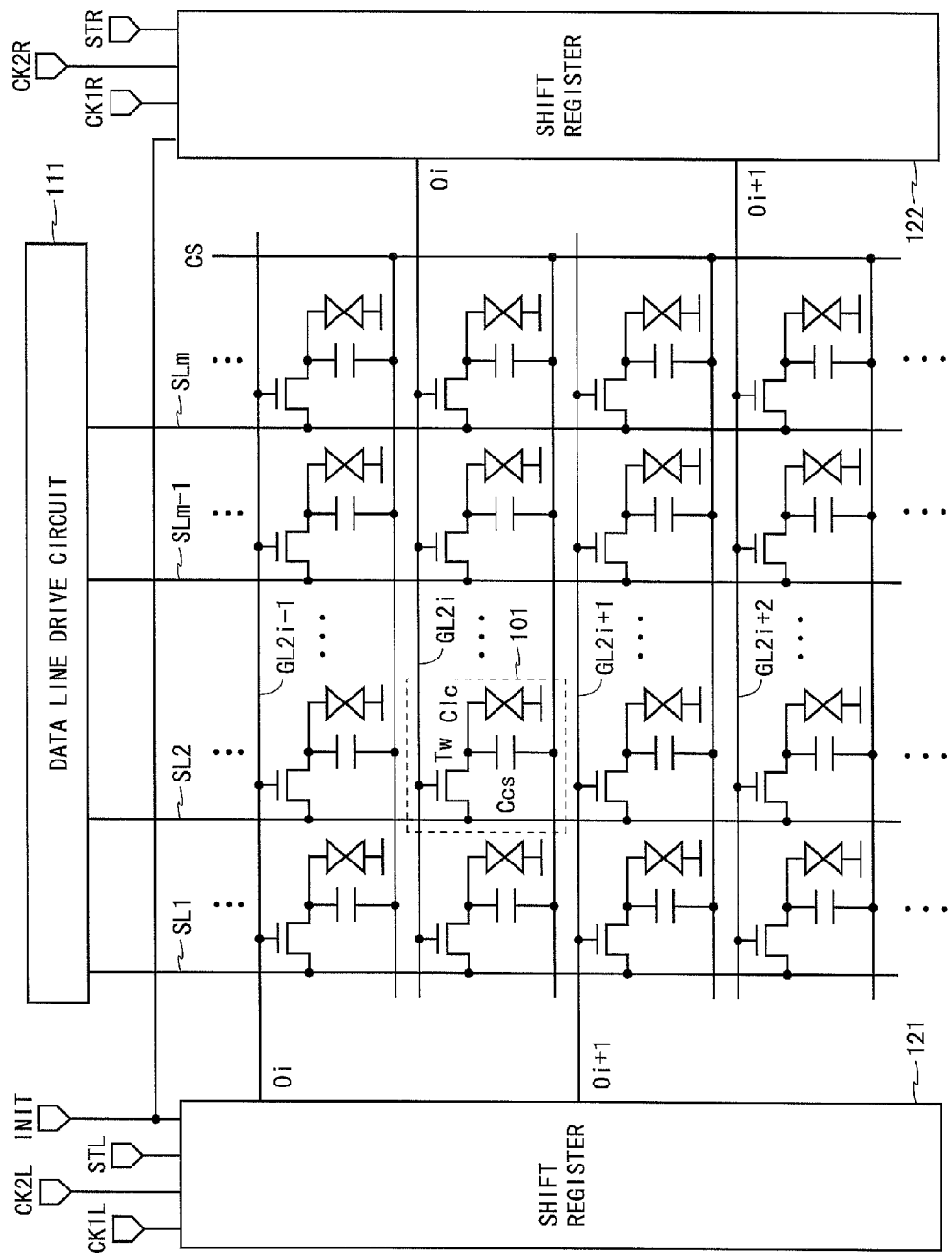
FIG. 59 is a block diagram showing a third configuration example of a liquid crystal display device provided with the shift register according to the embodiment of the present invention.

FIG. 59 is a block diagram showing a third configuration example of the liquid crystal display device provided with the shift register according to the embodiment of the present invention. The liquid crystal display device shown in FIG. 59 is provided with 2n scanning lines GL1 to GL2n, m data lines SL1 to SLm, (m×2n) pixel circuits 101, the data line drive circuit 111, and the shift registers 121, 122. The scanning lines GL1 to GL2n, the data lines SL1 to SLm, the (m>2n) pixel circuits 101, and the data line drive circuit 111 are arranged similarly to the liquid crystal display device shown in FIG. 57.

In the shift registers 121, 122, the same circuit is used and different signals are provided except for the initialization signal INIT. For the shift registers 121, 122, for example, the shift registers according to the first to fourth and sixth to ninth embodiments are used. The output terminals O1 to On of the shift register 121 are respectively connected to one ends (left ends in FIG. 59) of the odd-numbered scanning lines GL1, GL3, . . . , GL2n−1. The shift register 121 drives the odd-numbered scanning lines GL1, GL3, . . . , GL2n−1 from the one end side. The output terminals O1 to On of the shift register 122 are respectively connected to the other ends (right ends in FIG. 59) of the even-numbered scanning lines GL2, GL4, . . . , GL2n. The shift register 122 drives the even-numbered scanning lines GL2, GL4, . . . , GL2n from the other end side. As thus described, in the liquid crystal display device shown in FIG. 59, the odd-numbered scanning lines GL1, GL3, . . . , GL2n−1 are driven from the one end side by using the shift register 121, and the even-numbered scanning lines GL2, GL4, . . . , GL2n are driven from the other end side by using the shift register 122.

Figure 60:
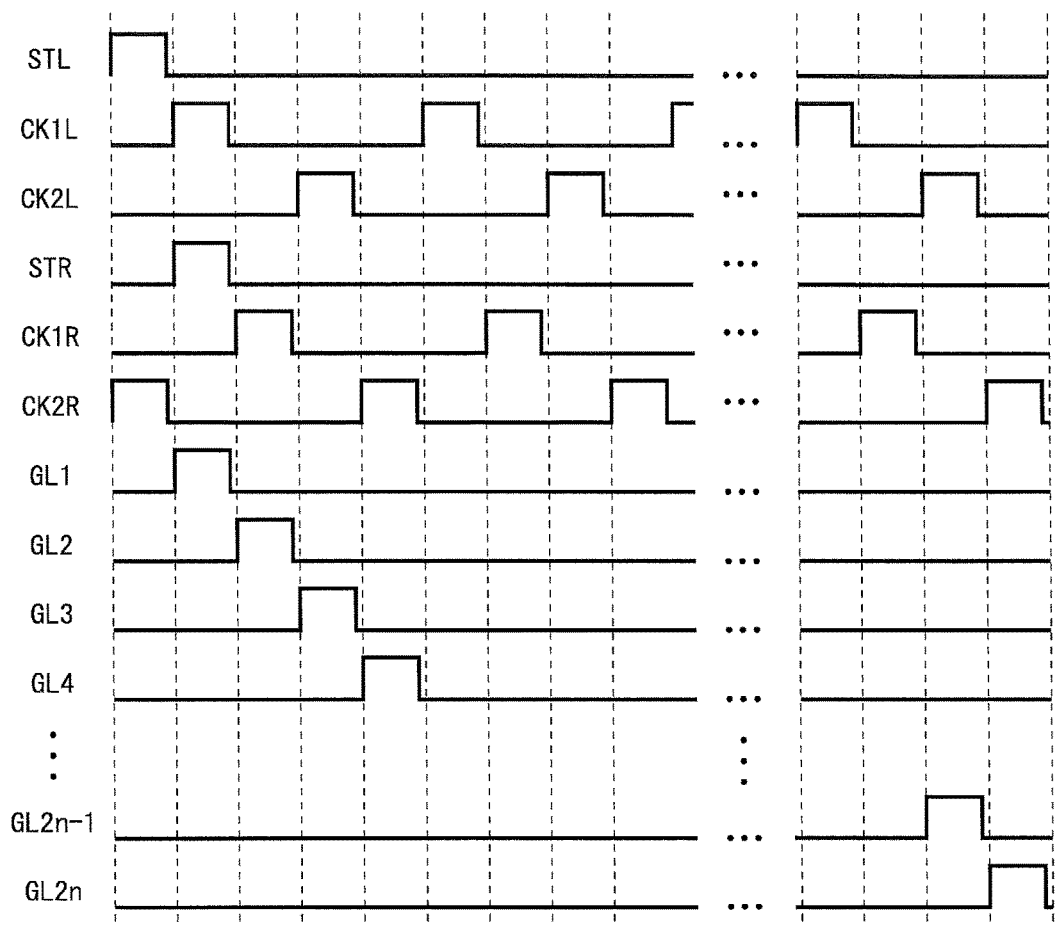
FIG. 60 is a timing chart of the liquid crystal display device shown in FIG. 59.

FIG. 60 is a timing chart of the liquid crystal display device shown in FIG. 59. A clock signal CK1L that is supplied to the shift register 121 shifts to the high level or the low level in a predetermined cycle. However, the high-level period of the clock signal CK1L is shorter than a quarter cycle of the clock signal CK1L. A clock signal CK2L is a signal obtained by delaying the clock signal CK1L by a half cycle. Clock signals CK1R, CK2R that are supplied to the shift register 122 are signals obtained by delaying the clock signal CK1L by a quarter cycle and a three-quarter cycle, respectively. At the start of shifting, a start pulse STL that is supplied to the shift register 121 shifts to the high level in the high-level period of the clock signal CK2R. A start pulse STR that is supplied to the shift register 122 is a signal obtained by delaying the start pulse STL by a quarter cycle of the clock signal CK1L. The high-level period of the output signal O1 of the shift register 121 is delayed from the high-level period of the start pulse STL by a quarter cycle of the clock signal. The high-level periods of the output signals O2 to On of the shift register 121 are delayed from the high-level periods of the output signals O1 to On−1 of the shift register 121 by a half cycle of the clock signal, respectively. The high-level period of the output signal O1 of the shift register 122 is delayed from the high-level period of the output signal O1 of the shift register 121 by a quarter cycle of the clock signal. The high-level periods of the output signals O2 to On of the shift register 122 are delayed from the high-level periods of the output signals O1 to On−1 of the shift register 122 by a half cycle of the clock signal, respectively. Therefore, as shown in FIG. 60, potentials of the scanning lines GL1 to GL2n shift to the high level in ascending order while each being delayed by a quarter cycle of the clock signal.

Figure 61:
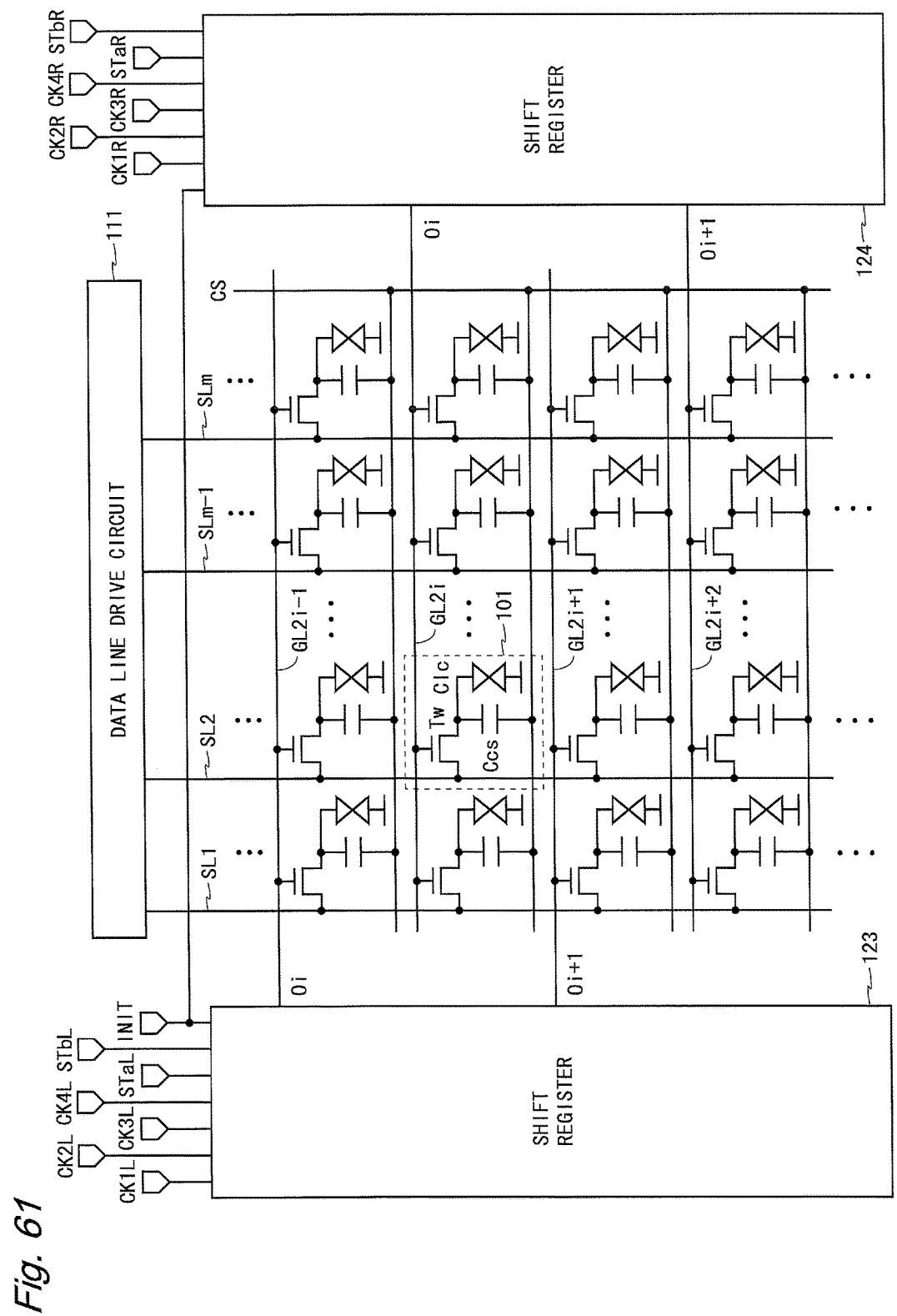
FIG. 61 is a block diagram showing a fourth configuration example of the liquid crystal display device provided with the shift register according to the embodiment of the present invention.

FIG. 61 is a block diagram showing a fourth configuration example of the liquid crystal display device provided with the shift register according to the embodiment of the present invention. The liquid crystal display device shown in FIG. 61 is obtained by replacing the shift registers 121, 122 with the shift registers 123, 124, in the liquid crystal display device shown in FIG. 59. In the shift registers 123, 124, the same circuit is used and different signals are provided except for the initialization signal INIT. For the shift registers 123, 124, for example, the shift registers according to the fifth and tenth to sixteenth embodiments are used.

Figure 62:
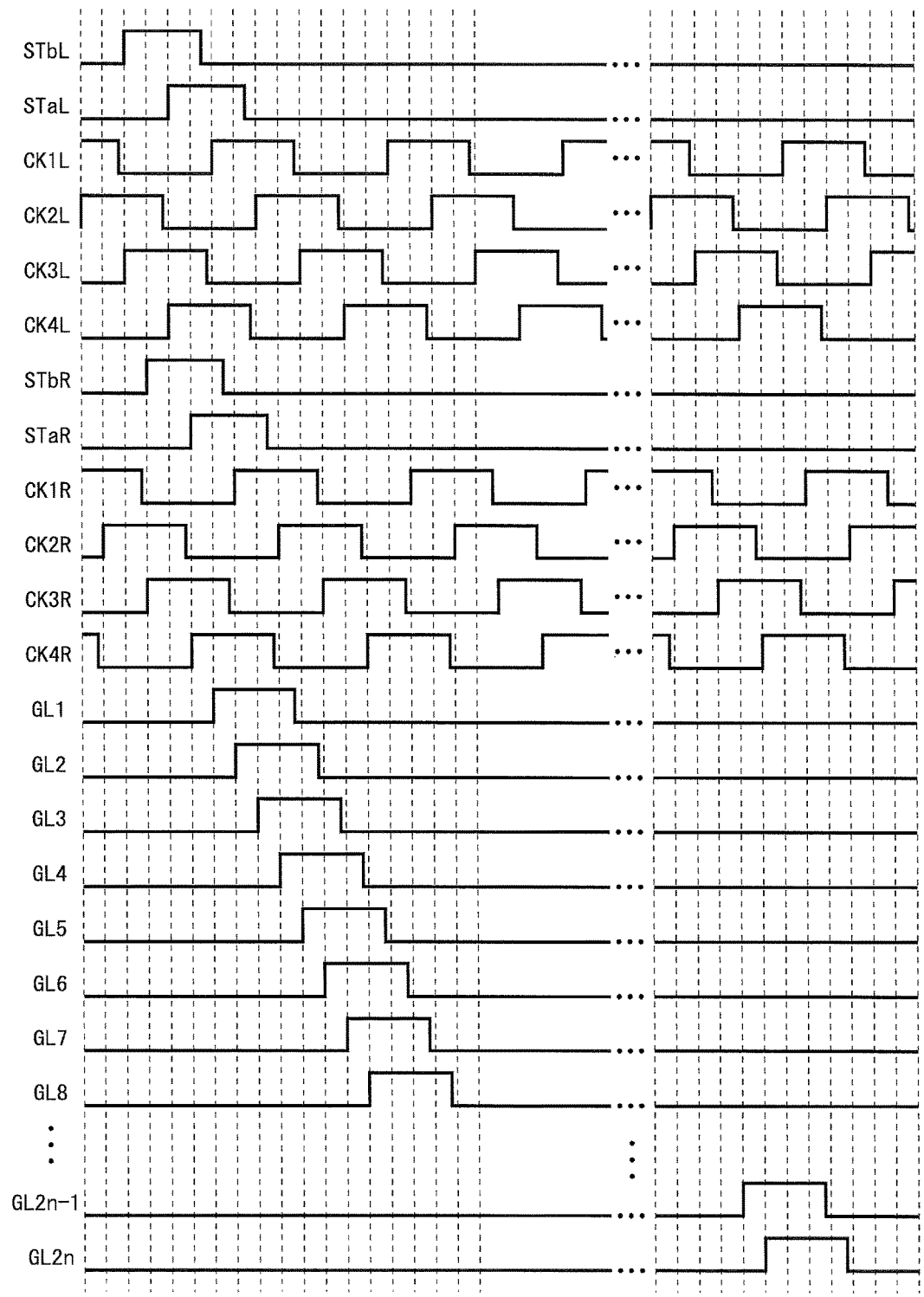
FIG. 62 is a timing chart of the liquid crystal display device shown in FIG. 61.
Figure 63:
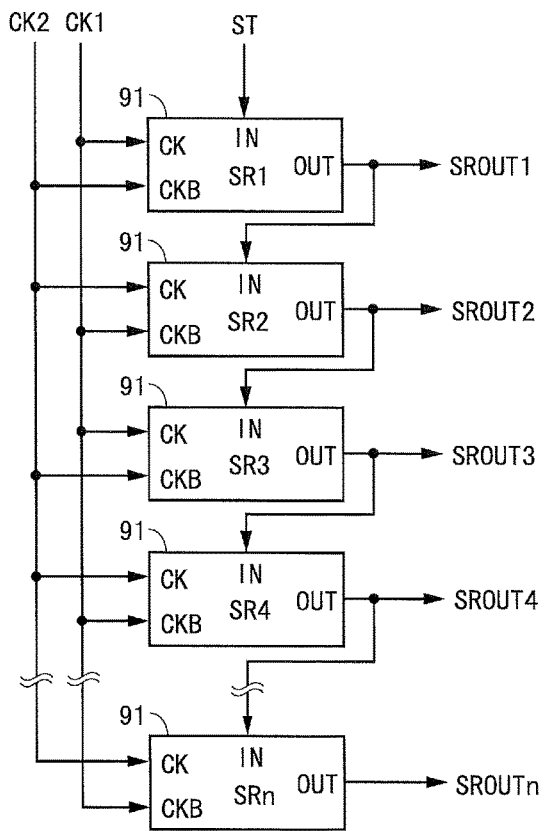
FIG. 63 is a block diagram showing a configuration of a conventional shift register.
Figure 64:
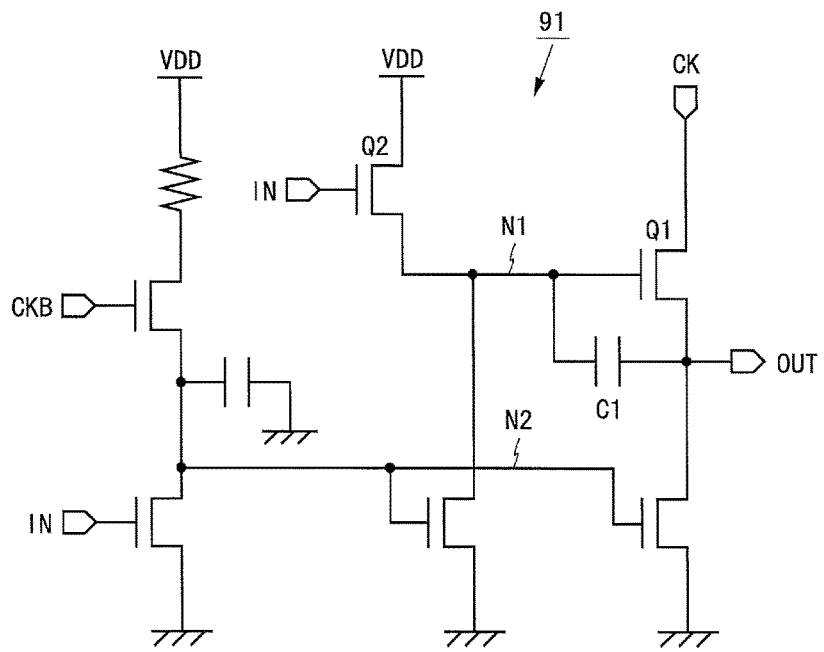
FIG. 64 is a circuit diagram of a unit circuit of the conventional shift register.
Figure 65:
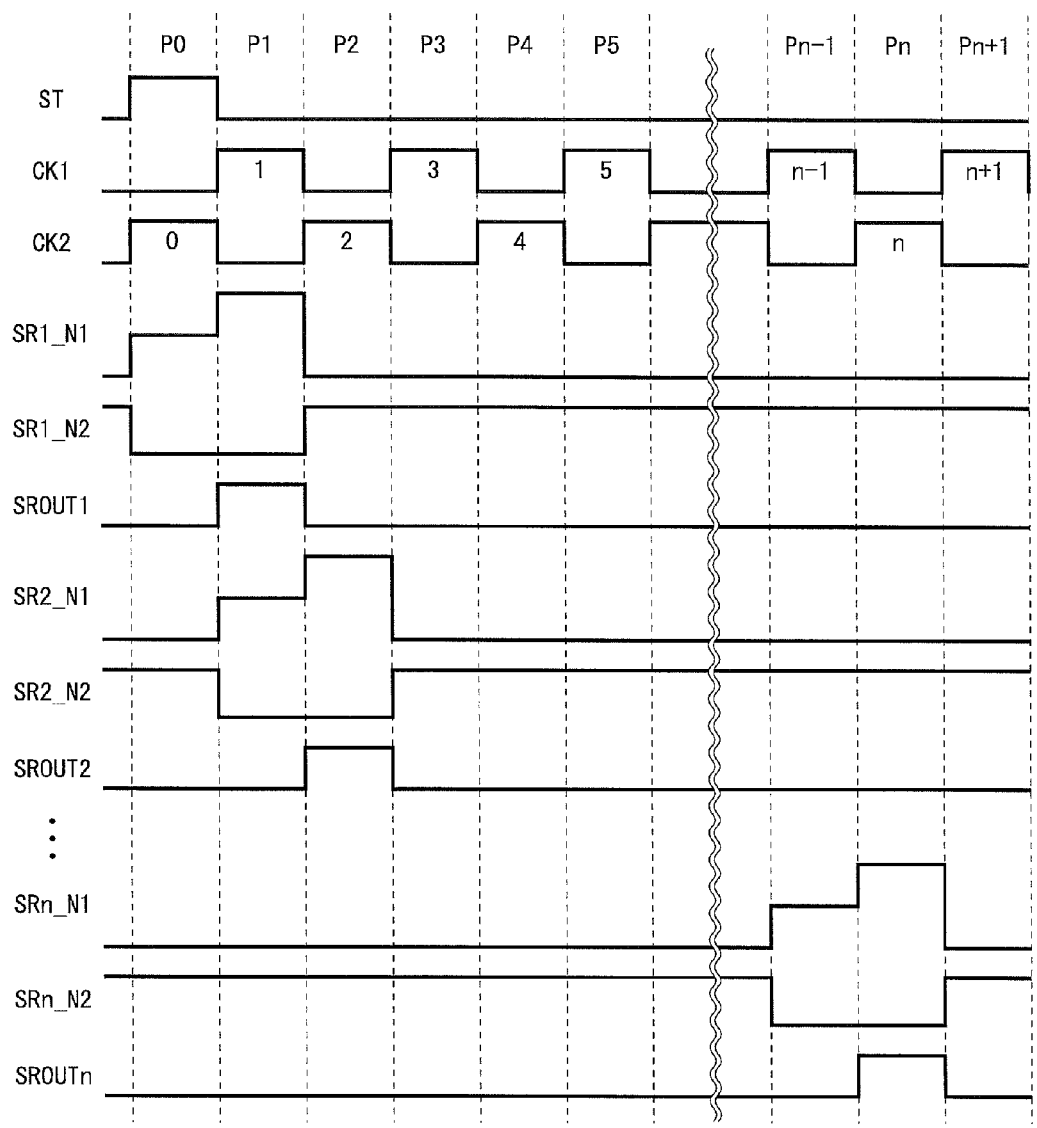
FIG. 65 is a timing chart of the conventional shift register.
Figure 66:
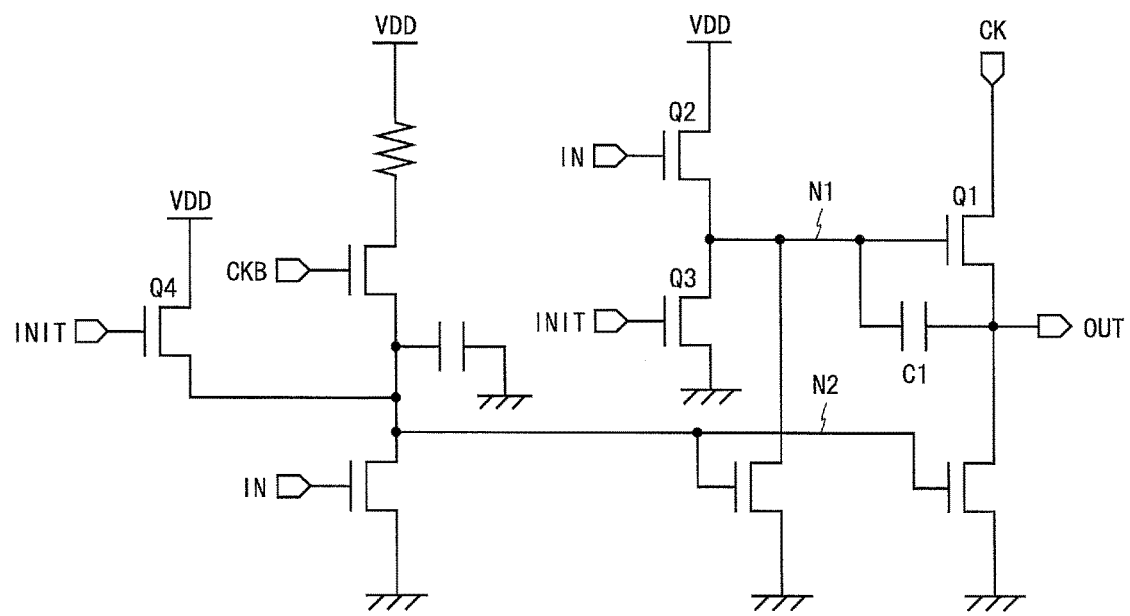
FIG. 66 is a circuit diagram of a unit circuit having an initialization function.

FIG. 62 is a timing chart of the liquid crystal display device shown in FIG. 61. Start pulses STaL, STbL and clock signals CK1L to CK4L that are supplied to the shift register 123 respectively change at the same timing as the start pulses STa, STb and the clock signals CK1 to CK4 shown in FIG. 17. Start pulses STaR, STbR and clock signals CK1R to CK4R that are supplied to the shift register 124 change while being delayed from the signals that are supplied to the shift register 123 by a one-eighth cycle of the clock signal. The high-level period of the output signal O1 of the shift register 123 is delayed from the high-level period of the start pulse STaL by a quarter cycle of the clock signal. The high-level periods of the output signals O2 to On of the shift register 123 are delayed from the high-level periods of the output signals O1 to On−1 of the shift register 123 by a quarter cycle of the clock signal, respectively. The high-level period of the output signal O1 of the shift register 124 is delayed from the high-level period of the output signal O1 of the shift register 123 by a one-eighth cycle of the clock signal. The high-level periods of the output signals O2 to On of the shift register 124 are delayed from the high-level periods of the output signals O1 to On−1 of the shift register 124 by a quarter cycle of the clock signal, respectively. Therefore, as shown in FIG. 62, potentials of the scanning lines GL1 to GL2n shift to the high level in ascending order while each being delayed by a one-eighth cycle of the clock signal.

According to the liquid crystal display device shown above, by using the shift register according to each of the first to sixteenth embodiment as the scanning line drive circuit, it is possible to initialize the scanning line drive circuit without applying a high voltage between the conduction terminals of the initialization transistor at the time of operation. Further, in the liquid crystal display devices shown in FIGS. 57 and 58, one unit circuit of the shift register is required to be arranged in a region corresponding to a width of one scanning line. In contrast, in the liquid crystal display devices shown in FIGS. 59 and 61, one unit circuit of the shift register may be arranged in a region corresponding to a width of two scanning lines. Thus, according to the liquid crystal display devices shown in FIGS. 59 and 61, it is possible to reduce a width of a layout region of the shift register provided in an outer peripheral portion of the arrangement region of the pixel circuit. Further, according to the liquid crystal display devices shown in FIGS. 57 and 58, by driving the scanning lines GL1 to GLn from both sides, it is possible to further reduce rounding of the output signal as compared to the case of driving the scanning lines GL1 to GLn from one side.

As shown above, according to the shift register of the present invention, the second conduction terminal of the initialization transistor is connected to the node which has the off-potential at the time of initialization and has the on-potential at the same level as an on-potential of the clock signal when the clock signal having the on-potential is outputted, and it is thereby possible to perform initialization without applying a high voltage between the conduction terminals of the initialization transistor at the time of operation.

As for the shift registers described above, characteristics of the plurality of unit circuits can be arbitrarily combined so long as they do not conflict with properties thereof, to configure a shift register according to a variety of modified examples. For example, the breakdown voltage transistor may be deleted from the unit circuit including the breakdown voltage transistor, and the obtained unit circuits may be connected in multiple stages, to configure a shift register. Alternatively, the breakdown voltage transistor may be added to the unit circuit not including the breakdown voltage transistor, and the obtained unit circuits may be connected in multiple stages, to configure a shift register. Further, as for the unit circuit including the breakdown voltage transistor, the conduction terminal of the initialization transistor may be connected to the control terminal of the output transistor, or may be connected to the first conduction terminal of the breakdown voltage transistor.

INDUSTRIAL APPLICABILITY

The shift register of the present invention has a characteristic of being capable of preventing degradation and breakdown of an initialization transistor, and can thereby be used for a variety of circuits such as a drive circuit of a display device.

DESCRIPTION OF REFERENCE CHARACTERS

10, 20, 30, 40, 50, 60, 64, 121 to 124: shift register
1, 11 to 17, 21 to 23, 31, 41, 42, 51, 61, 65: unit circuit
2: output control unit
32: scan switching circuit
52, 62, 63: dummy unit circuit Tr1 to Tr7, Tr11 to Tr18, Tr21 to Tr26, Tr31 to Tr38, Tra to Trc, Trp1, Trp4, Trp11 to Trp16, Trpa, Trpb, Trpd: transistor

The invention claimed is:

1. A shift register comprising a plurality of unit circuits connected in multiple stages, wherein
the unit circuit includes:
an output transistor having a first conduction terminal connected to a clock terminal for inputting a clock signal, and a second conduction terminal connected to an output terminal for outputting the clock signal;
an output control unit that applies an on-potential and an off-potential in a switching manner to a control terminal of the output transistor; and
an initialization transistor having a first conduction terminal connected to the control terminal of the output transistor, and a control terminal provided with an initialization signal, and
a second conduction terminal of the initialization transistor is connected to a node which has the off-potential at the time of initialization and has the on-potential at the same level as the clock signal when the clock signal having the on-potential is outputted from the output terminal.

2. The shift register according to claim 1, wherein the second conduction terminal of the initialization transistor is connected to the output terminal.

3. The shift register according to claim 2, wherein the unit circuit further includes
an output initialization transistor having a first conduction terminal connected to the output terminal, a second conduction terminal fixedly applied with the off-potential, and a control terminal provided with the initialization signal.

4. The shift register according to claim 1, wherein the second conduction terminal of the initialization transistor is connected to the clock terminal.

5. The shift register according to claim 1, wherein
the output control unit includes
a set transistor having a first conduction terminal provided with an input signal with respect to the unit circuit, and a second conduction terminal connected to the control terminal of the output transistor,
a set control unit that applies the on-potential and the off-potential in a switching manner to a control terminal of the set transistor, and
a second initialization transistor having a first conduction terminal connected to the control terminal of the set transistor, and a control terminal provided with the initialization signal, and
a second conduction terminal of the second initialization transistor is connected to a node which has the off-potential at the time of initialization and has the on-potential at the same level as the control terminal of the output transistor in at least part of a period during which the on-potential is applied to the control terminal of the output transistor.

6. The shift register according to claim 5, wherein the second conduction terminal of the second initialization transistor is connected to a second input terminal for inputting a second input signal with respect to the unit circuit.

7. A display device comprising:
a plurality of scanning lines arranged in parallel to each other;
a plurality of data lines arranged in parallel to each other so as to be orthogonal to the scanning lines;

a plurality of pixel circuits each arranged corresponding to an intersection of the scanning line and the data line; and the shift register according to claim 1 as a scanning line drive circuit for driving the scanning lines.

8. A shift register comprising a plurality of unit circuits connected in multiple stages, wherein the unit circuit includes:

an output transistor having a first conduction terminal connected to a clock terminal for inputting a clock signal, and a second conduction terminal connected to an output terminal for outputting the clock signal;

a breakdown voltage transistor having a first conduction terminal connected to a first node, a second conduction terminal connected to a control terminal of the output transistor, and a control terminal fixedly applied with an on-potential;

an output control unit that applies the on-potential and an off-potential in a switching manner to the first node; and an initialization transistor having a first conduction terminal connected to the first node or the control terminal of the output transistor, and a control terminal provided with an initialization signal, and a second conduction terminal of the initialization transistor is connected to a node which has the off-potential at the time of initialization and has the on-potential at the same level as the clock signal when the clock signal having the on-potential is outputted from the output terminal.

9. The shift register according to claim 8, wherein the output control unit includes a set transistor having a first conduction terminal provided with an input signal with respect to the unit circuit, and a second conduction terminal connected to the first node, a set control unit that applies the on-potential and the off-potential in a switching manner to a control terminal of the set transistor, and a second initialization transistor having a first conduction terminal connected to the control terminal of the set transistor, and a control terminal provided with the initialization signal, and a second conduction terminal of the second initialization transistor is connected to a node which has the off-potential at the time of initialization and has the on-potential at the same level as the first node in at least part of a period during which the on-potential is applied to the first node.

10. The shift register according to claim 8, wherein the second conduction terminal of the initialization transistor is connected to the output terminal.

11. The shift register according to claim 10, wherein the unit circuit further includes an output initialization transistor having a first conduction terminal connected to the output terminal, a second conduction terminal fixedly applied with the off-potential, and a control terminal provided with the initialization signal.

12. The shift register according to claim 8, wherein the second conduction terminal of the initialization transistor is connected to the clock terminal.

13. The shift register according to claim 9, wherein the second conduction terminal of the second initialization transistor is connected to a second input terminal for inputting a second input signal with respect to the unit circuit.

14. A display device comprising:

a plurality of scanning lines arranged in parallel to each other;

a plurality of data lines arranged in parallel to each other so as to be orthogonal to the scanning lines;

a plurality of pixel circuits each arranged corresponding to an intersection of the scanning line and the data line; and the shift register according to claim 8 as a scanning line drive circuit for driving the scanning lines.

* * * * *